United States Patent
Tanaka

(10) Patent No.: US 6,885,583 B2
(45) Date of Patent: Apr. 26, 2005

(54) NONVOLATILE SEMICONDUCTOR MEMORY

(75) Inventor: Tomoharu Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/796,157

(22) Filed: Mar. 10, 2004

(65) Prior Publication Data

US 2004/0174741 A1 Sep. 9, 2004

Related U.S. Application Data

(63) Continuation of application No. 10/373,920, filed on Feb. 27, 2003.

(30) Foreign Application Priority Data

Sep. 26, 2002 (JP) ........................................ 2002-281205

(51) Int. Cl.$^7$ ............................................... G11C 14/00
(52) U.S. Cl. ............................ 365/185.08; 365/185.17; 365/185.18
(58) Field of Search ....................... 365/185.08, 185.17, 365/185.18

(56) References Cited

U.S. PATENT DOCUMENTS 5,521,858 A * 5/1996 Shibata et al. ......... 365/185.08
6,370,058 B1 4/2002 Fukumoto
6,625,060 B1 9/2003 Miyauchi

FOREIGN PATENT DOCUMENTS

EP         1 134 746 A2     9/2001

OTHER PUBLICATIONS

G.J. Hemink, et al. "Fast and Accurate Programming Method For Multi–Level NAND EEPROMs" 1995 Symposium on VLSI Technology Digest of Technical Papers 1999, pp. 129–130.

* cited by examiner

*Primary Examiner*—Huan Hoang
(74) *Attorney, Agent, or Firm*—Oblon, Spivak, McClelland, Maier & Neustadt, P.C.

(57) ABSTRACT

A bit line is connected to a data circuit for use in a program/read time. The data circuit includes first, second, and third data storage units. The first data storage unit is connected to the bit line. A first data transfer circuit is connected between the first and third data storage units. A second data transfer circuit is connected between the second and third data storage units. The second data storage unit has a function of forcibly changing a value of data of the first data storage unit based on the data stored in the second data storage unit.

9 Claims, 36 Drawing Sheets

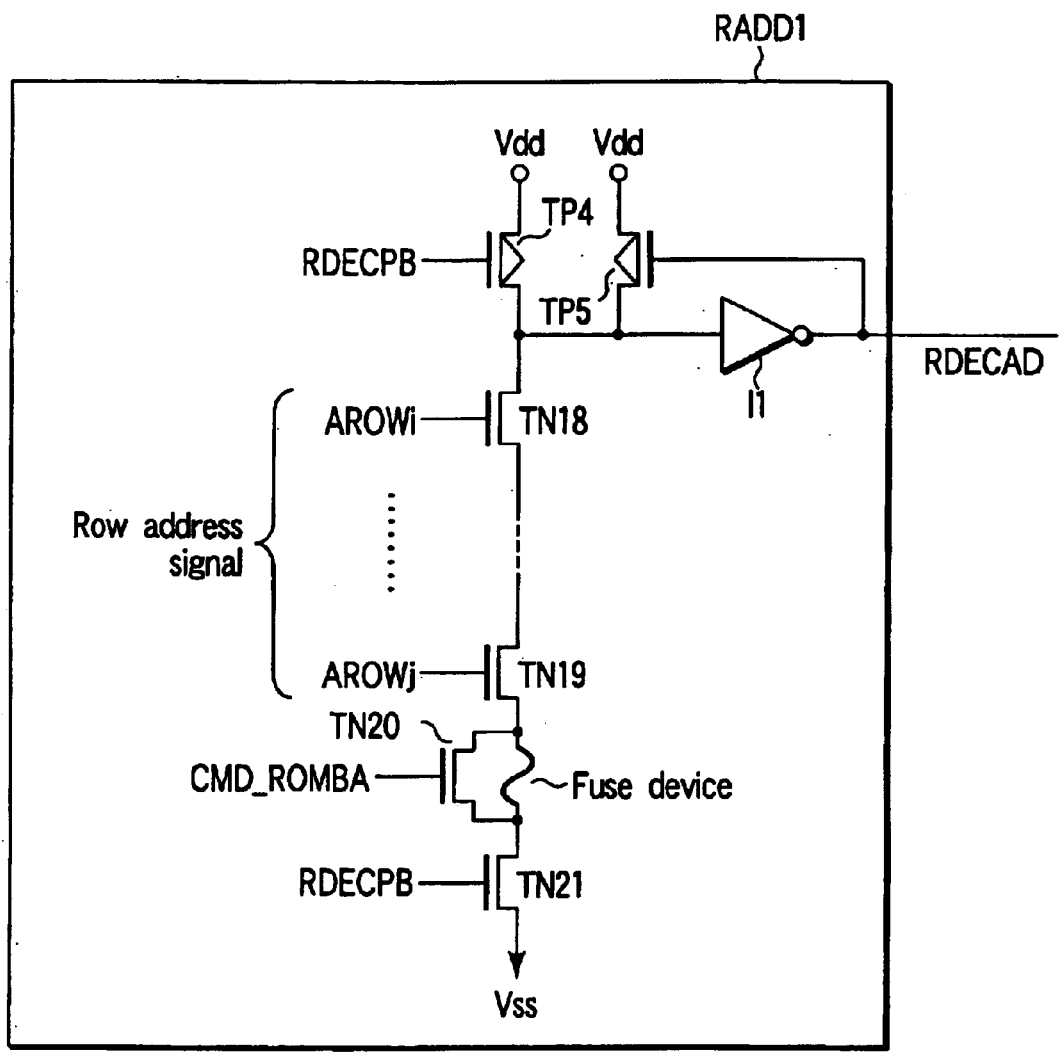
F I G. 13

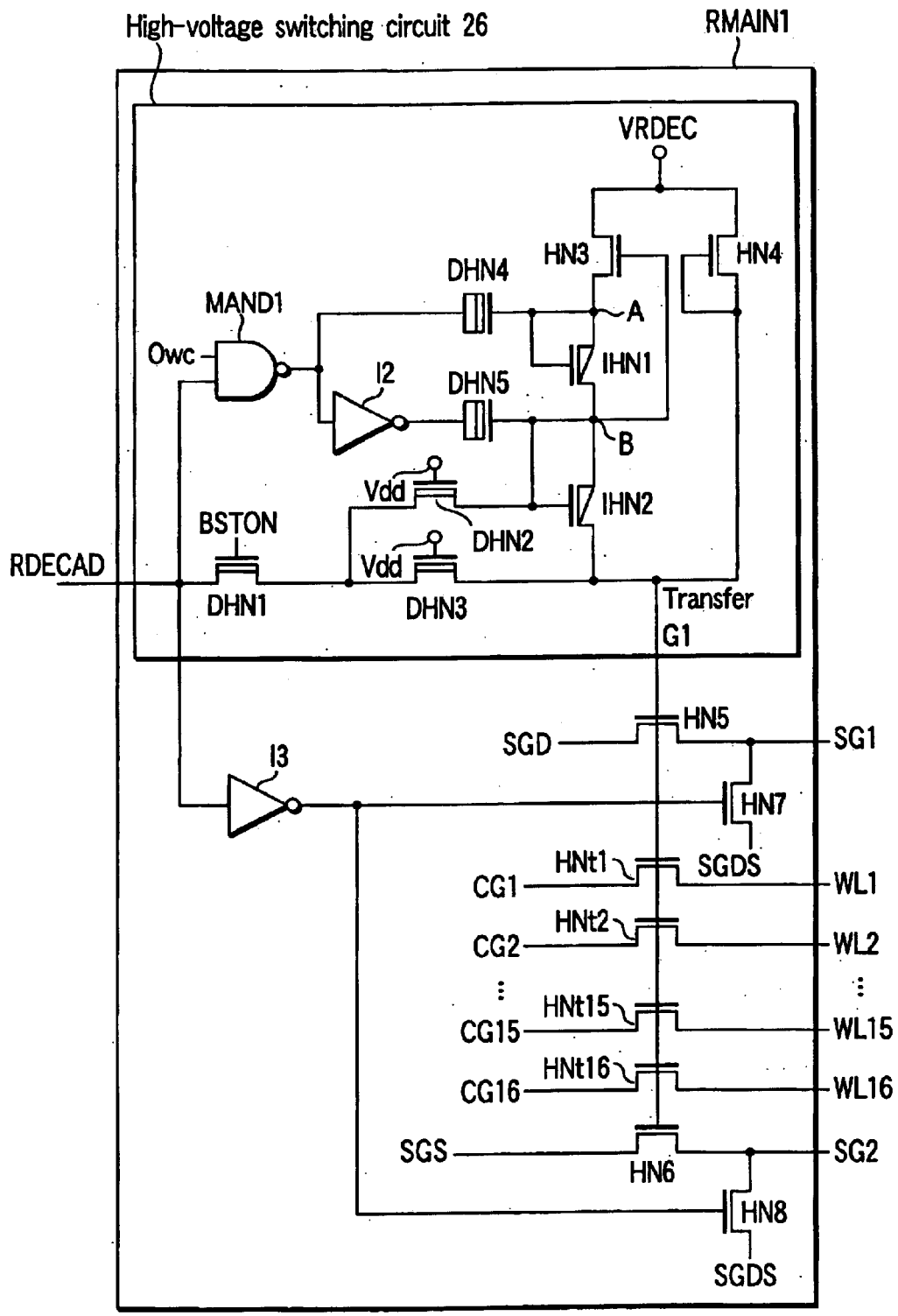
F I G. 14

Program of logic low-order page

No change in signals other than shown signals

No change in signals other than shown signals

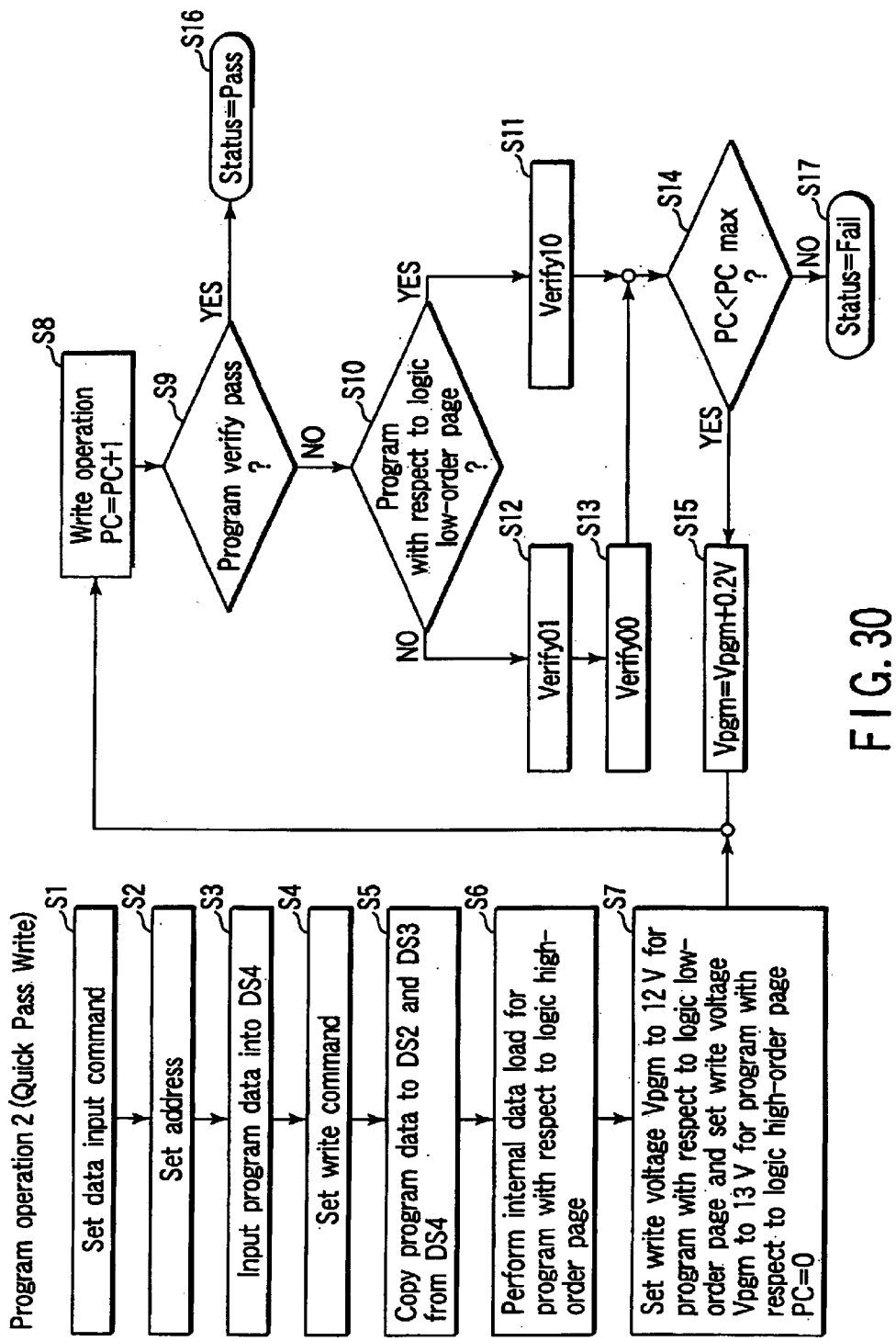
F I G. 30

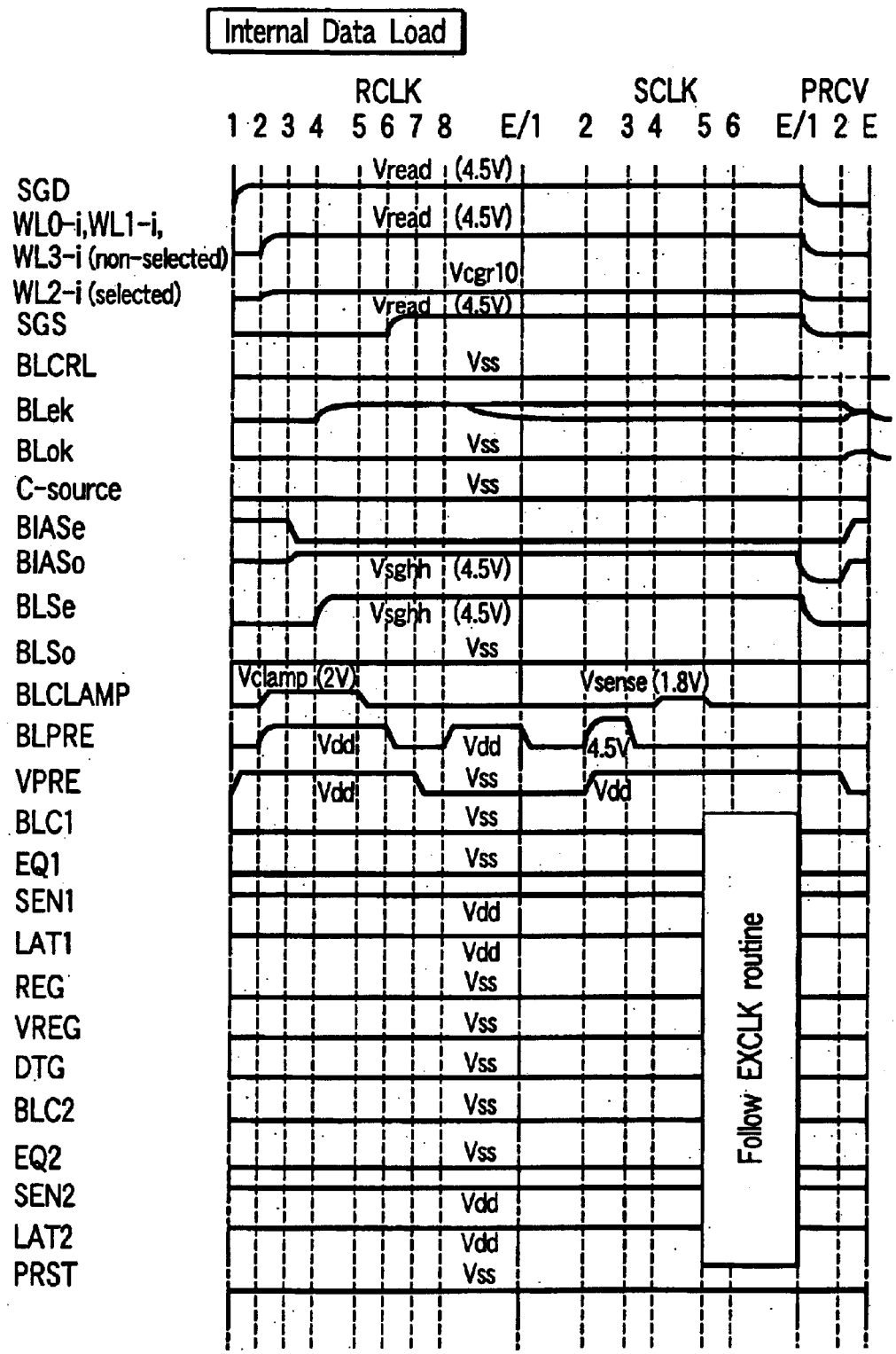
F I G. 33

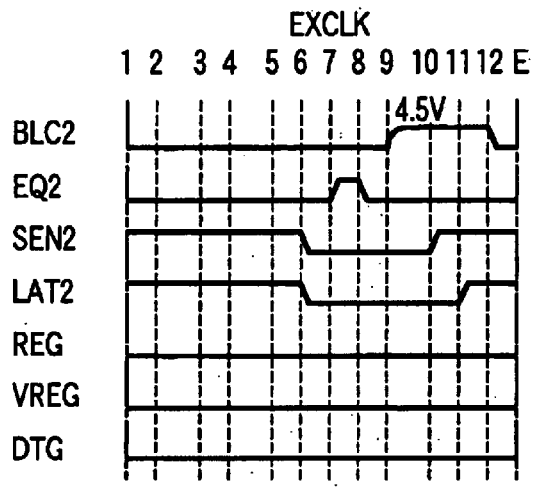
FIG. 34  No change in signals other than shown signals
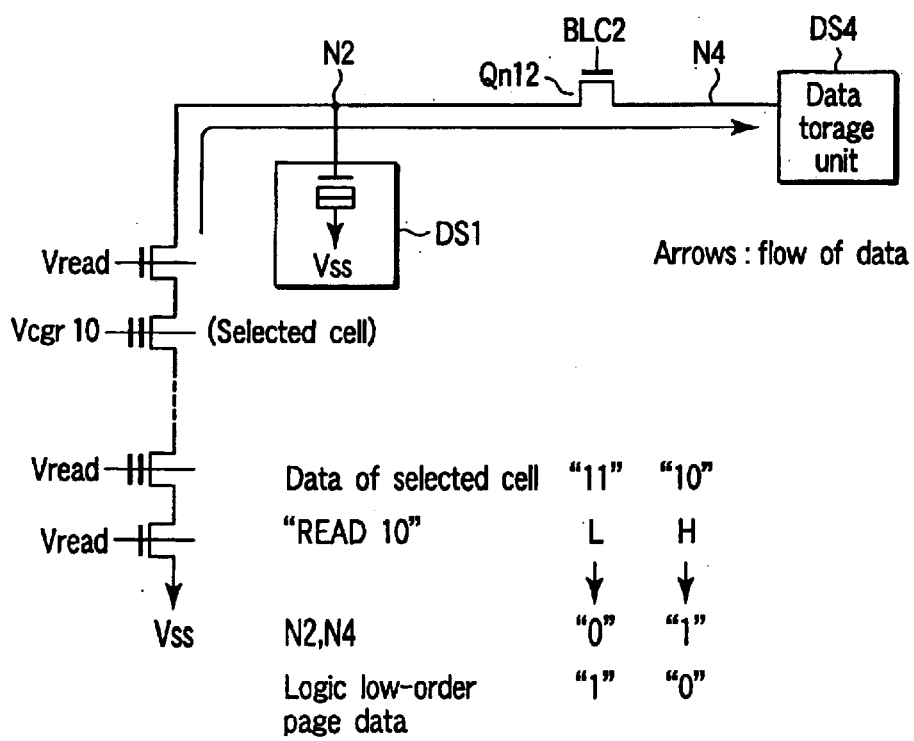
FIG. 35  * "0" = "L", "1" = "H"

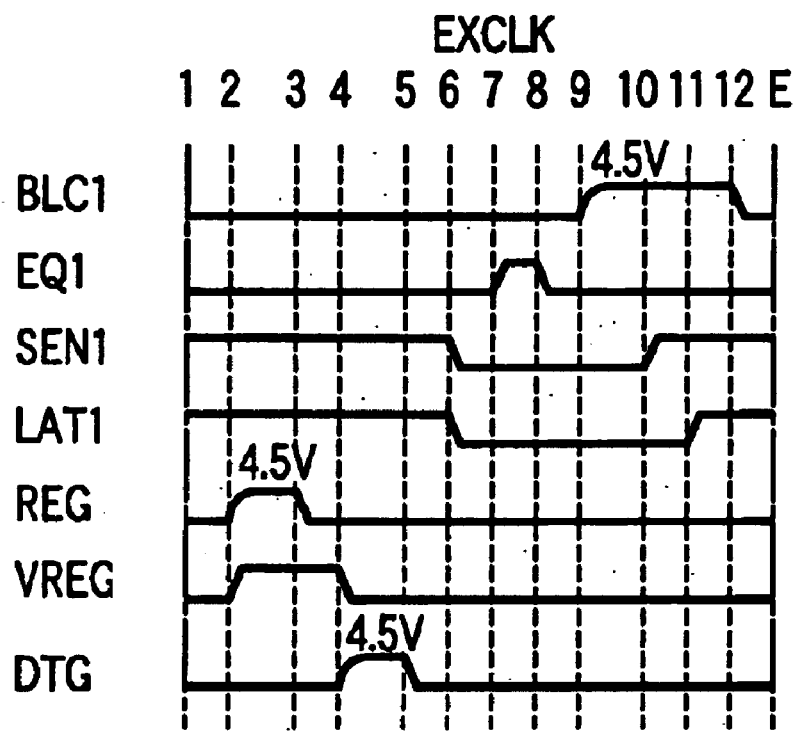
F I G. 41

NONVOLATILE SEMICONDUCTOR MEMORY

CROSS-REFERENCE TO RELATED APPLICATIONS

This application is a continuation of and claims the benefit of priority under 35 USC 517 120 from U.S. Ser. No. 10/373,920, filed Feb. 27, 2003 and is based upon and claims the benefit of priority under 35 USC § 119 from Japanese Patent Application No. 2002-281205, filed Sep. 26, 2002, the entire contents of which are incorporated herein by reference.

BACKGROUND OF THE INVENTION

1. Field of the Invention

The present invention relates to a nonvolatile semiconductor memory, particularly to a multi-level NAND cell type flash memory such as a four-level NAND cell type flash memory.

2. Description of the Related Art

A flash memory is constituted of a memory cell including a floating gate electrode and control gate electrode, and data program/erase is realized by adjustment of a charge amount in the floating gate electrode. The charge amount determines a threshold voltage of the memory cell. For example, a state in which the memory cell has a negative threshold voltage is set to a state "1", and a state in which the memory cell has a positive threshold voltage is set to a state "0".

In recent years, for a purpose of reducing a price per bit (bit unit price) or increasing a storage capacity of one memory chip, research and development of a multi-level flash memory have been advanced in which one memory cell stores a plurality of bit data.

Here, when one memory cell stores n (n is a natural number of 2 or more) bit data, that is, $2^n$ values, the memory cell has $2^n$ states ($2^n$ threshold value bands). For example, when one memory cell stores two bit data, the memory cell includes four threshold value bands.

The number of threshold value bands increases in proportion to an increase of the number of bits stored in one memory cell. On the other hand, an inner power voltage of the flash memory tends to drop. That is, as the number of bits stored in one memory cell increases, the number of threshold value bands increases, and the width of one threshold value band narrows. Therefore, in the multi-level flash memory, it is important to control the threshold voltage of the memory cell with good precision and enhance reliability.

As a technique for controlling the threshold voltage of the memory cell with the high precision, for example, a method of stepping up a write voltage at a constant ratio in accordance with the number of writes (step-up method) is known (refer to, for example, Fast and Accurate Programming Method for Multi-level NAND EEPROMs, pp. 129–130, Digest of 1995 Symposium on VLSI Technology).

This method will briefly be described. The step-up of the write voltage is realized by changing sizes of a plurality of continuous write pulses. For example, the size of the write pulse gradually increases at a ratio of 0.2 V/10 $\mu$sec. Every time the write pulses are applied to a plurality of memory cells as objects of a write operation, the threshold voltages of the memory cells are verified. For example, when the threshold voltages of all the memory cells reach a predetermined verify level, the application of the write pulses is ended.

Even in the multi-level flash memory, for a purpose of increasing the storage capacity of one memory chip, miniaturization of the memory cell proceeds. With the miniaturization, an interval between the memory cells narrows, and this causes various problems.

Particularly when the interval between the floating gate electrodes of the memory cell narrows, a capacitance among a plurality of floating gate electrodes disposed adjacent to one another increases. As a result, when predetermined data is written in the selected one memory cell, a potential of the floating gate electrode of the non-selected memory cell disposed adjacent to one memory cell changes. This means that the threshold voltage of the non-selected memory cell fluctuates separately from the write operation, and a reliability of the multi-level flash memory drops.

As a technique which can handle this problem, a method of executing the write operation with respect to one memory cell by two write routines (double write method) is known. For example, the above-described step-up method is applied to each routine. This can realize a high-precision threshold value control which is not influenced by the fluctuation of the threshold voltage of the memory cell caused by the increase of the capacitance among the floating gate electrodes.

However, when a so-called double write method is used, write data has to be held somewhere from a start of the first write routine till an end of the second write routine. This is because it is determined whether or not to inject the charge into the floating gate electrode in accordance with the value of the write data.

Therefore, in the multi-level flash memory, a chip size increases for a storage circuit for storing the write data. This also causes the increase of a manufacturing cost.

BRIEF SUMMARY OF THE INVENTION

According to an aspect of the present invention, there is provided a nonvolatile semiconductor memory comprising: a memory cell; a bit line connected to one end of the memory cell; and a data circuit in which program data or read data concerning the memory cell is temporarily stored. The data circuit includes: first, second, and third data storage units; a first data transfer circuit connected between the first and third data storage units; and a second data transfer circuit connected between the second and third data storage units. The first data storage unit is connected to the bit line, and the second data storage unit includes a function of forcibly changing data of the first data storage unit based on the data stored in the second data storage unit.

BRIEF DESCRIPTION OF THE SEVERAL VIEWS OF THE DRAWING

FIG. 13 is a diagram showing a circuit example of RADD1 of FIG. 12;

FIG. 14 is a diagram showing a circuit example of RMAIN1 of FIG. 12;

FIG. 30 is a diagram showing an algorithm example of the program operation by QPW;

FIG. 33 is a diagram showing an operation waveform example of an internal data load operation;

FIG. 34 is a diagram showing the operation waveform example of the EXCLK routine during the operation of FIG. 33;

FIG. 35 is a diagram showing a flow of data at an internal data load operation time;

FIG. 41 is a diagram showing an operation waveform example of the EXCLK routine during the operation of FIG. 40;

DETAILED DESCRIPTION OF THE INVENTION

A nonvolatile semiconductor memory according to an embodiment of the present invention will be described hereinafter in detail with reference to the drawings.

1. Assumption

For ease of understanding the following description, prerequisites are defined as follows. Additionally, the prerequisites are set to easily understand the description. The present invention is established even on conditions other than the prerequisites.

The present invention relates to a multi-level flash memory in which n (n is a natural number of 2 or more) bit data, that is, $2^n$ values are stored in one memory cell. In the following example, a four-level NAND cell type flash memory will be described as a typical example.

It is assumed that four types of data "00", "01", "10", "11" are stored in the memory cell. A state in which a threshold voltage of the memory cell is lowest, for example, a state in which the threshold voltage is negative and belongs to a first threshold value band is assumed as a state in which the data "11" is stored. A state in which the threshold voltage of the memory cell is secondly low, such as a state in which the threshold voltage is positive and belongs to a second threshold value band is assumed as a state in which the data "10" is stored. A state in which the threshold voltage of the memory cell is thirdly low, such as a state in which the threshold voltage is positive and belongs to a third threshold value band is assumed as a state in which the data "00" is stored. A state in which the threshold voltage of the memory cell is highest, such as a state in which the threshold voltage is positive and belongs to a fourth threshold value band is assumed as a state in which the data "01" is stored.

Moreover, in the memory cell, four types of data, that is, four-level data are stored. Therefore, for example, at a data program/read time, program/read operations for logic low-order and high-order page data are required. Here, in data "**", the right-side * denotes the logic low-order page data and the left-side * denotes the logic high-order page data.

Moreover, with respect to the memory cell, a state in which the data "11" is stored is assumed as an erase state, and a state in which the data "10", "00", "01" are stored is assumed as a write state.

2. Outline

(1) Whole Constitution Example

Figure 1:
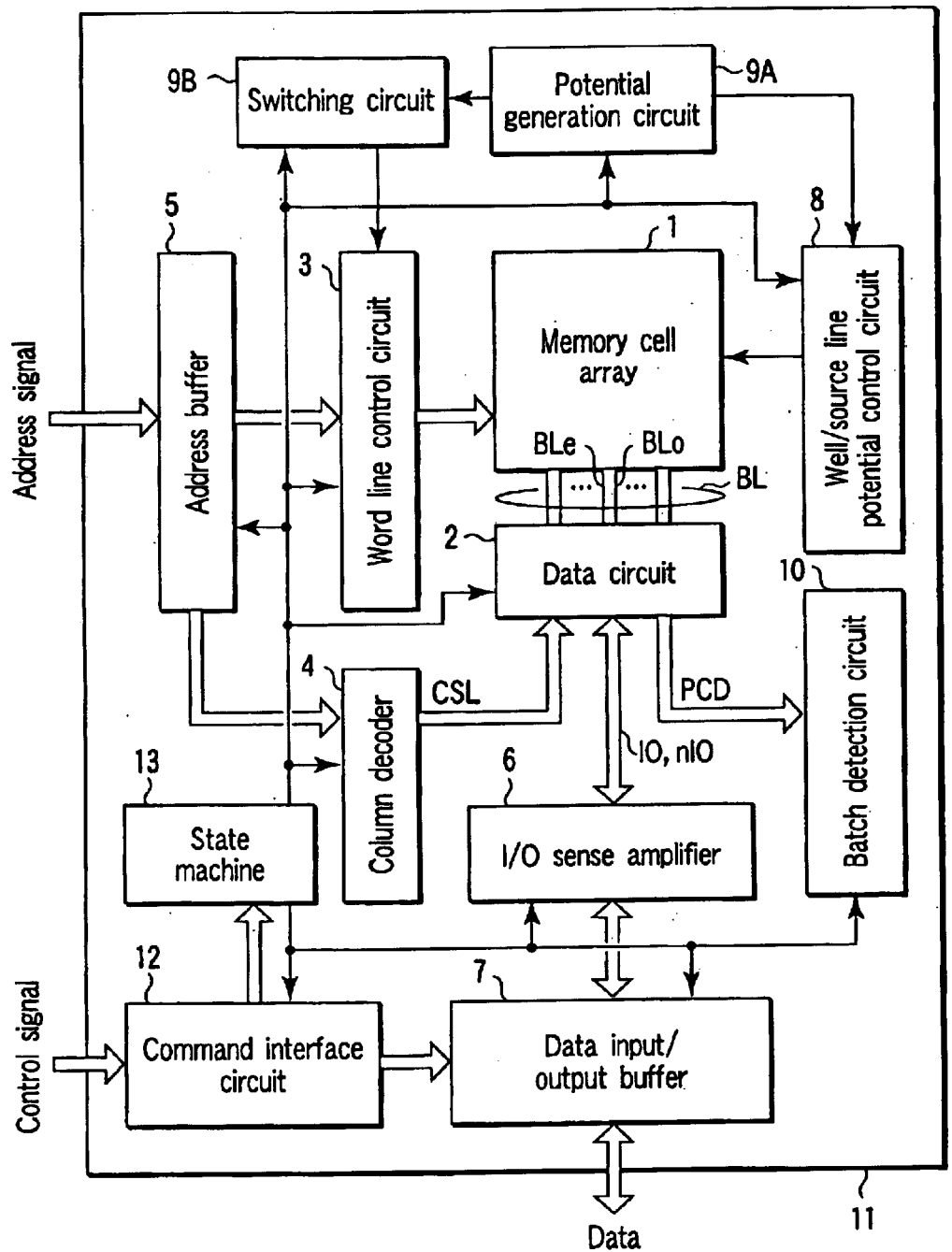
FIG. 1 is a block diagram showing a nonvolatile semiconductor memory according to an embodiment of the present invention.

FIG. 1 shows a major part of a four-level NAND cell type flash memory according to an embodiment of the present invention.

Reference numeral 1 denotes a memory cell array. For example, the memory cell array 1 includes a NAND cell unit constituted of a plurality of memory cells connected in series and two select transistors connected to opposite ends of the memory cell. Circuit and structure examples of the memory cell array 1 will be described later.

A data circuit 2 includes a plurality of storage circuits. A circuit example of the data circuit 2 will be described later. Here, a function of the data circuit 2 will briefly be described.

The data circuit 2 temporarily stores two bits (four levels) of write data at a write time, and two bits (four levels) of read data at a read time. Therefore, at least two storage circuits are disposed with respect to one bit line connected to the memory cell selected as an object of a write/read operation. In one of two storage circuits, the logic low-order page data is stored, and in the other circuit, the logic high-order page data is stored.

A word line control circuit 3 includes a row address decoder and word line driver. The word line control circuit 3 controls potentials of a plurality of word lines in the memory cell array 1 based on an operation mode (write, erase, read) and address designated by a row address signal. A circuit example of the word line control circuit 3 will be described later.

A column decoder 4 selects a column of the memory cell array 1 based on a column address signal.

At a program time, write data is inputted into a storage circuit in the data circuit 2 belonging to a selected column via a data input/output buffer 7 and I/O sense amplifier 6. Moreover, at a read time, read data is temporarily stored in the storage circuit in the data circuit 2 belonging to the selected column, and subsequently outputted to the outside of a memory chip 11 via the I/O sense amplifier 6 and data input/output buffer 7.

The row address signal is inputted into the word line control circuit 3 via an address buffer 5. The column address signal is inputted into the column decoder 4 via the address buffer 5.

A well/source line potential control circuit 8 controls the potentials of a plurality of well regions for a plurality of blocks constituting the memory cell array 1 (e.g., a double well region including n and p wells) and the potential of a source line based on the operation mode (write, erase, read).

A potential generation circuit (step-up circuit) 9A generates, for example, a write potential (e.g., about 20 V) Vpp or a transfer potential (e.g., about 10 V) Vpass at the write time. For example, a switching circuit 9B distributes these potentials Vpp, Vpass to a plurality of word lines in a block selected from a plurality of blocks constituting the memory cell array 1.

Moreover, for example, the potential generation circuit 9A generates an erase potential (e.g., about 20 V) VppE at an erase time, and supplies the potential VppE to one or two or more well regions (both the n and p wells) corresponding to one or two or more blocks selected from a plurality of blocks constituting the memory cell array 1.

A batch detection circuit 10 verifies whether or not predetermined data is accurately written into the memory cell at the program time, and verifies whether or not the data of the memory cell is accurately erased at the erase time.

A command interface circuit 12 judges whether or not the data inputted into the data input/output buffer 7 is command data supplied from a host microcomputer based on a control signal generated by a chip (e.g., host microcomputer) different from the memory chip 11. When the data inputted into the data input/output buffer 7 is command data, the command interface circuit 12 transfers the command data to a state machine (control circuit) 13.

The state machine 13 determines the operation mode (write, erase, read) of the flash memory based on the command data, and controls the whole operation of the flash memory in accordance with the operation mode. Concretely the machine controls the operations of the data circuit 2, word line control circuit 3, column decoder 4, address buffer 5, I/O sense amplifier 6, data input/output buffer 7, well/source line potential control circuit 8, potential generation circuit 9A, switching circuit 9B, and batch detection circuit 10.

(2) Constitution Example Of Memory Cell Array

Figure 2:
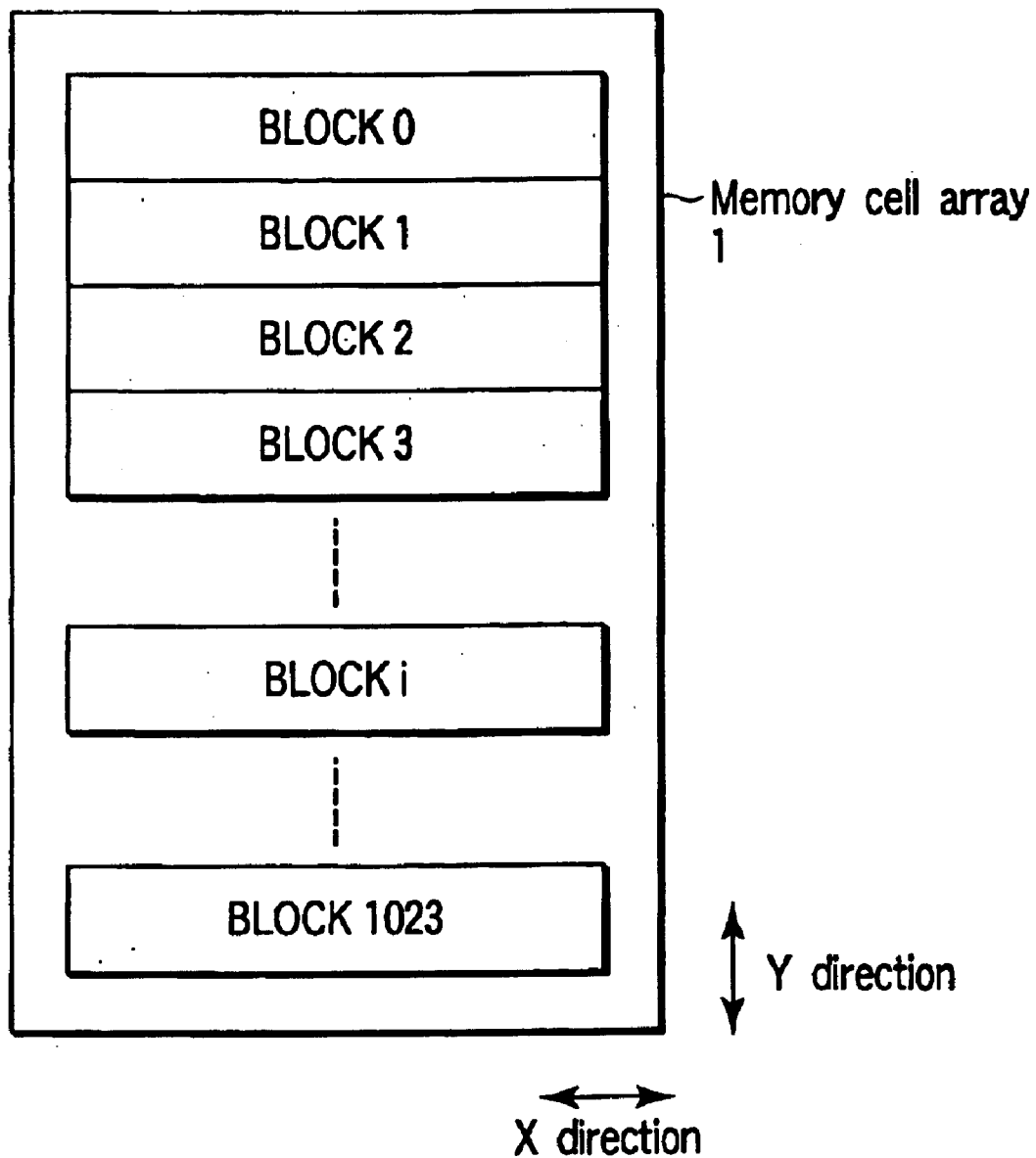
FIG. 2 is a diagram showing a constitution example of a memory cell array.
Figure 3:
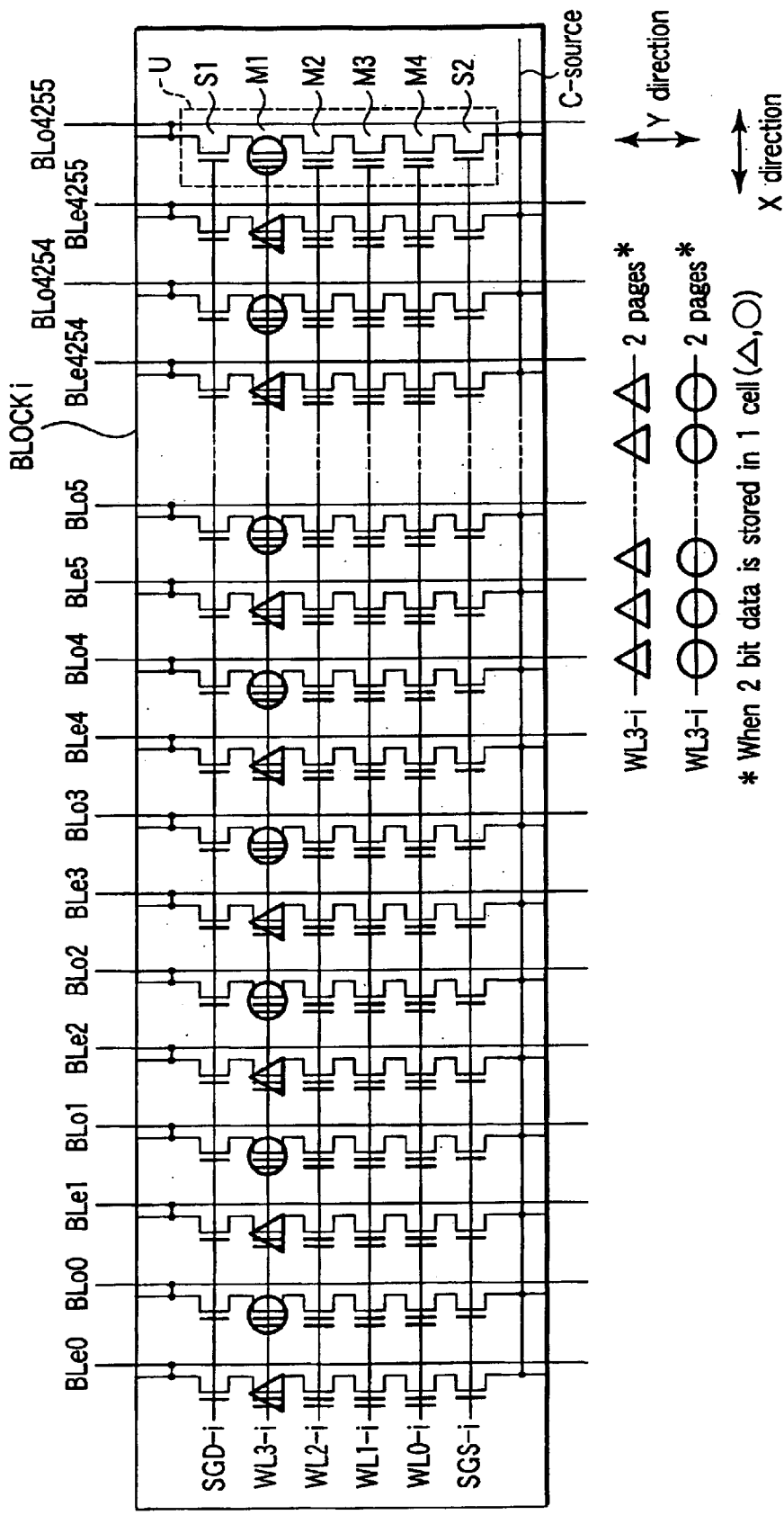
FIG. 3 is a diagram showing a constitution example of the memory cell array.

FIG. 2 shows a constitution example of the memory cell array. FIG. 3 shows a circuit example of one BLOCKi among a plurality of blocks shown in FIG. 2.

The memory cell array 1 includes a plurality of (1024 blocks in the present example) blocks BLOCK0 to BLOCK1023. A plurality of blocks BLOCK0 to BLOCK1023 are arranged in a Y direction. The block means a minimum potential of erase, that is, a minimum number of memory cells which can be erased at once.

One block BLOCKi includes a plurality of NAND cell units U (8512 units in the present example) arranged in an X direction. One NAND cell unit U includes: a NAND column including four memory cells M1, M2, M3, M4 connected in series; a select gate transistor S1 connected to one end of the NAND column; and a select gate transistor S2 connected to the other end of the NAND column.

In the present example, the NAND column includes four memory cells M1, M2, M3, M4, but may also include one or two or more memory cells, and the number of cells is not limited to four.

The select gate transistor S1 is connected to a bit line BLek or BLok (k=0, 1, . . . 4255), and the select gate transistor S2 is connected to a source line C-source.

Word lines (control gate lines) WL0-$i$, WL1-$i$, WL2-$i$, WL3-$i$ extend in the X direction, and are connected in common to a plurality of memory cells of the X direction. A select gate line SGD-i extends in the X direction, and is connected in common to a plurality of select gate transistors S1 of the X direction. A select gate line SGS-i also extends in the X direction, and is connected in common to a plurality of select gate transistors S2 of the X direction.

In the present example, at a write/read operation time, a plurality of bit lines BLe0, BLe1, . . . BLe4255 disposed in even-numbered positions counted from one end of the block BLOCKi, and a plurality of bit lines BLo0, BLo1, . . . BLo4255 disposed in odd-numbered positions counted from one end of the block are driven independently of one another. Additionally, the bit line is assumed to be counted from 0.

That is, the write/read operation is simultaneously executed with respect to 4256 memory cells (shown by Δ) connected to a plurality of bit lines BLe0, BLe1, . . . BLe4255 disposed in the even-numbered positions among 8512 memory cells connected to one word line such as word line WL3-$i$. Moreover, the write/read operation is simultaneously executed with respect to 4256 memory cells (shown by ○) connected to a plurality of bit lines BLo0, BLo1, . . . BLo4255 disposed in the odd-numbered positions among 8512 memory cells connected to the word line WL3-$i$.

When one memory cell stores one bit data, 4256 memory cells (shown by △) positioned in intersections of one word line such as word line WL3-$i$ and a plurality of even-numbered bit lines BLe0, BLe1, . . . BLe4255 constitute a unit called a page. Similarly, 4256 memory cells (shown by ○) positioned in the intersections of the word line WL3-$i$ and a plurality of odd-numbered bit lines BLo0, BLo1, . . . BLo4255 also constitute the unit called the page.

Moreover, when one memory cell stores two bit data as in the present example, 4256 memory cells (shown by △) stores data for two pages, and 4256 memory cells (shown by ○) also stores the data for two pages.

(3) Device Structure Example

1). Well Structure Example

Figure 4:
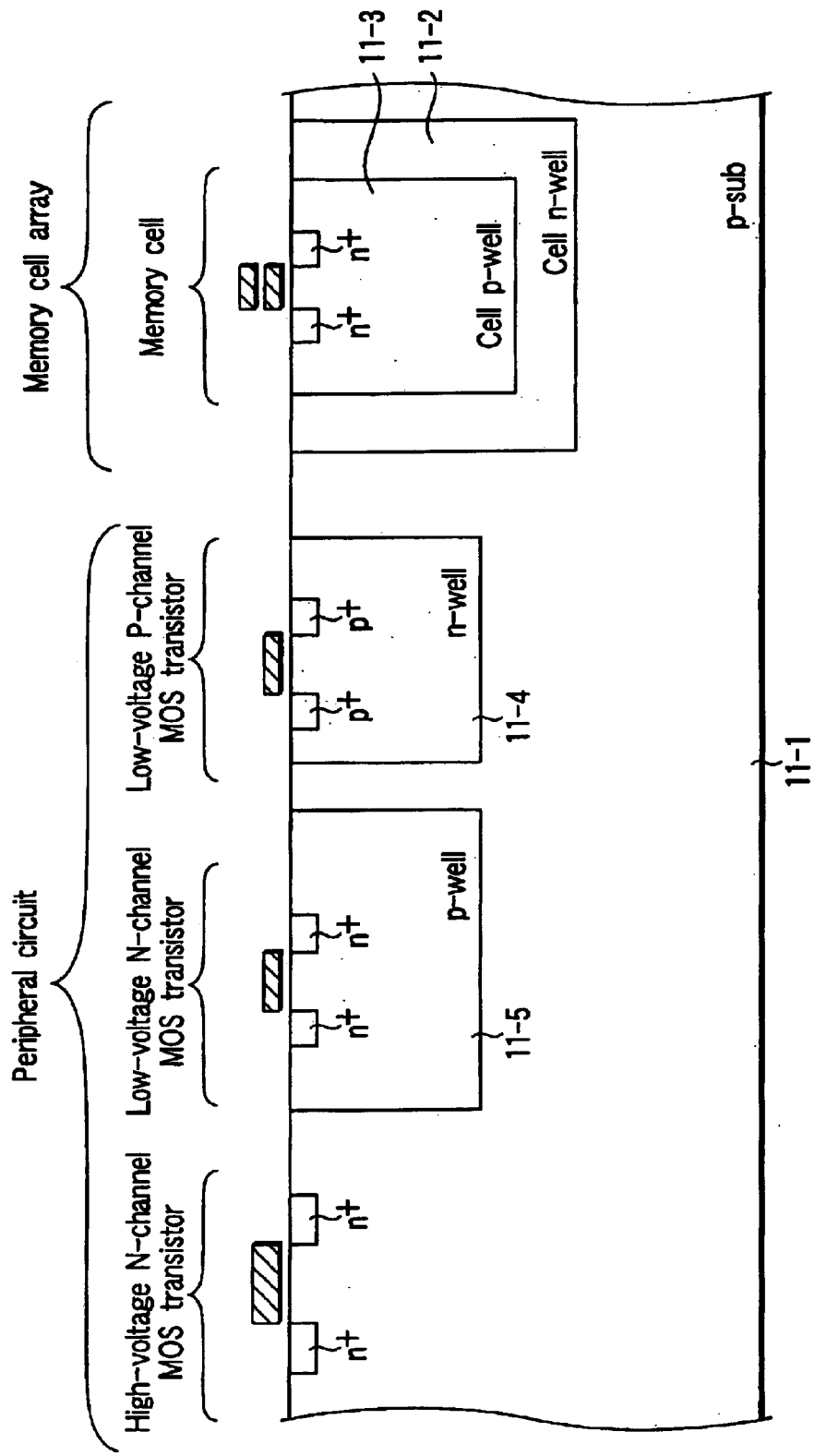
FIG. 4 is a sectional view showing an example of a device structure.

FIG. 4 shows an example of a well structure of the NAND cell type flash memory.

In a p-type silicon substrate (p-sub) 11-1, a so-called double well region including an n-type well region (Cell n-well) 11-2 and p-type well region (Cell p-well) 11-3, n-type well region (n-well) 11-4, and p-type well region (p-well) 11-5 are formed.

The double well region is formed in a memory cell array portion, and the n-type well region 11-4 and p-type well region 11-5 are formed in a peripheral circuit portion.

The memory cell includes an n-channel MOS transistor, and is disposed in the p-type well region 11-3. The n-type well region 11-2 and p-type well region 11-3 are set at the same potential.

A high-voltage n-channel MOS transistor to which a voltage higher than a power voltage is applied is formed in the p-type silicon substrate (p-sub) 11-1. A low-voltage p-channel MOS transistor to which the power voltage is applied is formed in the n-type well region (n-well) 11-4, and a low-voltage n-channel MOS transistor to which the power voltage is applied is formed in the p-type well region (p-well) 11-5.

2). Cell Array Structure Example

Figure 5:
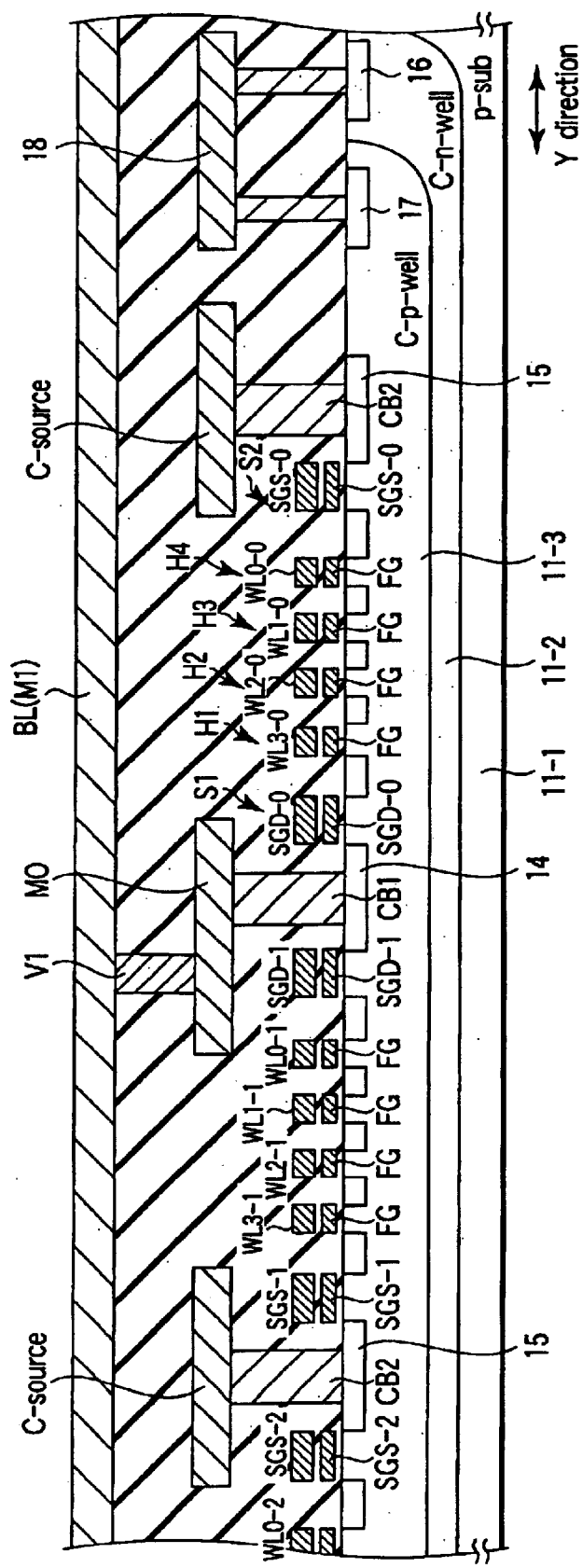
FIG. 5 is a sectional view showing an example of the device structure.

FIG. 5 shows an example of a sectional structure of the Y direction of the memory cell array portion of the NAND cell type flash memory.

In the p-type silicon substrate 11-1, the double well region including the n-type well region 11-2 and p-type well region 11-3 is formed.

Four memory cells M1, M2, M3, M4 connected in series are arranged in the p-type well region 11-3. Each of the four memory cells M1, M2, M3, M4 is constituted of an N-channel MOS transistor, and includes a stack gate structure including floating gate electrodes FG and control gate electrodes WL0-$i$, WL1-$i$, WL2-$i$, WL3-$i$.

One end of the NAND column including the memory cells M1, M2, M3, M4 connected in series is connected to the select gate transistor S1, and the other end thereof is connected to the select gate transistor S2. The select gate transistors S1, S2 include the N-channel MOS transistors, and include structures approximate to the memory cells M1, M2, M3, M4, that is, the double structure select gate lines SGS-$i$, SGD-$i$.

One end of the NAND cell unit, that is, a diffusion layer (drain diffusion layer) 14 of the select gate transistor S1 is connected to a first metal wiring layer M0 via a contact plug CB1. Moreover, the first metal wiring layer M0 is connected to a second metal wiring layer M1 as a bit line BL via a via plug V1. The bit line BL is connected to a data circuit.

The other end of the NAND cell unit, that is, a diffusion layer (source diffusion layer) 15 of the select gate transistor S2 is connected to the first metal wiring layer M0 as a source line C-source via a contact plug CB2. The source line C-source is connected to a source potential control circuit.

The n-type well region (Cell n-well) 11-2 is connected to a C-p-well potential setting line 18 via an n-type diffusion layer 16, and the p-type well region (Cell p-well) 11-3 is connected to the C-p-well potential setting line 18 via a p-type diffusion layer 17. That is, the n-type well region 11-2 and p-type well region 11-3 are set at the same potential. The C-p-well potential setting line 18 is connected to a well potential control circuit.

It is to be noted that the floating gate electrodes FG, control gate electrodes WL0-$i$, WL1-$i$, WL2-$i$, WL3-$i$, and select gate lines SGS-$i$, SGD-$i$ are formed, for example, of conductive polysilicon containing impurities. Moreover, the first and second metal wiring layers M0, M1 are formed, for example, of aluminum, copper, or an alloy of these metals.

Figure 6:
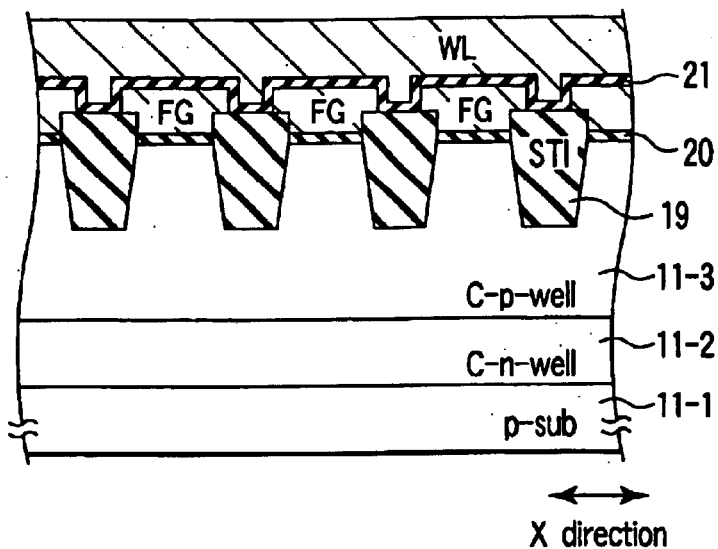
FIG. 6 is a sectional view showing an example of the device structure.
Figure 7:
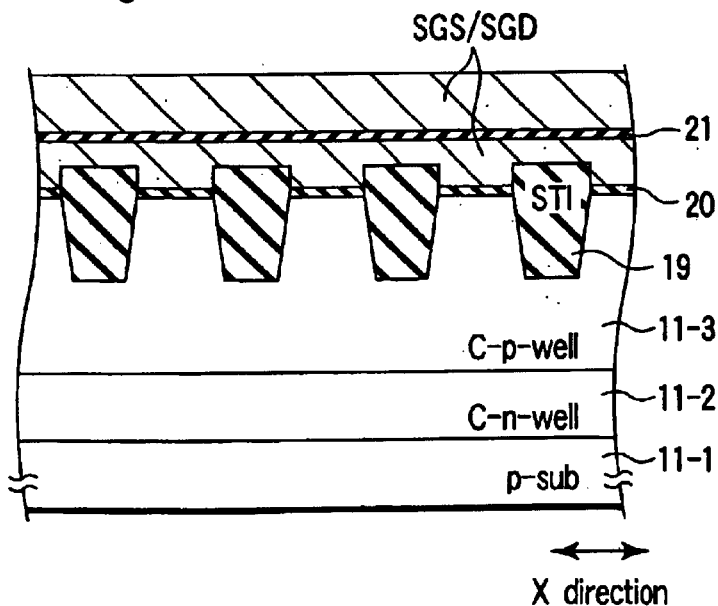
FIG. 7 is a sectional view showing an example of the device structure.

FIG. 6 shows an example of the sectional structure of the X direction of the memory cell, and FIG. 7 shows an example of the sectional structure of the X direction of the select gate transistor.

A plurality of memory cells (FG+WL) of the X direction are electrically separated from one another by a device isolation layer 19 including a shallow trench isolation (STI) structure. The floating gate electrodes FG are arranged on the p-type well region 11-3 via a very thin tunnel oxide film 20. The control gate electrode WL is disposed on the floating gate electrodes FG via an oxide/nitride/oxide (ONO) film 21.

The select gate line SGS/SGD has a double structure. Lower and upper select gate lines SGS/SGD are electrically connected to each other in an end of the memory cell array, and are electrically connected to each other even in the memory cell array at a constant interval, for example, every 512 bit lines.

(4) Constitution Example Of Batch Detection Circuit

Figure 8:
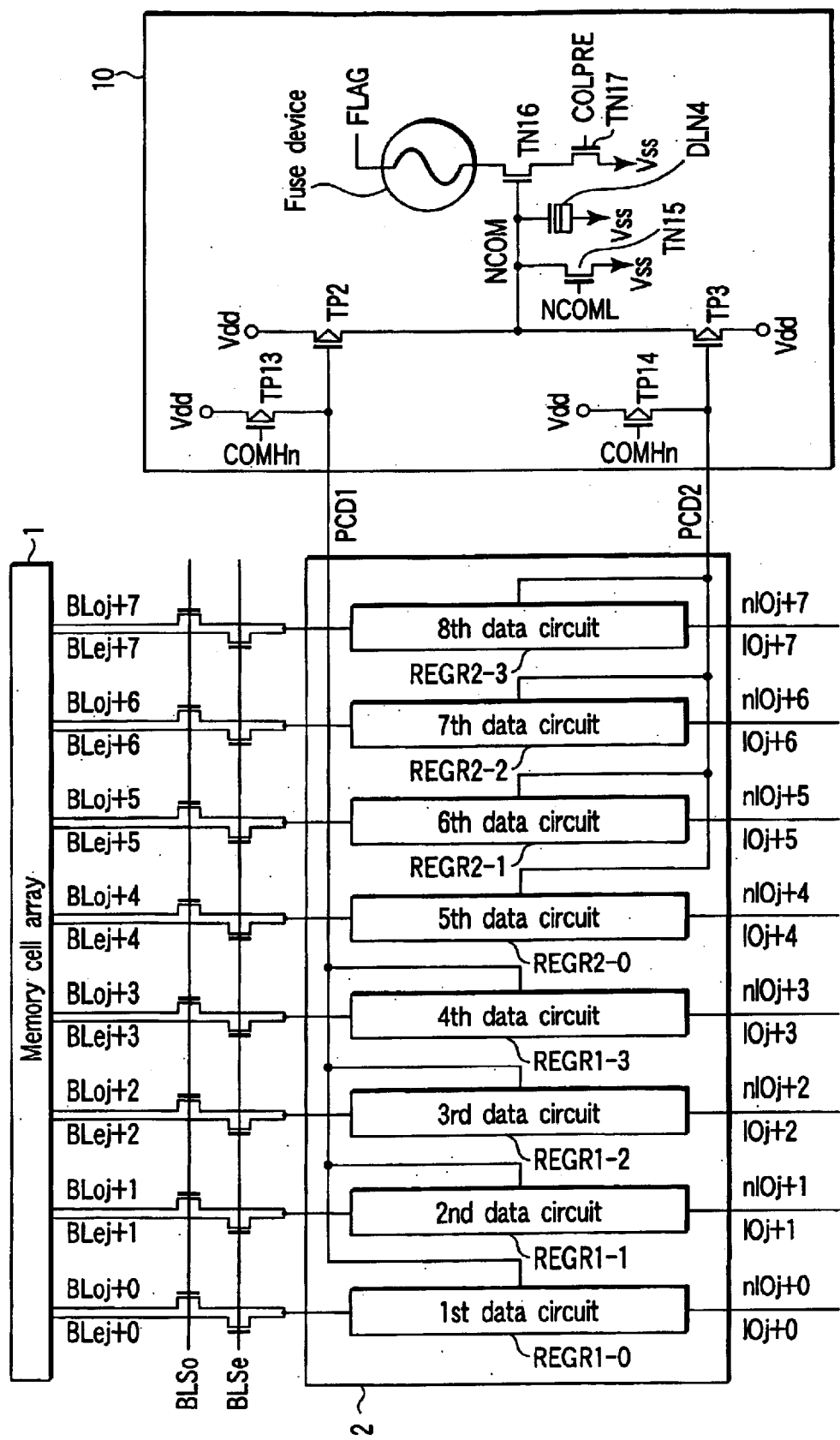
FIG. 8 is a circuit diagram showing an example of a batch detection circuit.

FIG. 8 shows a constitution example of the batch detection circuit.

The batch detection circuit 10 has a function of checking whether or not the data is completely written or erased with respect to all the selected memory cells after a verify read (program/erase completion detection).

In the present example, as described in the constitution example of the memory cell array, it is assumed that a plurality of even-numbered and odd-numbered bit lines are driven independently of one another at the write/read operation time. Therefore, one sub data circuit is disposed for two bit lines including one even-numbered bit line and one odd-numbered bit line.

Concretely, since 8512 bit lines BLe$k$, BLo$k$ ($k$=0, 1, . . . 4225) exist, the data circuit 2 is constituted of 4256 sub data circuits. It is to be noted that the constitution example of each sub data circuit in the data circuit 2 will be described later.

In the present example, among 4256 sub data circuits, only eight sub data circuits REGR1-0, REGR1-1, REGR1-2, REGR1-3, REGR2-0, REGR2-1, REGR2-2, REGR2-3 are shown.

A sub data circuit REGR1-y is connected to two bit lines BLej+y, BLoj+y, and an I/O line pair IOj+y, nIOj+y. Moreover, a sub data circuit REGR2-y is connected to two bit lines BLej+y+4, BLoj+y+4, and an I/O line pair IOj+y+4, nIOj+y+4. Additionally, y=0, 1, 2, 3.

Output nodes RCD1 of the first to fourth sub data circuits REGR1-0, REGR1-1, REGR1-2, REGR1-3 are connected in common, and the connection node RCD1 is connected to a gate pf a P-channel MOS transistor TP2. Similarly, output nodes RCD2 of the fifth to eighth sub data circuits REGR2-0, REGR2-1, REGR2-2, REGR2-3 are connected in common, and the connection node RCD2 is connected to the gate of a P-channel MOS transistor TP3.

P-channel MOS transistors TP13, TP14 have a function of precharging the nodes RCD1, RCD2 based on control signals COMHn at a program/erase completion detection time. That is, after the control signals COMHn are set to "1", and the nodes RCD1, RCD2 are set to a power potential Vdd, the control signals COMHn are set to "L", and the nodes RCD1, RCD2 are brought into a floating state. In this case, the P-channel MOS transistors TP2, TP3 are brought into an off state.

An N-channel MOS transistor TN15 has a function of setting a node NCOM to a ground potential Vss at the program/erase completion detection time, and subsequently setting the floating state. The MOS transistor TN15 is controlled by a control signal NCOML.

At the program/erase completion detection time, for the sub data circuit corresponding to the memory cell in which the data is not sufficiently written/erased, a potential level of the common node RCD1 or RCD2 is lowered to "L" from "H".

Therefore, with at least one memory cell in which the data is not sufficiently written/erased, the P-channel MOS transistor TP2 or TP3 is turned on, the node NCOM turns to "H" from "L", and FLAG turns to "L".

On the other hand, with respect to all the memory cells, the data is sufficiently written/erased. In this case, in all the sub data circuits, the potential levels of the common nodes RCD1, RCD2 are maintained at "H". Therefore, the node NCOM remains at "L", and FLAG turns to "H".

When the potential level of FLAG is detected in this manner, it is possible to check whether or not the data is completely written/erased with respect to all the memory cells.

In the present example, eight sub data circuits are regarded as one group, and the program/erase completion detection, that is, the detection of the voltage level of FLAG is performed every eight sub data circuits.

A reason why eight sub data circuits are combined into one group is that the memory cells are replaced by a redundancy circuit by a unit of eight columns corresponding to these eight sub data circuits. That is, when a fuse device (surrounded with a broken line) is disconnected, the memory cells connected to these eight sub data circuits are always in an non-selected state, and spare memory cells of a redundancy region are selected instead.

Therefore, when the memory cell is replaced by the redundancy circuit by a unit of n columns corresponding to n (n is a natural number) sub data circuits, the n sub data circuits are combined into one group.

It is to be noted that FLAG is a common node for all the columns. For example, when the data circuit 2 includes 4256 sub data circuits, and eight sub data circuits are assumed as one unit of redundancy replacement, 532 circuits shown in FIG. 8 exist in the chip. Moreover, these 532 circuits are connected to the common node FLAG.

(5) Constitution Example of Data Circuit

Figure 9:
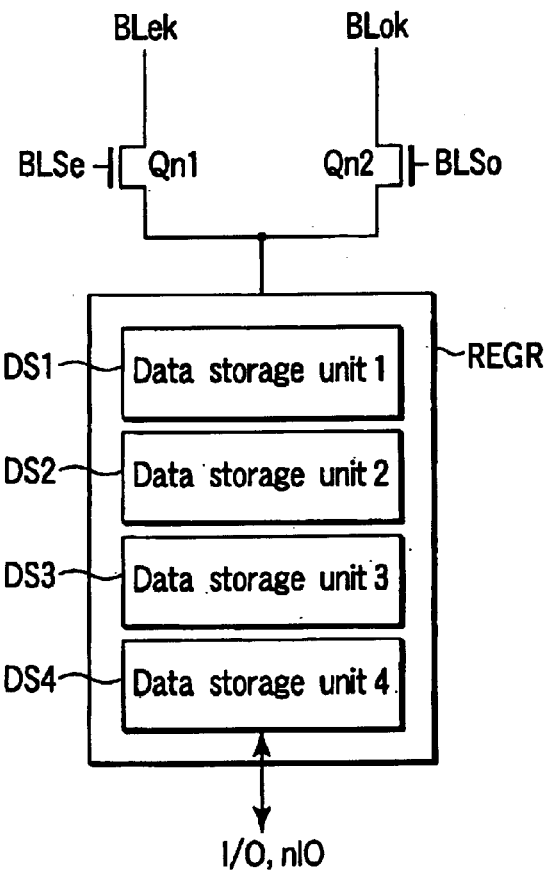
FIG. 9 is a diagram showing a constitution example of a data circuit.

FIG. 9 shows a constitution example of the sub data circuit in the data circuit.

In the present example, the data circuit is constituted of a plurality of sub data circuits (e.g., 4256 circuits), and each sub data circuit includes a constitution shown in FIG. 9.

The sub data circuit REGR includes four data storage units DS1, DS2, DS3, DS4. These data storage units DS1, DS2, DS3, DS4 are used to execute read and program operations of two bit data with respect to one selected memory cell. The program operation includes write and verify operations.

Moreover, one sub data circuit is disposed with respect to two bit lines in total including one even-numbered bit line and one odd-numbered bit line. The even-numbered bit line BLek is connected to the sub data circuit REGR via an N-channel MOS transistor Qn1, and the odd-numbered bit line BLok is connected to the sub data circuit REGR via an N-channel MOS transistor Qn2.

When a control signal BLSe indicates "H", and a control signal BLSo indicates "L", the N-channel MOS transistor Qn1 is turned on. Therefore, the even-numbered bit line BLek is electrically connected to the sub data circuit REGR. Moreover, when the control signal BLSe indicates "L", and the control signal BLSo indicates "H", the N-channel MOS transistor Qn2 is turned on. Therefore, the odd-numbered bit line BLok is electrically connected to the sub data circuit REGR.

It is to be noted that the control signal BLSe is inputted in common into the N-channel MOS transistor Qn1 connected to the even-numbered bit line BLek, and the control signal BLSo is inputted in common into the N-channel MOS transistor Qn2 connected to the odd-numbered bit line BLok.

Figure 10:
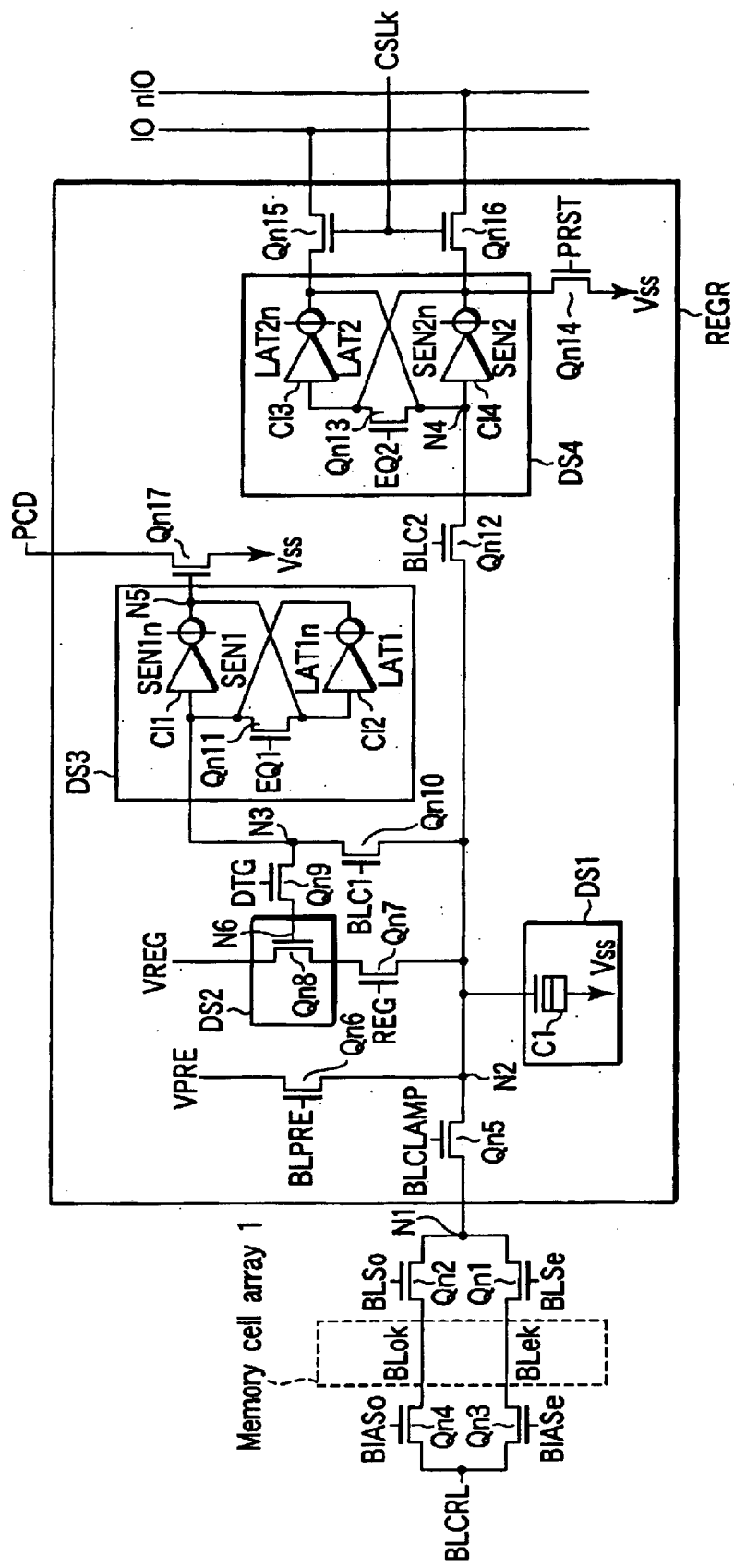
FIG. 10 is a circuit diagram showing an example of the data circuit.

FIG. 10 shows a circuit example of the sub data circuit of FIG. 9.

In the present example, the sub data circuit for one column (including two bit lines BLek, BLok) corresponding to FIG. 9 is shown.

The sub data circuit REGR includes four data storage units DS1, DS2, DS3, DS4.

The data storage unit DS1 includes a depression type N-channel MOS capacitor C1. The data storage unit DS2 includes an N-channel MOS transistor Qn8. The data storage unit DS3 is constituted of a CMOS flip-flop circuit including clock synchronous inverters CI1, CI2, and the data storage unit DS4 is constituted of a CMOS flip-flop circuit including clock synchronous inverters CI3, CI4.

One end of the MOS capacitor C1 is connected to the bit lines BLek, BLok via N-channel MOS transistors Qn5, Qn1, Qn2, and the other end thereof is connected to a ground point Vss. The MOS transistor Qn5 is a clamp transistor which electrically connects/disconnects a node N1 of the bit line on a side of Qn1, Qn2 and a node N2 on a side of the MOS capacitor C1.

When a control signal BLCLAMP indicates "H", the MOS transistor Qn5 is turned on. For example, the even-numbered bit line BLek is electrically connected to one end of the MOS capacitor C1. At this time, the control signal BLSe is set to "H", and the control signal BLSo is set to "L". Moreover, at this time, a control signal BIASe is set to "L", a control signal BLASo is set to "H", and a bias potential (e.g., ground potential) BLCRL is supplied to the odd-numbered bit line BLok.

Moreover, when the odd-numbered bit line BLok is electrically connected to one end of the MOS capacitor C1, the control signal BLSe is set to "L", and the control signal BLSo is set to "H". Furthermore, at this time, the control signal BIAse is set to "H", the control signal BIAso is set to "L", and the bias potential (e.g., ground potential) BLCRL is supplied to the even-numbered bit line BLek.

When the control signal BLCLAMP indicates "L", the MOS transistor Qn5 is turned on. For example, the node N1 on Qn1, Qn2 side of the bit line is electrically disconnected from the node N2 on the MOS capacitor C1 side.

An N-channel MOS transistor Qn6 is connected to one end of the MOS capacitor C1. The MOS transistor Qn6 is a device for charging one end of the MOS capacitor C1 at a precharge potential VPRE. When a control signal BLPRE indicates "H", one end of the MOS capacitor C1 is charged at the precharge potential VPRE.

An N-channel MOS transistor Qn8 is connected to one end of the MOS capacitor C1 via an N-channel MOS transistor Qn7. When a control signal REF indicates "H", that is, when the MOS transistor Qn7 is turned on, the MOS transistor Qn8 forcibly sets the potential of one end of the MOS capacitor C1 to VREG based on the value of the data stored in the data storage unit DS2.

For example, when the data stored in the data storage unit DS2 is "1", that is, the level of the gate of the MOS transistor indicates "H", the control signal REG turns to "H", and one end of the MOS capacitor C1 is forcibly set to VREG. Moreover, when the data stored in the data storage unit DS2 is "0", that is, the level of the gate of the MOS transistor indicates "L", the potential of one end of the MOS capacitor C1 is not influenced by VREG.

Both the data storage units DS3, DS4 are constituted of a COS flip-flop circuit.

An N-channel MOS transistor Qn11 is a device for equalizing the potentials of two input terminals of the CMOS flip-flop circuit in the data storage unit DS3, that is, the input terminals of the clock synchronous inverters CI1, CI2. Moreover, an N-channel MOS transistor Qn13 is a device for equalizing the potentials of two input terminals of the CMOS flip-flop circuit in the data storage unit DS4, that is, the input terminals of the clock synchronous inverters CI3, CI4.

The MOS transistor Qn11 is controlled by a control signal EQ1, and the MOS transistor Qn13 is controlled by a control signal EQ2.

The clock synchronous inverter CI1 operates in synchronization with clock signals SEN1, SEN1n, the clock synchronous inverter CI2 operates in synchronization with clock signals LAT1, LAT1n, the clock synchronous inverter CI3 operates in synchronization with clock signals LAT2, LAT2n, and the clock synchronous inverter CI4 operates in synchronization with clock signals SEN2, SEN2n.

It is to be noted that a signal "*n" means a reverse signal obtained by reversing the level of a signal "*". Constitution examples of the clock synchronous inverters CI1, CI2, CI3, CI4 are shown, for example, in FIG. 11.

Figure 11:
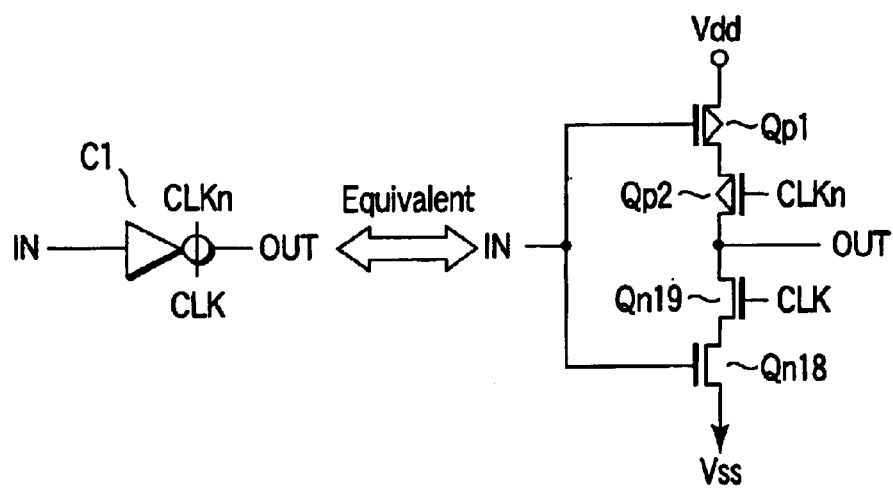
FIG. 11 is a diagram showing a constitution example of a clock synchronous inverter.

The clock synchronous inverter of FIG. 11 operates as a CMOS inverter, when a clock signal CLK indicates "H" and a clock signal CLKn indicates "L". When the clock signal CLK indicates "L", and the clock signal CLKn indicates "H", an input signal IN has nothing to do with an output signal OUT.

An N-channel MOS transistor Qn10 is connected as a switch device between the data storage units DS1 and DS3, that is, between one end (node N2) of the MOS capacitor C1 and the input terminal (node N3) of the clock synchronous inverter CI1. The MOS transistor Qn10 is controlled by a control signal BLC1, and is used to transfer data between the data storage units DS1 and DS3.

An N-channel MOS transistor Qn9 is connected as the switch device between the data storage units DS2 and DS3, that is, between the gate of the N-channel MOS transistor Qn8 and the input terminal of the clock synchronous inverter CI1. The MOS transistor Qn9 is controlled by a control signal DTG, and is used to transfer the data stored in the data storage unit DS3 to the data storage unit DS2.

An N-channel MOS transistor Qn12 is connected as the switch device between the data storage units DS1 and DS4, that is, between one end (node N2) of the CMOS capacitor C1 and the input terminal (node N4) of the clock synchronous inverter CI4. The MOS transistor Qn12 is controlled by a control signal BLC2, and is used to transfer data between the data storage units DS1 and DS4.

An N-channel MOS transistor Qn14 is a device for resetting the data of the data storage unit DS4. For example, at a write operation time, the MOS transistor Qn14 sets the state of the data storage unit DS4 into "1" indicating a state of data hold, that is, sets the node N4 to a state of "H", before the write data is inputted into the data storage unit DS4.

Concretely, when a control signal PRST turns to "H", an output terminal of the clock synchronous inverter CI4 turns to "L", and the node N4 turns to "H".

The data storage unit DS4 is connected to I/O lines (data lines) IO, nIO via N-channel MOS transistors Qn15, Qn16 as column selection switches.

Since a column selection signal CSLk (K=0, 1, . . . 4255) turns to "H" in the column selected by the column address signal, the data storage unit DS4 is electrically connected to the I/O lines IO, nIO in the selected column.

An N-channel MOS transistor Qn17 is a device for determining a level of a common node PCD based on the data stored in the data storage unit DS3.

For example, at a programming time of "0", data "0" is stored in the data storage unit DS3. That is, since the node N4 has a state "L", and node N5 has a state "H", the N-channel MOS transistor Qn17 is turned on, and the level of the common node PCD is set to "L". When the data "0" is completely written in the memory cell at a verify read time, read data is "1". Therefore, data "1" is stored in the data storage unit DS4. That is, since the state of the node N4 changes to "H", and that of the node N5 changes to "L", the N-channel MOS transistor Qn17 is turned off, and the level of the common node PCD is set to "H".

It is to be noted that detailed operation will be described later.

In the above description, for the data, "0" and "1" exist. For the level of the node, "L" and "H" exist. For a relation, "0" corresponds to "L", and "1" corresponds to "H".

Moreover, in the present example, two bit lines BLek, BLok are arranged in one column, and these two bit lines BLek, BLok are connected to one sub data circuit. A reason why two bit lines BLek, BLok are connected to one sub data circuit lies in that objects are achieved: 1) a noise is prevented from being generated by a capacity coupling between the bit lines disposed adjacent to each other (use of a shield bit line read method); and 2), the number of data circuits is decreased and a chip area is reduced.

(6) Constitution Example of Word Line Control Circuit

Figure 12:
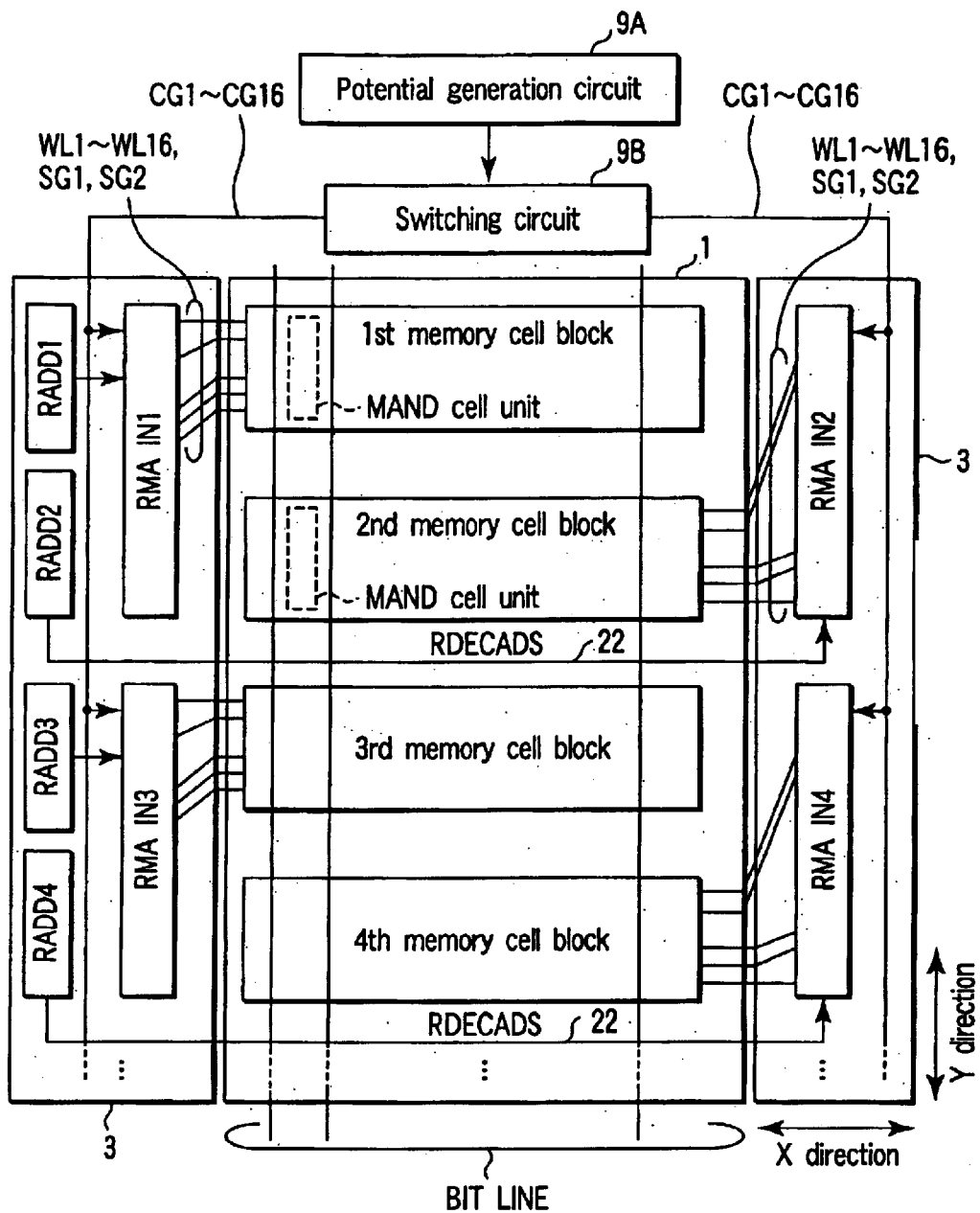
FIG. 12 is a diagram showing a constitution example of a word line control circuit.

FIG. 12 shows a constitution example of a word line control circuit.

The memory cell array 1 is constituted of a plurality of memory cell blocks arranged in the Y direction. Each memory cell block includes a plurality of NAND cell units arranged in the X direction. For the circuit example of the memory cell array and NAND cell unit, refer to FIG. 3.

Additionally, in the present example, the number of word lines WL1, . . . WL16 in one block is assumed to be 16, which is different from that of the above-described example (FIG. 3). However, since this respect is not particularly important, the respect will be described as such.

In the preset example, one row address decoder and one word line driver are disposed for one memory cell block.

For example, the word lines WL1, . . . WL16 and select gate lines SG1, SG2 are connected to a first word line driver RMAIN1, and the first word line driver RMAIN1 receives the output signal (decode result) of a first row address decoder RADD1 which determines selection/non-selection of the first memory cell block.

In this manner, the word lines WL1, . . . WL16 and select gate lines SG1, SG2 in an i-th (i=1, 2, . . . ) memory cell block are connected to an i-th word line driver RMAINi, and the i-th word line driver RMAINi receives the output signal (decode result) of an i-th row address decoder RADDi which determines the selection/non-selection of the i-th memory cell block.

Here, in the present example, the word line drivers are disposed on opposite sides (two ends of the X direction) of the memory cell array 1.

Concretely, the word line drivers RMAIN1, RMAIN 3, . . . corresponding to the odd-numbered memory cell array block are disposed on one (left end) of two ends of the X direction of the memory cell array 1, and the word line drivers RMAIN2, RMAIN 4, . . . corresponding to the even-numbered memory cell array block are disposed on the other end (right end) of two ends of the X direction of the memory cell array 1.

When the word line drivers RMAINi are arranged on the opposite ends of the memory cell array 1 in this manner, the word line drivers RMAINi can easily be designed (or the degree of freedom of layout can be enlarged). That is, in the present example, one word line driver can secure a layout space for two memory cell blocks in the Y direction.

Moreover, since the word lines WL1, . . . WL16 and select gate lines SG1, SG2 in one memory cell block are always driven from one side (or the other side) of the memory cell array 1 by the word line driver corresponding to the memory cell block, a timing for supplying a driving signal does not deviate with respect to the memory cell and select transistor in one predetermined NAND cell unit in the selected block.

On the other hand, row address decoders RADDi (i=1, 2, . . . ) are arranged only on one (one side) of two ends of the X direction of the memory cell array 1. In this case, since a signal line (address bus) for supplying row address signals to the row address decoders RADDi may be disposed only one side of the memory cell array 1, an area of the address bus can be reduced. As a result, this can contribute to the reduction of the chip area.

That is, if the row address decoders RADDi are disposed in two ends of the X direction of the memory cell array 1 similarly as the word line drivers RMAINi, the address bus has to be disposed in two ends of the X direction of the memory cell array 1. This is disadvantageous for the reduction of the chip area.

The row address decoders RADDi are disposed only one of two ends (one side) of the X direction of the memory cell array 1. As a result, in the present example, a signal line 22 is disposed on the memory cell array 1. The signal line 22 is used to supply output signals (decode results) RDECADS of the row address decoders RADD2, RADD4, . . . for the even-numbered memory cell array blocks to the word line drivers RMAIN2, RMAIN4, . . . .

At a usual operation time, the signals RDECADS are conducted through the signal line 22. Therefore, it is necessary to prevent the potential of the signal line 22 from adversely affecting the operation of the memory cell at the usual operation time. It is to be noted that the row address decoders RADDi and word line drivers RMAINi for preventing the potential of the signal line 22 from adversely influencing the operation of the memory cell will be described later.

The potential generation circuit 9A includes a step-up circuit (charge pump circuit), and generates, for example, a write potential Vpp or transfer potential Vpass for use in the write operation. The potential generation circuit 9A is connected to the switching circuit 9B. The switching circuit 9B has a function of distributing the potentials such as the write potential Vpp, transfer potential Vpass, power potential Vdd in the chip, and ground potential Vss to signal lines CG1, . . . CG16 corresponding to the word lines WL1, . . . WL16.

The signal lines CG1, . . . CG16 are connected to the word line drivers RMAINi. That is, the signal lines CG1, . . . CG16 are connected to the word lines WL1, . . . WL16 via transistors HNt1, HNt2, . . . HNt16 (described later) for potential transfer in the word line drivers RMAINi.

(7) Circuit Example of Row Address Decoder and Word Line Driver

FIG. 13 shows a major part of the row address decoder disposed for the odd-numbered memory cell block.

The row address decoder RADD1 accurately functions as the block decoder. That is, when the first memory cell block is selected, all row address signals AROWi, . . . AROWj turn to "H", and the output signal RDECAD turns to "H".

FIG. 14 shows a major part of the word line driver disposed for the odd-numbered memory cell block.

Major constituting elements of the word line driver RMAIN1 include a high-voltage switching circuit 26 and MOS transistors for transfer HN5, HN6, HNt1, . . . HNt16.

The high-voltage switching circuit 26 includes: a first step-up unit including a MOS capacitor DHN4 and MOS transistor IHN1; and a second step-up unit including a MOS capacitor DHN5 and MOS transistor IHN2.

The gate of a MOS transistor HN3 is connected to a connection node B of the MOS transistors IHN1, IHN2. In this case, since the potential levels of the gate and source of the MOS transistor HN3 maintain a reverse phase, and the potential of each node A, B, TransferG1 gradually rises in synchronization with a clock signal Owc, a step-up efficiency is enhanced.

The high-voltage switching circuit 26 is brought to an operation state, when the output signal RDECAD of the row address decoder RADD1 indicates "H". That is, when the output signal RDECAD indicates "H", the output signal of a NAND circuit NAND1 is a clock signal having a phase opposite to that of the clock signal Owc. The output signal of the NAND circuit NAND1 is applied to one end of the MOS capacitors DHN4, DHN5.

As a result, a step-up potential is applied to the gate of the MOS transistors for transfer HN5, HN6, HNt1, . . . HNt16, and the MOS transistors for transfer HN5, HN6, HNt1, . . . HNt16 are turned on.

When the output signal RDECAD of the row address decoder RADD1 indicates "H", MOS transistors HN7, HN8 are turned off. At this time, signal lines SGD, SGS indicate, for example, the power potential vdd in the chip, and this Vdd is supplied to the select gate lines SG1, SG2 via the MOS transistors for transfer HN5, HN6.

Moreover, the signal lines CG1, CG2 . . . CG16 are set to predetermined potentials by the switching circuit 9B (see FIG. 1) in accordance with the operation mode. Furthermore, the potentials of the signal lines CG1, CG2 . . . CG16 are supplied to the word lines WL1, WL2 . . . WL16 via the MOS transistors for transfer HNt1, . . . HNt16.

Figure 15:
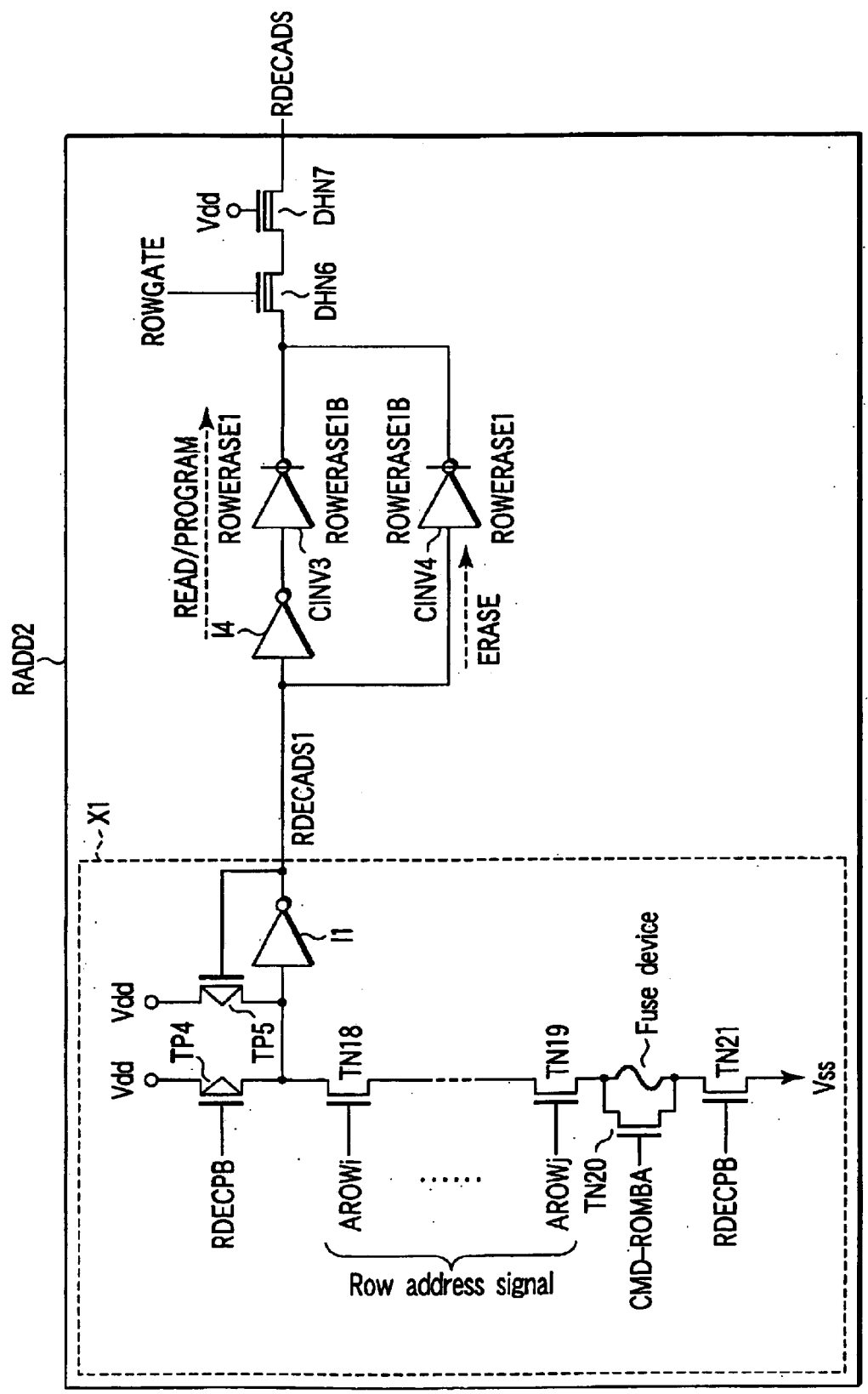
FIG. 15 is diagram showing a circuit example of RADD2 of FIG. 12.

FIG. 15 shows a major part of the row address decoder disposed for the even-numbered memory cell block.

The row address decoder RADD2 includes the same circuit as that of the row address decoder RADD1 of FIG. 13. That is, a circuit surrounded with a broken line X1 is the same as that of the row address decoder RADD1 of FIG. 13. It is to be noted that in FIG. 15, the same part as that of FIG. 13 is denoted with the same reference numerals.

The row address decoder RADD2 includes an inverter 14, clocked inverters CINV3, CINV4, and depression type high-voltage N-channel MOS transistors DHN6, DHN7.

The clocked inverter CINV4 has a function of setting the output signal RDECADS (potential of the signal line 22 of FIG. 12) of the row address decoder for the selected memory cell block to the ground potential Vss, and setting the output signal RDECADS of the row address decoder for the non-selected memory cell block to the power potential Vdd in the chip at an erase time.

The MOS transistor DHN6 has a function of bringing the signal line 22 (see FIG. 12) into the floating state together with a transistor DHN9 of FIG. 16 described later.

At the erase time, in the selected memory cell block, a signal RDECADS1 turns to "H (Vdd)", and in the non-selected memory cell block, the signal RDECADS1 turns to "L (Vss)".

If the signal RDECADS1 is given to the signal line 22 on the memory cell array (see FIG. 12), the signal line 22 on the memory cell array turns to "L (Vss)" (see FIG. 12) in the non-selected memory cell block.

In this case, when an erase potential Vera is supplied to a cell well by the capacity coupling of the cell well and word line, and when the potential of the word line in the non-selected memory cell block is raised, the potential of the word line does not sufficiently rise by the influence of the signal line 22 (FIG. 12) as the ground potential Vss.

In the present example, since the clocked inverter CINV4 is disposed, the output signal RDECADS turns to "L (Vss)" in the selected memory cell block, and the signal RDECADS turns to "H (Vdd)" in the non-selected memory cell block at the erase time.

Figure 16:
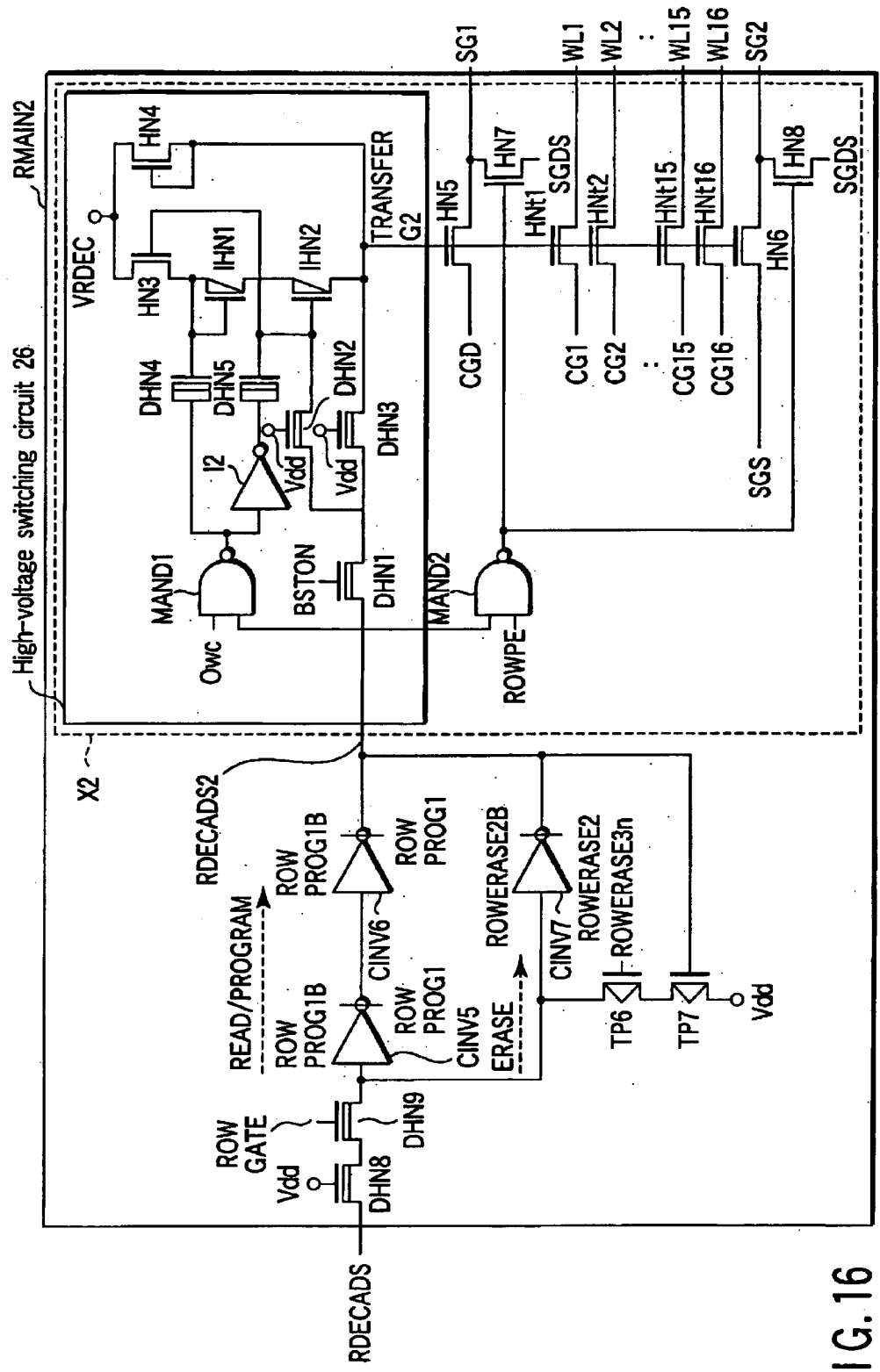
FIG. 16 is a diagram showing a circuit example of RMAIN2 of FIG. 12.

That is, in the non-selected memory cell block, the signal line 22 on the memory cell array (see FIG. 12) turns to "H (Vdd)", and is brought into the floating state by cutting off the MOS transistors DHN6 and DHN9 (FIG. 16).

Therefore, when the potential of the word line in the non-selected memory cell block is raised by the capacity coupling of the cell well and word line, the influence of the signal line 22 (FIG. 12) as the power potential Vdd in the chip is reduced, and the potential of the word line sufficiently rises.

FIG. 16 shows a major part of the word line driver disposed for the even-numbered memory cell block.

Among the major constituting elements of the word line driver RMAIN2, the high-voltage switching circuit 26 and MOS transistors for transfer HN5, HN6, HNt1, . . . HNt16 are the same as those of the word line driver RMAIN1 shown in FIG. 14. That is, a circuit surrounded with a broken line X2 is the same as that of the row address decoder RADD1 of FIG. 14. It is to be noted that in FIG. 16, the same part as that of FIG. 14 is denoted with the same reference numerals.

The word line driver RMAIN2 includes clocked inverters CINV5, CINV6, CINV7, depression type high-voltage N-channel MOS transistors DHN8, DHN9, and enhancement type P-channel MOS transistors TP6, TP7.

The clocked inverter CINV7 has a function of returning the output signal RDECADS (potential of the signal line 22 of FIG. 12) of the row address decoder for the selected memory cell block back to the power potential Vdd in the chip from the ground potential Vss, returning the output signal RDECADS of the row address decoder for the non-selected memory cell block back to the ground potential Vss from the power potential Vdd in the chip, and supplying a signal RDECADS2 to the circuit in the broken line X2 at the erase time.

The MOS transistor DHN9 has a function of bringing the signal line 22 (see FIG. 12) into the floating state together with the transistor DHN6 of FIG. 15.

As described above, the inverter I4, clocked inverters CINV3, CINV4, and depression type high-voltage N-channel MOS transistors DHN6, DHN 7 in the row address decoder RADD2 of FIG. 15, and the clocked inverters CINV 5, CINV6, CINV7, depression type high-voltage N-channel MOS transistors DHN8, DHN9, and enhancement P-channel MOS transistors TP6, TP7 in the word line driver RMAIN2 of FIG. 16 are used in pairs to achieve the same object.

It is to be noted that in FIGS. 13 to 16, Vdd (power potential in the chip lower than an external power potential Vcc) is supplied as the power potential to these circuits. However, for example, the external power potential Vcc may be supplied instead of this.

(8) Regarding Potential Level of Signal Line 22

The potential level of the signal line 22 (see FIG. 12) in each operation mode will next be described. It is to be noted that only the potential level of the signal line 22 will be described here.

In the present example, the signal line 22 (FIG. 12) is connected to the row address decoder (FIG. 15) and word line driver (FIG. 16) corresponding to the even-numbered memory cell block. Therefore, the potential level of the word line driver selection signal RDECADS conducted through the signal line 22 (FIG. 12) will be described with reference to FIGS. 15 and 16.

The potential level of the output signal RDECADS of the row address decoder RADD2 differs with the operation mode.

In the operations (write, read, verify read) other than the erase operation, ROWERASE1B, ROWPROG1, ROWERASE2B, ROWERASE3n, ROWGATE are set to the power potential Vdd (the power potential in the chip lower than the external power potential Vcc. Additionally, the potential may also be the external power potential Vcc), and ROWERASE1, ROWPROG1B, ROWERASE2 are set to the ground potential Vss.

At this time, the clocked inverters CINV3, CINV5, CINV6 are brought into an operation state, and the clocked inverters CINV4, CINV7 are brought into an inoperative state. Moreover, the MOS transistor TP6 is turned off.

In the selected memory cell block, the output signal RDECADS1 of a portion surrounded with a broken line X1 indicates "H", that is, the power potential Vdd in the chip, and the output signal RDECADS of the row address decoder RADD2 also indicates "H", that is, the power potential Vdd in the chip.

On the other hand, in the non-selected memory cell block, the output signal RDECADS1 of a portion surrounded with a broken line X1 indicates "L", that is, the ground potential Vss, and the output signal RDECADS of the row address decoder RADD2 also indicates "L", that is, the ground potential Vss.

Therefore, in the operations other than the erase operation, the signal line 22 (see FIG. 12) disposed on the memory cell array in the non-selected memory cell block has the ground potential Vss, the select gate lines SG1, SG2 in the non-selected memory cell block also have the ground potential Vss, and these signal lines 22, SG1, SG2 function as shield lines between the bit and word lines. As a result, a coupling noise generated in the data conducted through the bit line can be reduced.

In the erase operation, ROWERASELB, ROWPROG1, ROWERASE2B, ROWERASE3n, ROWGATE are set to the ground potential Vss, and ROWERASE1, ROWPROG1B, ROWERASE2 are set to the in-chip power potential Vdd (may also be the power potential Vcc).

At this time, the clocked inverters CINV4, CINV7 are brought into the operation state, and the clocked inverters CINV3, CINV5, CINV6 are brought into the inoperative state. Moreover, the MOS transistor TP6 is turned on.

In the selected memory cell block, the output signal RDECADS1 of the portion surrounded with the broken line X1 indicates "H", that is, the in-chip power potential Vdd, and the output signal RDECADS of the row address decoder RADD2 indicates "L", that is, the ground potential Vss.

On the other hand, in the non-selected memory cell block, the output signal RDECADS1 of the portion surrounded with the broken line X1 indicates "L", that is, the ground potential Vss, and the output signal RDECADS of the row address decoder RADD2 indicates "H", that is, the in-chip power potential Vdd.

Moreover, ROWGATE indicates the ground potential Vss. Therefore, the signal line 22 in the non-selected memory cell block (see FIG. 12) is brought into the floating state by cutting off the MOS transistors DHN6, DHN9, when the potential of the line (potential of RDECADS) is in a range of 1 to 1.5 V.

As described above, in the erase operation, the signal line 22 disposed on the memory cell array in the non-selected memory cell block (see FIG. 12) is in a range of 1 to 1.5 V, and in the floating state. That is, when the erase potential Vera is supplied to the cell well, the potential of the signal line 22 (FIG. 12) also rises by the capacity coupling similarly as the word line. Therefore, the signal line 22 (FIG. 12) is prevented from suppressing the rise of the potential of the word line.

Therefore, with the supply of the erase potential Vera to the cell well, an effect can be obtained that the potential of the word line in the non-selected memory cell block easily rises by the capacity coupling between the cell well and word line.

Moreover, accordingly, since a large electric field is not applied to the tunnel oxide film of the memory cell in the non-selected memory cell block, an error erase in the non-selected memory cell block can be prevented.

Additionally, the fuse device (similarly as the fuse device of FIG. 13) in the broken line X of FIG. 15 is not disconnected, when the memory cell block corresponding to the fuse device (row address decoder) is used as a usual memory region for a user.

However, when the memory cell block corresponding to the fuse device (row address decoder) is used, for example, as a ROM•BLOCK region for storing a device code, the fuse device is disconnected to prevent the write/erase from being freely performed with respect to the ROM•BLOCK region.

This ROM•BLOCK region has the following significance.

In recent years, the NAND type flash memory has been used in memories of various electronic apparatuses. However, the NAND type flash memory such as a memory for storing music information by phone communication is sometimes used as a memory of data concerning a copyright.

Therefore, a chip number, that is, the device code is stored in the NAND type flash memory in order to prevent an illegal copy.

This device code is peculiar to each NAND type flash memory. However, if the user can freely rewrite the device code, an original purpose of the device code cannot be achieved.

Therefore, the device code is written in the ROM•BLOCK region of the NAND type flash memory before shipment of a product, so that the user cannot perform the write/erase with respect to the ROM•BLOCK region. That is, the fuse device is disconnected in the memory cell block as the ROM•BLOCK region.

Thereby, for example, when the music information is copied into the NAND type flash memory on an information reception side from the NAND type flash memory on an information providing side, the device code is read from the NAND type flash memory on the information providing side. When this code is different from that of the NAND type flash memory on the information reception side, the copy cannot be performed.

The fuse device is disconnected immediately after the device code is programmed in the memory cell block as the ROM•BLOCK region.

If the fuse device is subjected to a pre-shipment test in a non-disconnected state, the device code is erased in the test.

That is, in the pre-shipment test, all the blocks are simultaneously selected and written/erased so as to reduce a test time. That is, all the row address signals AROWi, . . . AROWj indicate "H". Therefore, when the fuse device is not disconnected, and even when CMDROMBA indicates "L", RDECADS1 indicates "H" (RDECADS indicates "H" in FIG. 13), and the memory cell block as the ROM•BLOCK region is selected.

On the other hand, even when all the row address signals AROWi, . . . AROWj indicate "H" in the pre-shipment test, and when the fuse device is disconnected, CMD ROMBA indicates "L". Therefore, RDECADS1 turns to "L" (RDECADS indicates "L" in FIG. 13), and the memory cell block as the ROM•BLOCK region is not selected.

Even when the fuse device is disconnected, it is necessary to read out the device code stored in the ROM•BLOCK region.

The data can be read from the ROM•BLOCK region, when CMD ROMBA is set to "H". That is, when CMD ROMBA turns to "H", and AROWi, . . . AROWj in the ROM•BLOCK region turn to "H", the memory cell block as the ROM•BLOCK region is selected.

Moreover, even after the fuse device is disconnected, a special command is inputted to set CMD ROMBA and AROWi, . . . AROWj in the ROM•BLOCK region to "H", and it is then possible to rewrite the data in the ROM•BLOCK region. In this case, a command for setting CMD ROMBA to "H" is not open to general users, and the data in the ROM•BLOCK region is prevented from being illegally rewritten.

It is to be noted that the disconnection of the fuse of the ROM•BLOCK region has been described in the present example. The fuse of FIG. 13 and the fuse in the broken line X of FIG. 15 are disconnected, when the memory cell block is a defective block. In this case, the defective block is replaced with a spare block by the redundancy circuit.

3. Description of Basic Operation

An operation of a major part, especially the data circuit (FIG. 10) of the four-level NAND cell type flash memory (FIG. 1) in the respective operation modes such as the read and program modes will be described hereinafter in detail.

Prior to the description of the operation, one example of a threshold voltage and programming/read method of the memory cell will first briefly be described.

(1) Threshold Voltage and Programming/Read Method of Memory Cell

Figure 17:
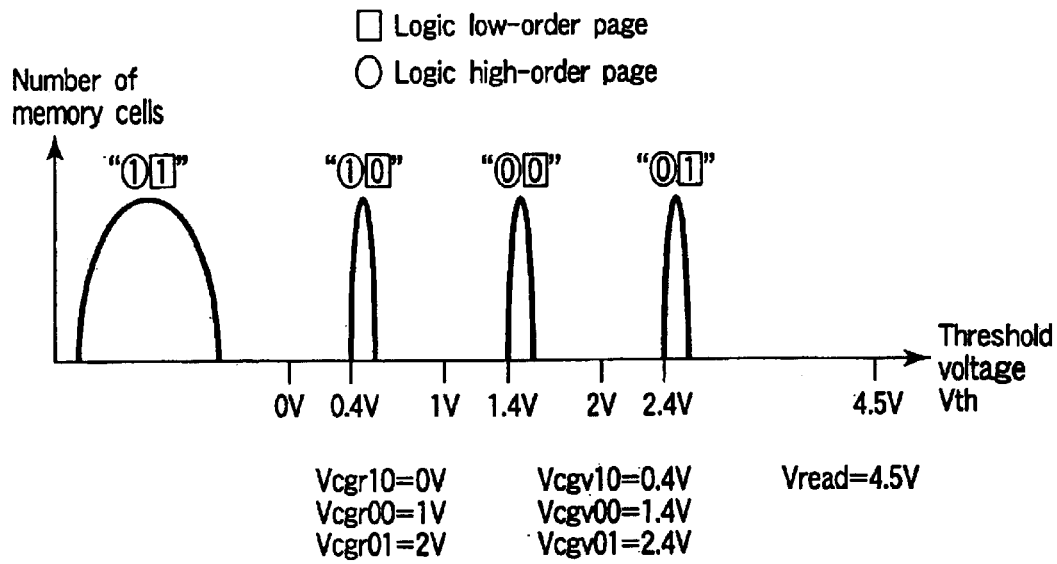
FIG. 17 is a diagram showing a relation between data and threshold voltage distribution of a memory cell.

FIG. 17 shows a distribution of the threshold voltage (Vth) of the memory cell of the four-level NAND cell type flash memory.

In one memory cell, two bit data (four-level data) is stored. In the present example, as described above, the two bit data are "11", "10", "00", "01". One bit of the two bit data is stored as logic low-order page data (shown by □) and the other bit is stored as logic high-order page data (shown by ○) in the same memory cell.

The two bit data ("11", "10", "00", "01") and the threshold voltage of the memory cell have a relation shown in FIG. 17.

"11" indicates an erase state. In the erase state, the values of the logic low-order and high-order page data are both "1". The memory cell in the erase state has a negative threshold voltage Vth.

"10", "00", "01" indicate a write state. The memory cell in the write state has a positive threshold voltage Vth. Moreover, in the write state, state "10" state has a lowest threshold voltage "01" state has a highest threshold voltage, and "00" state has a threshold voltage between those of the "10" and "01" states.

As described above, the two bit data includes the logic low-order and high-order page data, and is written in the memory cell by two write operations.

First, the programming of the logic low-order page data is performed.

Figure 18:
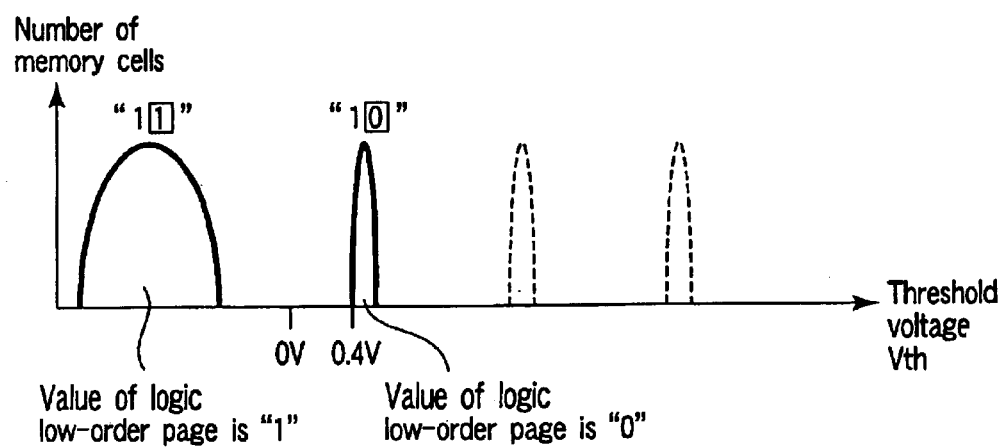
FIG. 18 is a diagram showing a state of a change of the threshold voltage at a program time of logic low-order page data.

It is first assumed that all the memory cells are in the erase state, that is, the "11" state. Thereafter, as shown in FIG. 18, when the logic low-order page data is programmed, the distribution of the threshold voltage vth of the memory cell is divided into two in accordance with the value ("1", "0") of the write data (logic low-order page data).

That is, when the logic low-order page data is "1", the bit line is set to "H" (word line has a write potential), thereby a high electric field is prevented from being applied to the tunnel oxide film of the memory cell, and the threshold voltage Vth of the memory cell is prevented from rising. As a result, the memory cell maintains the erase state ("11" state) (programming of the logic low-order page data "11").

On the other hand, when the logic low-order page data is "0", the bit line is set to "L" (word line has the write potential), thereby the high electric field is applied to the tunnel oxide film of the memory cell, an electron is injected into the floating gate electrode, and the threshold voltage Vth of the memory cell is raised by a predetermined amount. As a result, the memory cell changes to the write state ("10" state) (programming of the logic low-order page data "0").

Thereafter, the logic high-order page data is programmed.

The logic high-order page data is programmed based on the write data inputted from the outside of the chip (i.e., the logic high-order page data) and the logic low-order page data already programmed in the memory cell.

It is to be noted that the logic low-order page data is read into the data circuit from the memory cell and held before the programming of the logic high-order page data (internal data load).

Figure 19:
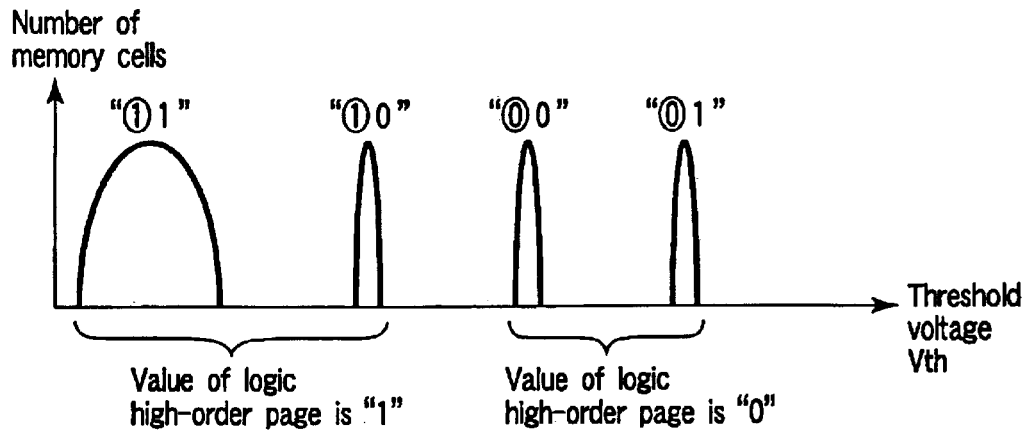
FIG. 19 is a diagram showing a state of a change of the threshold voltage at a program time of logic high-order page data.

As shown in FIG. 19, when the logic high-order page data is "1", the bit line is set to "H" (word line has the write potential), thereby the high electric field is prevented from being applied to the tunnel oxide film of the memory cell, and the threshold voltage Vth of the memory cell is prevented from rising. As a result, the memory cell in the "11" state (erase state) in which the logic low-order page data is "1" maintains the "11" state as such (programming of the logic high-order page data "1"). Moreover, the memory cell in the "10" state in which the logic low-order page data is "0" maintains the "10" state as such (programming of the logic high-order page data "1").

On the other hand, as shown in FIG. 19, when the logic high-order page data is "0", the bit line is set to "L", thereby the high electric field is applied to the tunnel oxide film of the memory cell, the electron is injected to the floating gate electrode, and the threshold voltage Vth of the memory cell is raised by the predetermined amount. As a result, the memory cell in the "11" state (erase state) in which the logic low-order page data is "1" changes to the "01" state (programming of the logic high-order page data "0"). Moreover, the memory cell in the "10" state in which the logic low-order page data is "0" changes to the "00" state (programming of the logic high-order page data "0").

That is, in the present example, when the logic low-order page data is "1", and the logic high-order page data is "1", the data "11" is written in the memory cell. When the logic low-order page data is "10", and the logic high-order page data is "1", the data "10" is written in the memory cell. Moreover, when the logic low-order page data is "1", and the logic high-order page data is "00", the data "01" is written in the memory cell. When the logic low-order page data is "0", and the logic high-order page data is "0", the data "00" is written in the memory cell.

The distribution of the threshold voltage Vth of the memory cell is divided into four ("11", "10", "00", "01") by two programming operations.

In the present example, when the logic high-order page data is "0", the memory cell in the "11" state changes to the "01" state, and the memory cell in the "10" state changes to the "00" state (see FIG. 19).

Here, as apparent from FIG. 19, a fluctuation amount of the threshold voltage in a case in which the "11" state is changed to the "01" state is larger than the fluctuation amount of the threshold voltage in a case in which the "10"

state is changed to the "00" state. That is, a write pulse is supplied to the memory cells which perform the "00"-programming and "01"-programming, respectively, on the same condition. Therefore, the "00"-programming ends earlier than the "01"-programming.

In this case, "00"-verify read after the "00"-programming is omitted. Thereafter, only a "01" verify read can be performed so as to reduce a program time.

It is to be noted that in FIG. 17 Vcgv10 is a read potential for use in "10"-verify read, and indicates, for example, 0.4 V. Vcgv00 is a read potential (e.g., 1.4 V) for use in "00"-verify read, and Vcgv01 is a read potential (e.g., 2.4 V) for use in "01"-verify read. Vread is a transfer potential supplied to the non-selected word line.

When the threshold voltage of the memory cell is less than Vcgr10, the data of the memory cell is "11", and the threshold voltage of the memory cell exceeds Vcgr10. When the voltage is below Vcgr00, the data of the memory cell is "10". When the threshold voltage of the memory cell exceeds Vcgr00, and is below Vcgr01, the data of the memory cell is "00". When the threshold voltage of the memory cell exceeds Vcgr01, the data of the memory cell is "01".

The usual reading of the logic low-order page data can be realized by two read operations ("READ01", "READ10"). READ01 denotes the read operation using Vcgr01 (e.g., 2 V) as a read potential, and READ10 denotes the read operation using Vcgr10 (e.g., 0 V) as the read potential. Moreover, the reading of the logic high-order page data can be realized by one read operation (READ "00"). READ00 indicates the read operation using Vcgr00 (e.g., 1 V) as the read potential.

Two bit data can be read by three read operations in total in this manner in the present example, so that a read time is reduced or a high-speed read operation can be achieved.

(2) Read Operation

First, a read operation will be described.

1). Algorithm

Figure 20:
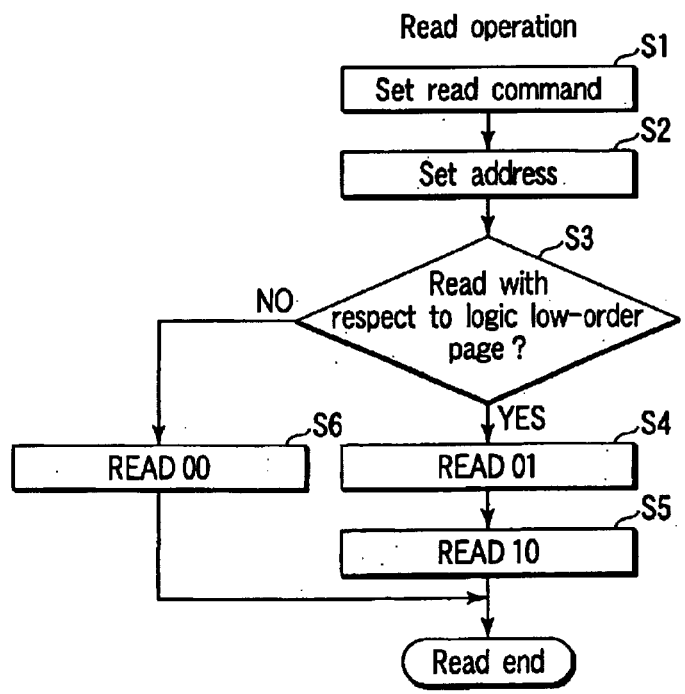
FIG. 20 is a diagram showing an algorithm example of a read operation.

FIG. 20 shows an algorithm of the read operation.

First, a command interface circuit confirms a read command provided from a host microcomputer, and the received read command is set in a state machine (control circuit) (step S1).

Moreover, when an address signal is supplied into a memory chip from the host microcomputer, an address for selecting a read page is set in the state machine in response to the address signal (step S2).

When the read command and address signal are set in the state machine, an operation of steps S3 to S6 is automatically executed under control of the state machine.

When the logic low-order page data is read, two read operations ("READ01", "READ10") are executed as described above (steps S3 to S5). As described later in detail, read data read by READ01 (Vcgr01=2 V) is stored in the data storage unit DS3 via the data storage unit DS1. In READ10 (Vcgr10=0 V), data dependent on the read data and the data of the data storage unit DS3 is transferred to the data storage unit DS4 from the data storage unit DS1.

When the logic high-order page data is read, one read operation (READ "00") is executed (steps S3, S6). As described later in detail, the read data read by READ00 (Vcgr00=1V) is transferred to the data storage unit DS4 via the data storage unit DS1.

The read data stored in the data storage unit DS4 is outputted to the outside of the memory chip via the I/O lines IO, nIO, sense amplifier, and data input/output buffer.

2). Operation Description by Operation Waveform

An operation will concretely be described hereinafter with reference to an operation timing chart of FIG. 21.

The read operation includes read operations of the logic low-order and high-order page data.

Figure 21:
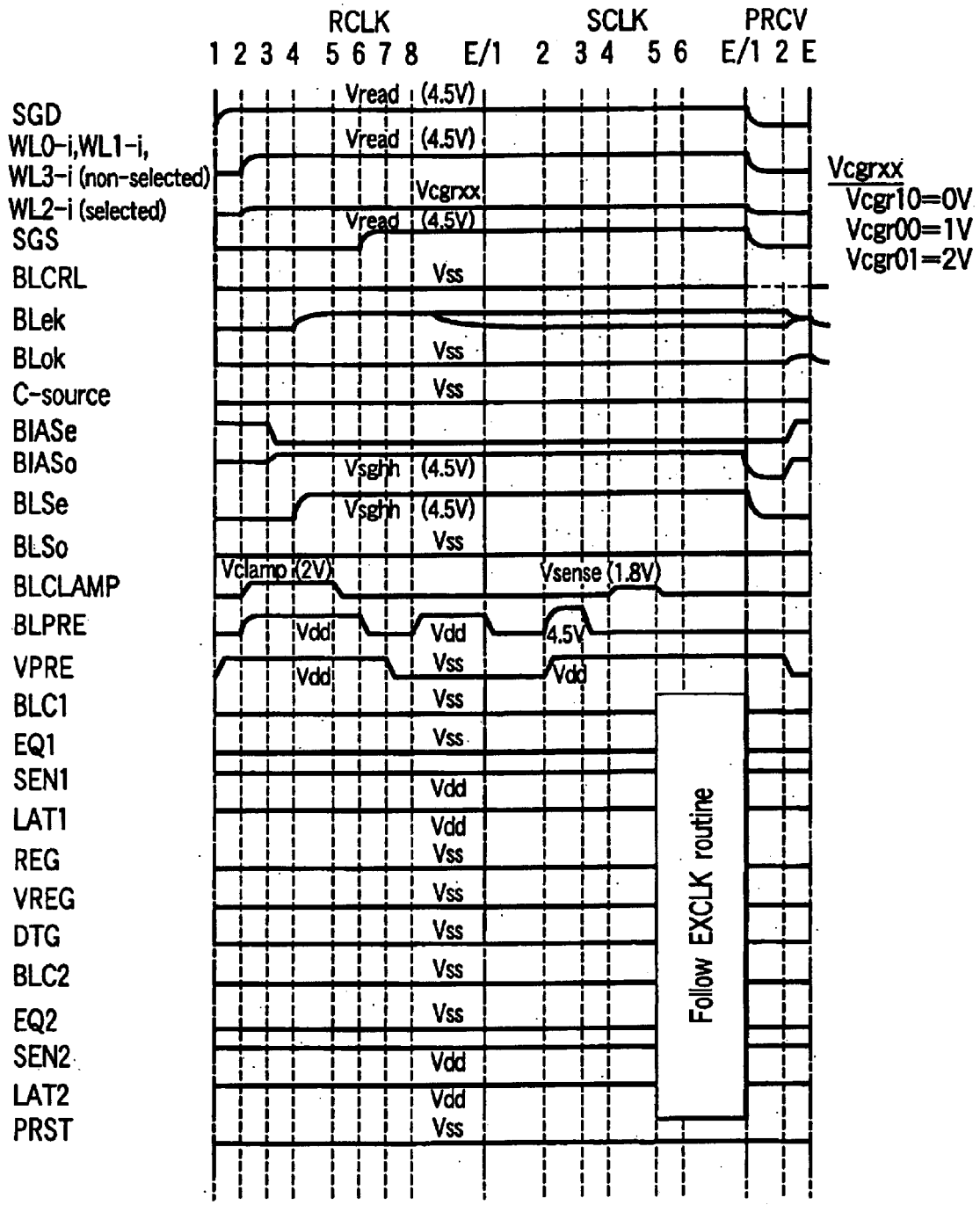
FIG. 21 is a diagram showing an operation waveform example of the read operation.

It is to be noted that as not particularly shown in the operation timing chart of FIG. 21, the "L" level denotes Vss (e.g., 0 V), and the "H" level denotes Vdd (e.g., 3 V). Moreover, in the operation timing chart, one block BLOCK1 is selected, and a word line WL2-$i$ and odd-numbered bit line BLek in the block BLOCKi are selected (see FIG. 3).

[1] Read Operation of Logic Low-order Page Data

The read operation of the logic low-order page data includes two read operations, that is, "READ01" and "READ10". First, "READ01" is performed and "READ10" is then performed.

Each of "READ01" and "READ10" is constituted of a part (RCLK 1-E, SCLK 1-E, RRCV 1-E) concerning data read common to these two read operations, and a part (EXCLK routine) concerning data transfer peculiar to each read operation.

[1]-1 "READ01"

A "READ01" operation comprises: setting a read potential (potential of the selected word line WL2-$i$) to Vcgr01 (e.g., 2 V); and checking whether the data of the memory cell is "01", or other data "11", "10", "00".

[1]-1-1 Data Read

First, a transfer potential Vread (e.g., 4.5 V) is applied to a select gate line SGD on a bit line side and non-selected word lines WL0-$i$, WL1-$i$, WL3-$i$, and a read potential Vcgr01 is applied to the selected word line WL2-$i$ (RCLK 1-2).

A control signal BLPRE turns to "H", and the N-channel MOS transistor Qn6 (FIG. 10) is turned on. Moreover, when the control signal BLCLAMP indicates Vclamp (e.g., 2 V), and the control signal BLSe indicates Vsghh (e.g., 4.5 V), the odd-numbered bit line BLek is precharged at a predetermined potential (e.g., about 1 V). On the other hand, since a control signal BIASo indicates Vsghh (e.g., 4.5 V), the even-numbered bit line BLok is fixed at Vss (e.g., 0 V), and functions as a shield bit line (RCLK 2-4).

Thereafter, the control signal BLCLAMP indicates Vss (e.g., 0 V), the control signal BLPRE indicates "L", and the odd-numbered bit line BLek is brought into the floating state (RCLK 5-7).

When the potential of the select gate line SGS on a source line side is set to the transfer potential Vread, the potential of the bit line BLek is influenced by the state of the selected memory cell, that is, the value of the data stored in the memory cell.

That is, when the data of the selected memory cell is "11", "10", "00", the selected memory cell is turned on by the read potential Vcgr01. Therefore, the charge of the bit line BLek is discharged, and the potential of the bit line BLek drops to 0.8 V or less (the non-selected memory cell in the selected block is turned on by Vread).

On the other hand, when the data of the selected memory cell is "01", the selected memory cell is not turned on by the read potential Vcgr01. Therefore, the charge of the bit line BLek is not discharged, and the bit line BLek maintains a precharge potential (about 1 V) (RCLK 6-E).

When the control signal BLPRE indicates about 4.5 V, and the control signal VPRE indicates Vdd (e.g., 3 V), one end of the capacitor C1 of the data storage unit DS1, that is, the node N2 is charged at Vdd. Thereafter, when the control signal BLCLAMP indicates Vsense (e.g., 1.8 V), the potential of one end of the capacitor C1 of the data storage unit DS1 changes as follows.

That is, when the potential of the bit line BLek remains at the precharge potential (about 1 V) (when the data of the memory cell is "01"), the N-channel MOS transistor (clamp transistor) Qn5 (FIG. 10) is turned off, and the potential of one end of the capacitor C1 of the data storage unit DS1 is maintained at Vdd ("H")

On the other hand, when the potential of the bit line BLek is 0.8 V or less (when the data of the memory cell is "11", "10", "00"), the N-channel MOS transistor (clamp transistor) Qn5 (FIG. 10) is turned on, the charge of one end of the capacitor C1 of the data storage unit DS1 is discharged to the bit line BLek, and the potential drops to the value ("L") lower than Vdd (SCLK 4-5).

As a result, the read data by the read potential Vcgr01 is stored in the data storage unit DS1 (one end of the capacitor C1). That is, when the data of the memory cell is "11", "10", "00", "L", that is, "01"-data is stored. When the data of the memory cell is "01", "H", that is, "1"-data is stored.

[1]-1-2 Data Transfer

Figure 22:
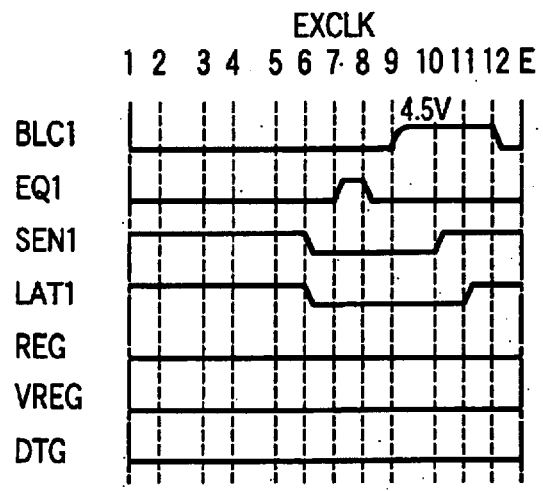
FIG. 22 is a diagram showing the operation waveform example of an EXCLK routine during the operation of FIG. 21.

After the data of the memory cell is read out in the data storage unit DS1 in the "READ01" operation, data transfer is executed to transfer the read data stored in the data storage unit DS1 to the data storage unit DS3. The operation follows an EXCLK routine shown in FIG. 22.

First, when both control signals SEN1, LAT1 turn to "L" (EXCLK 6), and a control signal EQ1 turns to "H" (EXCLK 7-8), the state of a flip-flop circuit (FIG. 10) constituting the data storage unit DS3 is reset.

Thereafter, the control signal BLC1 indicates 4.5 V (EXCLK 9), and the N-channel MOS transistor Qn10 turns on. As a result, the data storage units DS1 and DS3 are electrically connected to each other (FIG. 10).

When the clock signal SEN1 turns to "H" (EXCLK 10), the read data stored in the data storage unit DS1 (one end of the capacitor C1) is sensed by the clock synchronous inverter CI1 constituting the data storage unit DS3 via the MOS transistor Qn10. Moreover, when the control signal LAT1 turns to "H" (EXCLK 11), the read data is stored in the data storage unit DS3 (FIG. 10).

It is to be noted that the "READ01" operation is simultaneously performed with respect to 4256 memory cells connected to the selected word line WL2-i.

[1]-2 "READ10"

A "READ10" operation comprises: setting the read potential (potential of the selected word line WL2-i) to Vcgr01 (e.g., 0 V); and checking whether the data of the memory cell is "11", or other data "10", "00", "01".

[1]-2-1 Data Read

First, the transfer potential Vread (e.g., 4.5 V) is applied to the select gate line SGD on the bit line side and non-selected word lines WL0-i, WL1-i, WL3-i, and the read potential Vcgr10 is applied to the selected word line WL2-i (RCLK 1-2).

The control signal BLPRE turns to "H", and the N-channel MOS transistor Qn6 (FIG. 10) is turned on. Moreover, when the control signal BLCLAMP indicates Vclamp (e.g., 2 V), and the control signal BLSe indicates Vsghh (e.g., 4.5 V), the odd-numbered bit line BLek is precharged at the predetermined potential (e.g., about 1 V). On the other hand, since the control signal BIASo indicates Vsghh (e.g., 4.5 V), the even-numbered bit line BLok is fixed at Vss (e.g., 0 V), and functions as the shield bit line (RCLK 2-4).

Thereafter, the control signal BLCLAMP indicates Vss (e.g., 0 V), the control signal BLPRE indicates "L", and the odd-numbered bit line BLek is brought into the floating state (RCLK 5-7).

When the potential of the select gate line SGS on the source line side is set to the transfer potential Vread, the potential of the bit line BLek is influenced by the state of the selected memory cell, that is, the value of the data stored in the memory cell.

That is, when the data of the selected memory cell is "11", the selected memory cell is turned on by the read potential Vcgr10. Therefore, the charge of the bit line BLek is discharged, and the potential of the bit line BLek drops to 0.8 V or less (the non-selected memory cell in the selected block is turned on by Vread).

On the other hand, when the data of the selected memory cell is "10", "00", "01", the selected memory cell is not turned on by the read potential Vcgr10. Therefore, the charge of the bit line BLek is not discharged, and the bit line BLek maintains a precharge potential (about 1 V) (RCLK 6-E).

When the control signal BLPRE indicates about 4.5 V, and the control signal VPRE indicates Vdd (e.g., 3 V), one end of the capacitor C1 of the data storage unit DS1, that is, the node N2 is charged at Vdd. Thereafter, when the control signal BLCLAMP indicates Vsense (e.g., 1.8 V), the potential of one end of the capacitor C1 of the data storage unit DS1 changes as follows.

That is, when the potential of the bit line BLek remains at the precharge potential (about 1 V) (when the data of the memory cell is "10", "00", "01"), the N-channel MOS transistor (clamp transistor) Qn5 (FIG. 10) is turned off, and the potential of one end of the capacitor C1 of the data storage unit DS1 is maintained at Vdd ("H").

On the other hand, when the potential of the bit line BLek is 0.8 V or less (when the data of the memory cell is "11"), the N-channel MOS transistor (clamp transistor) Qn5 (FIG. 10) is turned on, the charge of one end of the capacitor C1 of the data storage unit DS1 is discharged to the bit line BLek, and the potential drops to the value ("L") lower than Vdd (SCLK 4-5).

As a result, the read data by the read potential Vcgr10 is stored in the data storage unit DS1 (one end of the capacitor C1). That is, when the data of the memory cell is "11", "L", that is, "0"-data is stored. When the data of the memory cell are "10", "00", "01", "H", that is, "1"-data is stored.

[1]-2-2 Data Transfer

Figure 23:
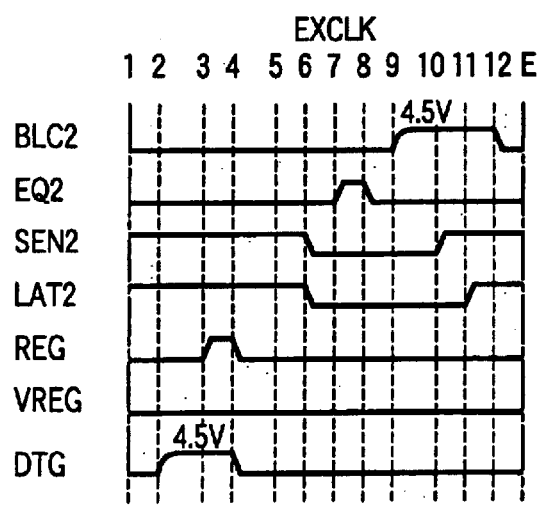
FIG. 23 is a diagram showing the operation waveform example of the EXCLK routine during the operation of FIG. 21.

After the data of the memory cell is read out in the data storage unit DS1 in the "READ10" operation, an operation of maintaining or forcibly changing the data of the data storage unit DS1 based on the data of the data storage unit DS3, that is, the value of the read data read out of the memory cell by "READ01" is performed. Subsequently, the data transfer is executed to transfer the read data stored in the data storage unit DS1 to the data storage unit DS4. The operation follows the EXCLK routine shown in FIG. 23.

First, the control signal DTG indicates 4.5 V, and the N-channel MOS transistor Qn9 (FIG. 10) turns on. As a result, the data storage units DS2 and DS3 are electrically connected to each other, and the data of the data storage unit DS3 is transferred to the data storage unit DS2, that is, the gate of the N-channel MOS transistor Qn8 (EXCLK 2-4).

Thereafter, when the control signal REG turns to "H", the read data stored in the data storage unit DS1, that is, the read data read from the memory cell by "READ10" is maintained or forcibly changed in accordance with the value of the data stored in the data storage unit DS3 (EXCLK 3-4).

For example, when the data stored in the data storage unit DS3 is "0", the potential level of the gate of the N-channel MOS transistor Qn8 turns to "L", and the N-channel MOS transistor Qn8 is therefore turned off (FIG. 10). Therefore, the data storage unit DS1 maintains the value of the read data read from the memory cell by "READ10" as such.

Moreover, when the data stored in the data storage unit DS3 is "1", the potential level of the gate of the N-channel MOS transistor Qn8 turns to "H", and the N-channel MOS transistor Qn8 is therefore turned on (FIG. 10). Therefore, the data of the data storage unit DS1 is forcibly set to "0" regardless of the value of the red data read from the memory cell by "READ10".

Thereafter, when both control signals SEN2, LAT2 turn to "L" (EXCLK 6), and a control signal EQ2 turns to "H" (EXCLK 7-8), the state of a flip-flop circuit (FIG. 10) constituting the data storage unit DS4 is reset.

Thereafter, the control signal BLC2 indicates 4.5 V (EXCLK 9), and the N-channel MOS transistor Qn12 turns on. As a result, the data storage units DS1 and DS4 are electrically connected to each other (FIG. 10).

When the clock signal SEN2 turns to "H" (EXCLK 10), the read data stored in the data storage unit DS1 (one end of the capacitor C1) is sensed by the clock synchronous inverter CI4 constituting the data storage unit DS4 via the MOS transistor Qn12. Moreover, when the control signal LAT2 turns to "H" (EXCLK 11), the read data is stored in the data storage unit DS4 (FIG. 10).

It is to be noted that the "READ10" operation is simultaneously performed with respect to 4256 memory cells connected to the selected word line WL2-*i*.

[1]-3 Conclusion

Figure 25:
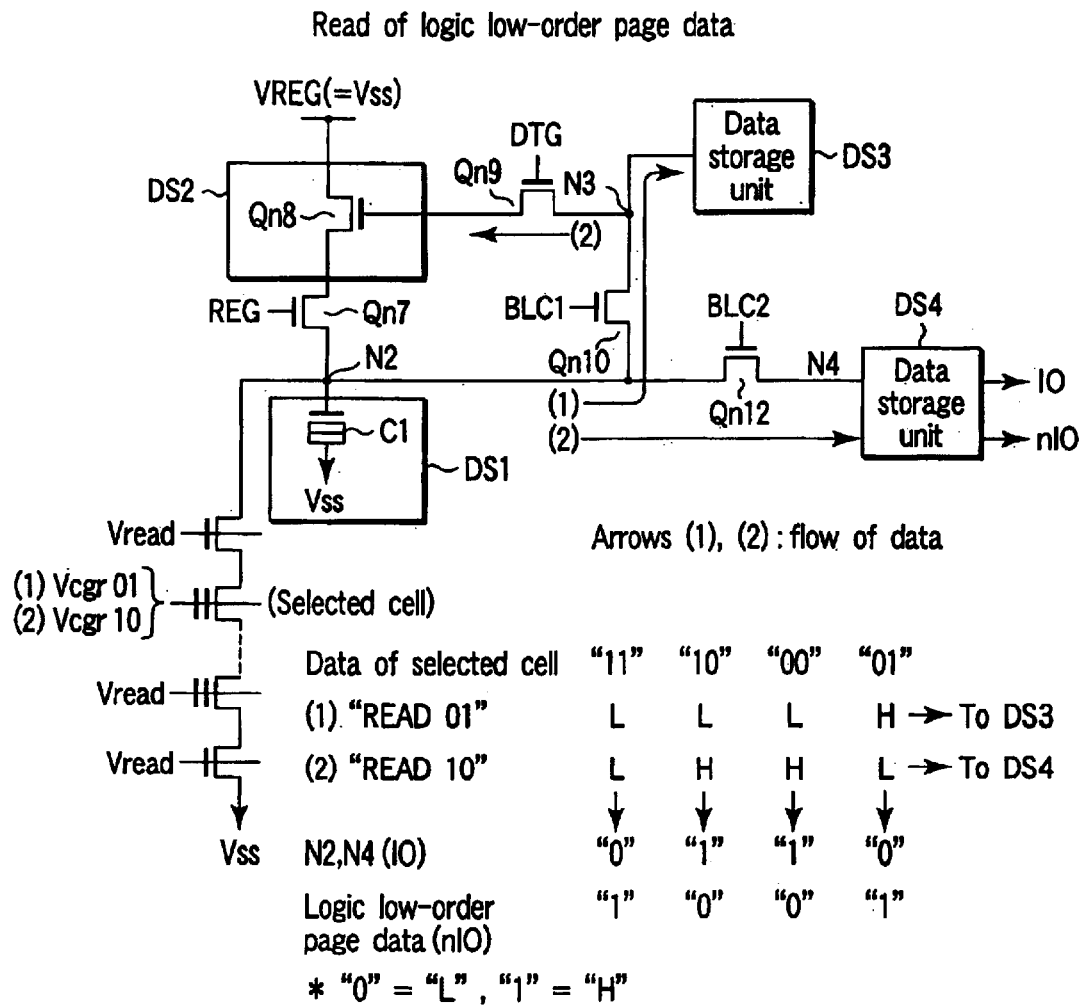
FIG. 25 is a diagram showing a flow of data at a read time of the logic low-order page data.

FIG. 25 briefly shows a flow of data in the read operation of the logic low-order page data.

In "READ01", Vcgr01 (e.g., 2 V) is used as the read potential to execute the read operation, and the read data at this time is stored in the data storage unit DS1. That is, when the data of the selected memory cell is "11", "10", "00", the potential of one end (node N2) of the capacitor C1 turns to "L". When the data of the selected memory cell is "01", the potential of one end (node N2) of the capacitor C1 turns to "H" (Allow (1)).

Thereafter, the data of the data storage unit DS1 is transferred to the data storage unit DS3, and stored (Allow (1)).

When "READ01" ends, and the data of the data storage unit DS3 is "H", the data of the memory cell is "01". That is, it is found that the logic low-order page data is "1". However, when the data of the data storage unit DS3 is "L", the data of the memory cell is any one of "11", "10", "00", and the value of the logic low-order page data cannot be specified.

To solve the problem, following "READ01", the "READ10" is performed.

In "READ10", Vcgr10 (e.g., 0 V) is used as the read potential to execute the read operation, and the read data at this time is stored in the data storage unit DS1. That is, when the data of the selected memory cell is "11", the potential of one end (node N2) of the capacitor C1 turns to "L". When the data of the selected memory cell are "10", "00", "01", the potential of one end (node N2) of the capacitor C1 turns to "H".

Additionally, when the data of the data storage unit DS3 is "H", that is, when the data of the memory cell is "01", the N-channel MOS transistor Qn8 is turned on, and the potential of one end (node N2) of the capacitor C1 is forcibly changed to "L" (Allow (2)).

As a result, when the data of the selected memory cell are "11", "01", the data of the data storage unit DS1 turns to "L", and therefore "1" is confirmed as the logic low-order page data of the selected memory cell. Moreover, when the data of the selected memory cell are "10", "00", the data of the data storage unit DS1 turns to "H", and therefore "0" is confirmed as the logic low-order page data of the selected memory cell (Allow (2)).

It is to be noted that at this time a relation of "L"="0" and "H"="1" is reversed. That is, a relation of "L"="1" and "H"="0" is obtained.

Thereafter, the data of the data storage unit DS1 is transferred to the data storage unit DS4, and stored. When a column select signal CSLk (FIG. 10) turns to "H", the data of the data storage unit DS4 is outputted to the I/O lines (IO, nIO), and outputted to the outside of the memory chip via the data input/output buffer.

[2] Read Operation of Logic High-order Page Data

The read operation of the logic high-order page data includes one read operation, that is, "READ00". The "READ00" is constituted of the part (RCLK 1-E, SCLK 1-E, RRCV 1-E) concerning the data read, and the part (EXCLK routine) concerning the data transfer.

[2]-1 "READ00"

A "READ00" operation comprises: setting the read potential (potential of the selected word line WL2-*i*) to Vcgr00 (e.g., 1 V); and checking whether the data of the memory cell is "11", "10" (logic high-order page data is "1"), or "00", "01" (logic high-order page data is "0").

[2]-1-1 Data Read

First, the transfer potential Vread (e.g., 4.5 V) is applied to the select gate line SGD on the bit line side and non-selected word lines WL0-*i*, WL1-*i*, WL3-*i*, and the read potential Vcgr00 is applied to the selected word line WL2-*i* (RCLK 1-2).

The control signal BLPRE turns to "H", and the N-channel MOS transistor Qn6 (FIG. 10) is turned on. Moreover, when the control signal BLCLAMP indicates Vclamp (e.g., 2 V), and the control signal BLSe indicates Vsghh (e.g., 4.5 V), the odd-numbered bit line BLek is precharged at the predetermined potential (e.g., about 1 V). On the other hand, since the control signal BIASo indicates Vsghh (e.g., 4.5 V), the even-numbered bit line BLok is fixed at Vss (e.g., 0 V), and functions as the shield bit line (RCLK 2-4).

Thereafter, the control signal BLCLAMP indicates Vss (e.g., 0 V), the control signal BLPRE indicates "L", and the odd-numbered bit line BLek is brought into the floating state (RCLK 5-7).

When the potential of the select gate line SGS on the source line side is set to the transfer potential Vread, the potential of the bit line BLek is influenced by the state of the selected memory cell, that is, the value of the data stored in the memory cell.

That is, when the data of the selected memory cell is "11", "10", the selected memory cell is turned on by the read potential Vcgr00. Therefore, the charge of the bit line BLek is discharged, and the potential of the bit line BLek drops to 0.8 V or less (the non-selected memory cell in the selected block is turned on by Vread).

On the other hand, when the data of the selected memory cell is "00", "01", the selected memory cell is not turned on by the read potential Vcgr00. Therefore, the charge of the bit line BLek is not discharged, and the bit line BLek maintains a precharge potential (about 1 V) (RCLK 6-E).

When the control signal BLPRE indicates about 4.5 V, and the control signal VPRE indicates Vdd (e.g., 3 V), one end of the capacitor C1 of the data storage unit DS1, that is, the node N2 is charged at Vdd. Thereafter, when the control signal BLCLAMP indicates Vsense (e.g., 1.8 V), the potential of one end of the capacitor C1 of the data storage unit DS1 changes as follows.

That is, when the potential of the bit line BLek remains at the precharge potential (about 1 V) (when the data of the memory cell are "00", "01"), the N-channel MOS transistor (clamp transistor) Qn5 (FIG. 10) is turned off, and the potential of one end of the capacitor C1 of the data storage unit DS1 is maintained at Vdd ("H").

On the other hand, when the potential of the bit line BLek is 0.8 V or less (when the data of the memory cell are "11", "10"), the N-channel MOS transistor (clamp transistor) Qn5 (FIG. 10) is turned on, the charge of one end of the capacitor C1 of the data storage unit DS1 is discharged to the bit line BLek, and the potential drops to the value ("L") lower than Vdd (SCLK 4-5).

As a result, the read data by the read potential Vcgr00 is stored in the data storage unit DS1 (one end of the capacitor C1). That is, when the data of the memory cell are "11", "10", "L", that is, "1"-data is stored. When the data of the memory cell are "00", "01", "H", that is, "0"-data is stored.

It is to be noted that at this time the relation of "L"="0" and "H"="1" is reversed. That is, the relation of "L"="1" and "H"="0" is obtained.

Figure 24:
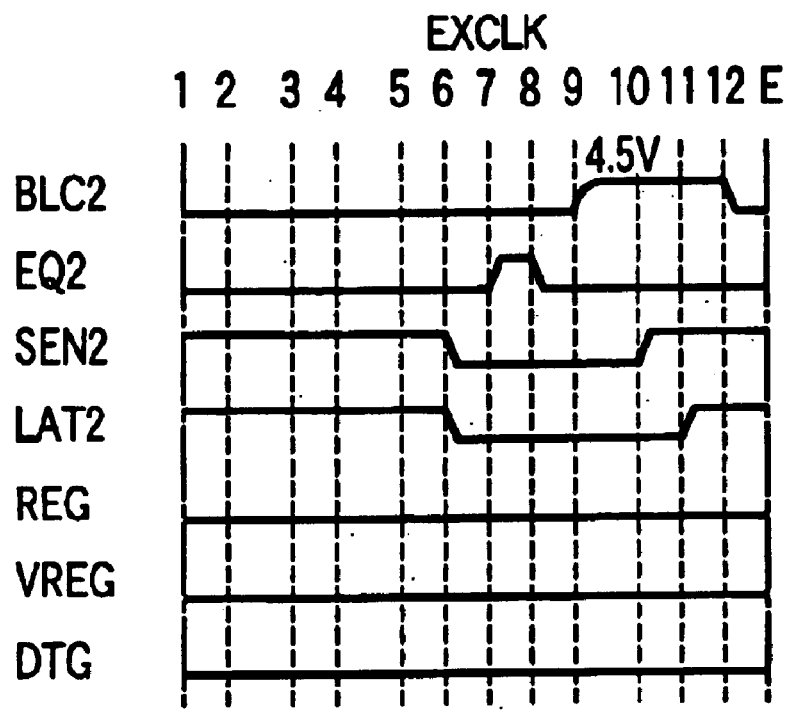
FIG. 24 is a diagram showing the operation waveform example of the EXCLK routine during the operation of FIG. 21.

[2]-1-2 Data Transfer In the "READ00" operation, after the data of the memory cell is read out into the data storage unit DS1, the data transfer is executed to transfer the read data stored in the data storage unit DS1 to the data storage unit DS4. This operation follows the EXCLK routine shown in FIG. 24.

First, both the control signals SEN2, LAT2 turn to "L" (EXCLK 6), and the control signal EQ2 turns to "H" (EXCLK 7-8), so that the state of the flip-flop circuit (FIG. 10) constituting the data storage unit DS4 is reset.

Thereafter, the control signal BLC2 indicates 4.5 V (EXCLK 9), and the N-channel MOS transistor Qn12 turns on. As a result, the data storage units DS1 and DS4 are electrically connected to each other (FIG. 10).

When the clock signal SEN2 turns to "H" (EXCLK 10), the read data stored in the data storage unit DS1 (one end of the capacitor C1) is sensed by the clock synchronous inverter CI4 constituting the data storage unit DS4 via the MOS transistor Qn12. Moreover, when the control signal LAT2 turns to "H" (EXCLK 11), the read data is stored in the data storage unit DS4 (FIG. 10).

It is to be noted that the "READ00" operation is simultaneously performed with respect to 4256 memory cells connected to the selected word line WL2-$i$.

[2]-3 Conclusion

Figure 26:
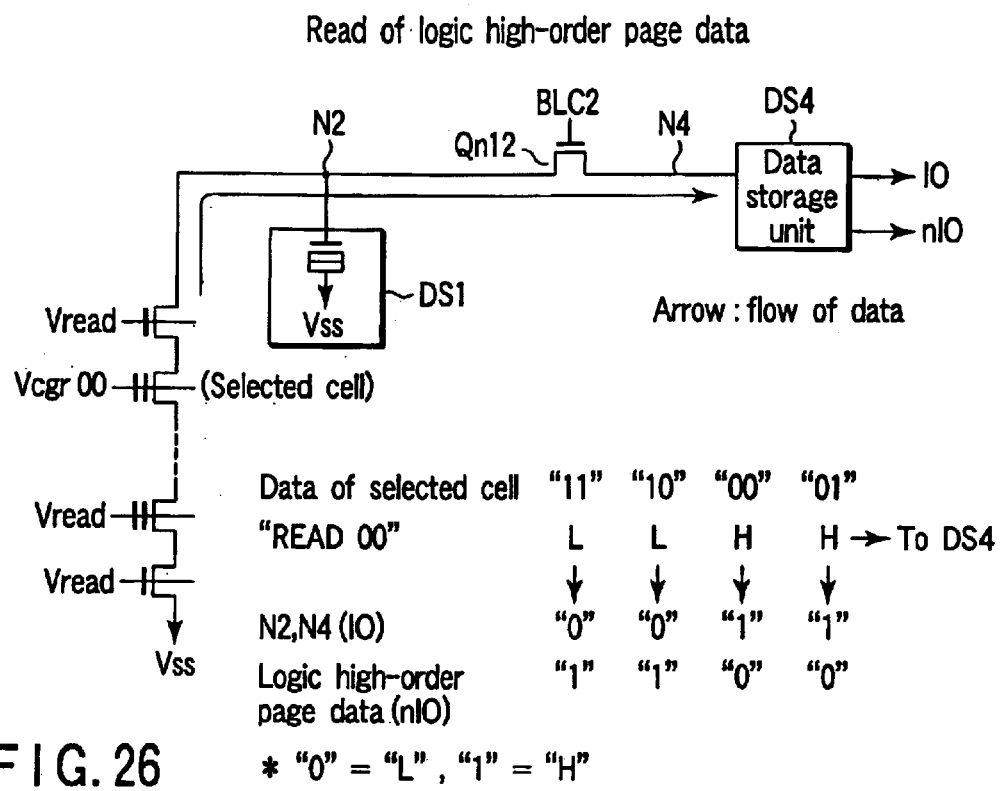
FIG. 26 is a diagram showing a flow of data at the read time of the logic high-order page data.

FIG. 26 briefly shows a flow of read data in the read operation of the logic high-order page data.

In "READ00", Vcgr00 (e.g., 1 V) is used as the read potential to execute the read operation, and the read data at this time is stored in the data storage unit DS1. That is, when the data of the selected memory cell are "11", "10" (when the logic high-order page data is "1"), the potential of one end (node N2) of the capacitor C1 turns to "L". When the data of the selected memory cell are "00", "01" (when the logic high-order page data is "0"), the potential of one end (node N2) of the capacitor C1 turns to "H".

It is to be noted that at this time the relation of "L"="0" and "H"="1" is reversed. That is, the relation of "L"="1" and "H"="0" is obtained.

Thereafter, when the control signal BLC2 indicates 4.5 V, the data of the data storage unit DS1 is transferred to the data storage unit DS4, and stored. When the column select signal CSLk (FIG. 10) turns to "H", the data of the data storage unit DS4 is outputted to the I/O lines (IO, nIO), and outputted to the outside of the memory chip via the data input/output buffer.

(3) Program Operation

A program operation will next be described.

1). Algorithm

[1] Program Operation 1

Figure 27:
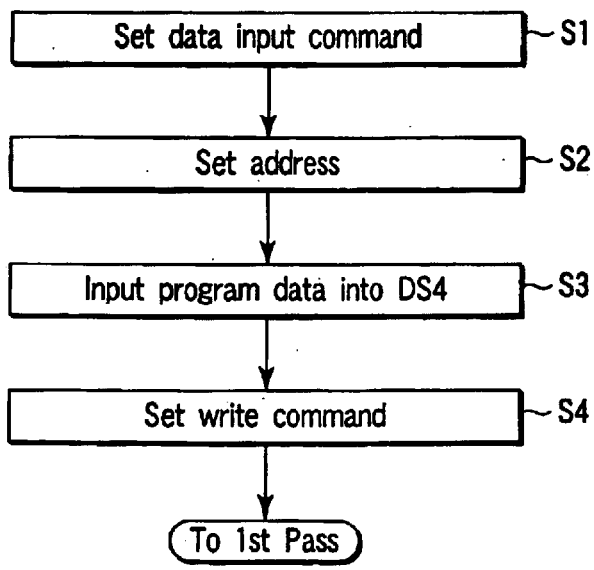
FIG. 27 is a diagram showing an algorithm example of a program operation by pass write.
Figure 28:
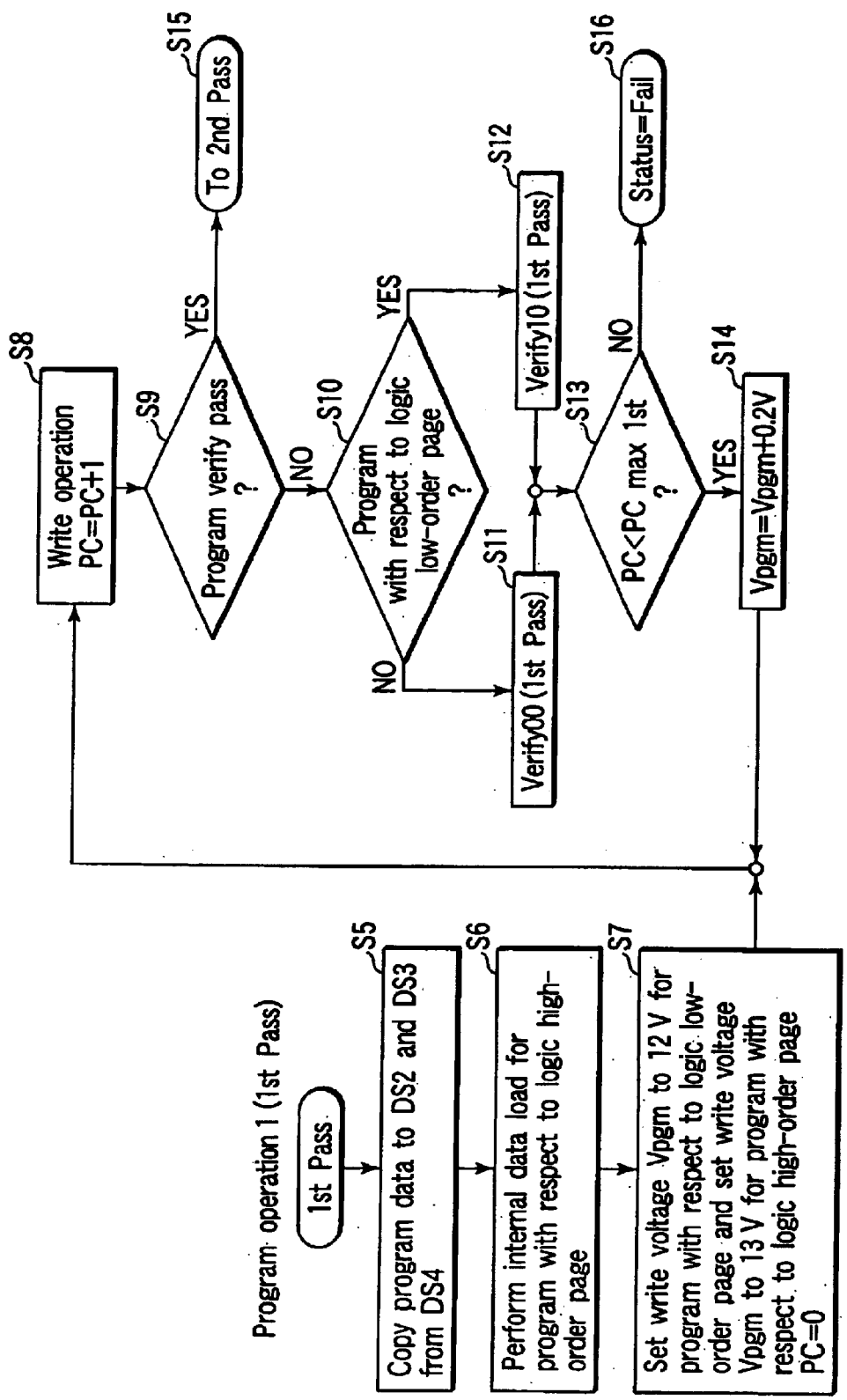
FIG. 28 is a diagram showing an algorithm example of the program operation by pass write.
Figure 29:
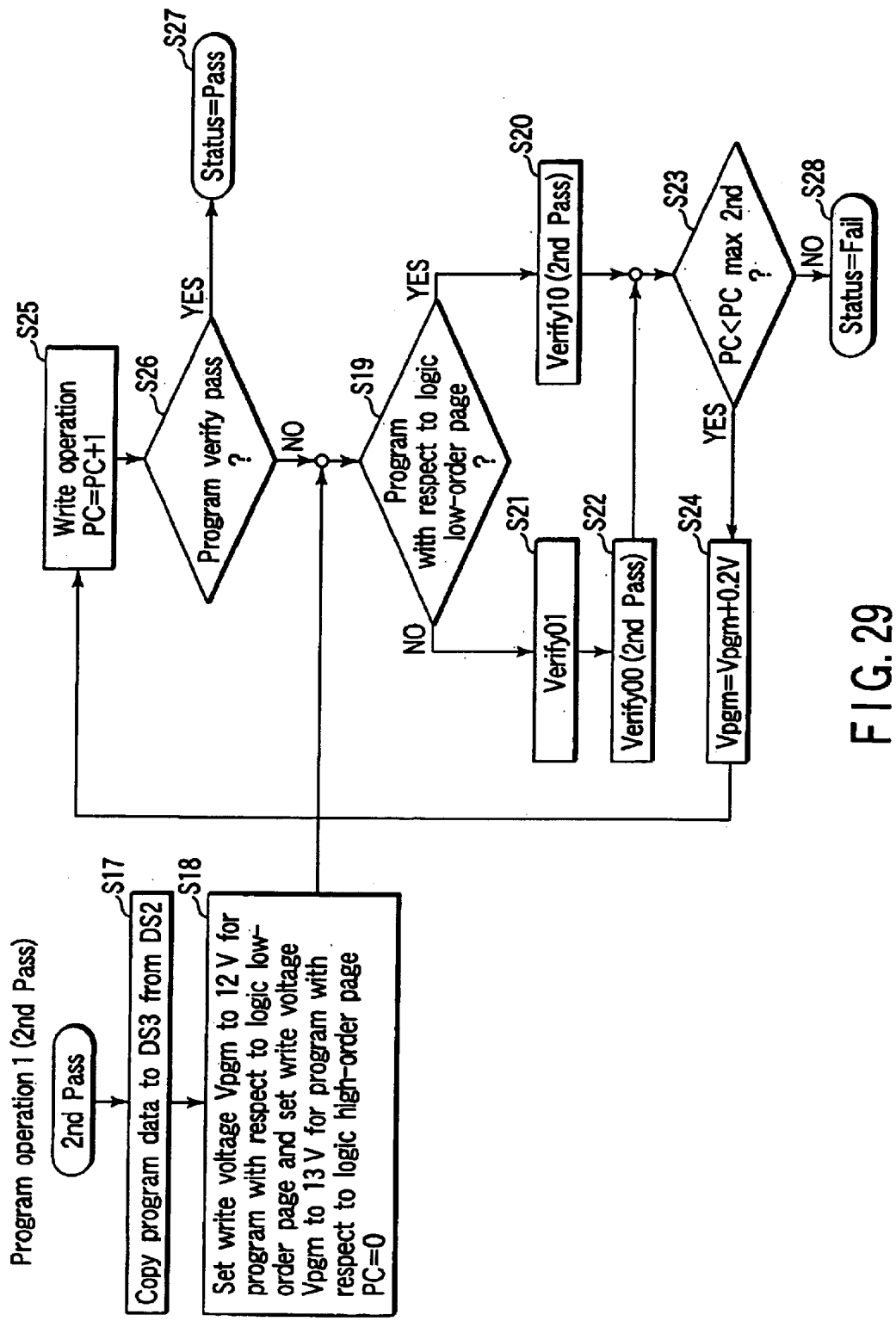
FIG. 29 is a diagram showing an algorithm example of the program operation by pass write.

FIGS. 27 to 29 show one example of an algorithm of a program operation.

This example relates to the algorithm at a time when a write principle called pass write is used. The pass write is a method (double write) of executing the program operation again with respect to the memory cell which has passed program verify, and controlling the threshold voltage with high precision, that is, reducing the width of the threshold value distribution, and includes first and second programs.

It is to be noted that the first program is referred to as the 1st pass, and the second program is referred to as the 2nd pass.

First, the command interface circuit receives a data input command provided from the host microcomputer, and the received data input command is set in the state machine (control circuit) (step S1).

Moreover, when the address signal is supplied into the memory chip from the host microcomputer, the address for selecting the page as an object of the program is set in the state machine in response to the signal (step S2).

Subsequently, when the program data for one page is inputted into the memory chip via the data input/output buffer, the program data for one page is stored in the data storage unit DS4 (step S3). It is to be noted that the data storage units DS4 for one page exist.

Thereafter, when the command interface circuit confirms a write command provided from the host microcomputer, the received write command is set in the state machine (step S4). As a result, under the control by the state machine, the operation of step S5 of FIG. 28 to step S28 of FIG. 29 is automatically executed.

[1]-1 1st Pass

First, the first program (1st pass) shown in FIG. 28 is executed.

The program data stored in the data storage unit DS4 is copied to the data storage units DS2, DS3 (step S5).

Thereafter, if the page as the object of the program is the logic high-order page, internal data load is executed prior to a write operation (step S6). The internal data load is an operation of reading out the data stored in the logic low-order page of the selected memory cell which includes the logic high-order page as the object of the program.

For a reason why the internal data load is required, even when the data written in the logic high-order page of the selected memory cell is the same, the threshold voltage as a target in the write operation differs in accordance with the value of the data stored in the logic low-order page data of the selected memory cell (see FIG. 19).

The logic low-order page data read out by the internal data load is stored in the data storage unit DS4 via the data storage unit DS1.

Here, it is to be noted that with the logic low-order page data of "1", the read data by the internal data load is "0" (="L"), and the "0"-data is stored in the data storage unit DS4 (node N4). Moreover, when the logic low-order page data is "0", the read data by the internal data load is "1" (="H"), and the "1"-data is stored in the data storage unit DS4 (node N4).

However, this phenomenon has no problem in the operation, and is advantageous for executing "Verify00 (2nd Pass)" in the 2nd pass described later.

Thereafter, with the program for the logic low-order page, a write voltage Vpgm is set to 12 V. When the program for the logic high-order page, the write voltage Vpgm is set to 13 V. Moreover, a value PC of a program counter in the state machine is set to zero (step S7). It is to be noted that the value PC of the program counter represents the number of write operations.

The write operation is next executed (step S8).

When the program data stored in the data storage unit DS3 is "0", for example, the high voltage is applied to the substrate and floating gate electrode, the electron is injected into the floating gate electrode, and the threshold voltage of the memory cell is raised ("0"-programming). When the program data stored in the data storage unit DS3 is "1", for example, the high voltage is prevented from being applied between the substrate and floating gate electrode, the electron is prevented from being injected into the floating gate electrode, and the threshold voltage of the memory cell is not changed ("i"-programming).

After the write operation is performed, "1" is added to the value PC of the program counter (step S8).

Thereafter, it is judged whether the program verify is in a pass state (state in which the program is completed) or in an NG state (state in which the program is not completed) (step S9).

Here, immediately after the first write operation, "Vefiry00 (1st Pass)" and "Vefiry10 (1st Pass)" are not performed once, and therefore the data storage unit DS3 stores the program data itself.

When the data storage units DS3 in all columns (e.g., 4256 units) store "1"-data, that is, when all the program data is "1" with respect to the logic low-order or high-order page, the N-channel MOS transistor Qn17 of FIG. 10 is in the off state in all the columns. For example, FLAG of FIG. 8 maintains "H".

Therefore, the program verify is judged to be in a pass state (state in which the program is completed), and shifts to the 2nd pass (step S15).

On the other hand, when the data storage unit DS3 in at least one column stores "0"-data, that is, when at least one program data with respect to the logic low-order or high-order page is "0", the N-channel MOS transistor Qn17 (FIG. 10) connected to the data storage unit DS3 for storing the "0"-data is in the on state. For example, FLAG of FIG. 8 turns to "L".

Therefore, the program verify is judged to be in the NG state (state in which the program is not completed), and shifts to "Verify00 (1st Pass)" or "Verify10 (1st Pass)".

With the program for the logic low-order page, "Verify10 (1st Pass)" is executed (step S12).

The "Verify10 (1st Pass)" is an operation comprising: using the read potential Vcgv10 (see FIG. 17) to execute the read operation with respect to the selected memory cell as the object of the program; and determining the value of the data newly stored in the data storage unit DS3 based on the read data obtained by the read operation and the data (program data) of the data storage unit DS2.

With the program for the logic low-order page, first all the selected memory cells as the objects of the program are in a "11" state. Therefore, for the memory cell as the object of "1"-programming (memory cell for the data storage unit DS3 for storing "1"-data), the threshold voltage does not fluctuate. Therefore, the read data read by "Verify10 (1st Pass)" is always "0".

Therefore, "0" is stored in the data storage unit DS1. However, as described later, when "1" is stored in the data storage unit DS2, the data of the data storage unit DS1 is forcibly changed to "1" regardless of the read data. That is, the "1"-data is stored again into the data storage unit DS3 from the data storage unit DS1.

On the other hand, for the memory cell as the object of "0"-programming (memory cell for the data storage unit DS3 for storing "0"-data), when the threshold voltage sufficiently rises (the program is completed) by the write operation (step S8), the read data read by "Verify10 (1st Pass)" is "1".

Therefore, "1" is stored in the data storage unit DS1. This "1"-data is transferred to the data storage unit DS3 from the data storage unit DS1. That is, the data of the data storage unit DS3 changes to "1" from "0".

Moreover, for the memory cell as the object of the "0"-programming (memory cell for the data storage unit DS3 for storing "0"-data), when the threshold voltage does not sufficiently rise (the program is not completed) by the write operation (step S8), the read data read by "Verify10 (1st Pass)" is "0".

Therefore, "0" is stored in the data storage unit DS1. This "0"-data is transferred to the data storage unit DS3 from the data storage unit DS1. That is, the data of the data storage unit DS3 maintains "0".

With the program for the logic high-order page, "Verify00 (1st Pass)" is executed (step S11).

The "Verify00 (1st Pass)" is an operation comprising: using the read potential Vcgv00 (see FIG. 17) to execute the read operation with respect to the selected memory cell as the object of the program; and determining the value of the data newly stored in the data storage unit DS3 based on the read data obtained by the read operation and the data (program data) of the data storage unit DS2.

With the program for the logic high-order page, the selected memory cell as the object of the program is in the "11" or "10" state. Therefore, for the memory cell as the object of the "1"-programming (memory cell for the data storage unit DS3 for storing the "1"-data), the threshold voltage does not fluctuate. Therefore, the read data read by "Verify00 (1st Pass)" is always "0".

Therefore, "0" is stored in the data storage unit DS1. However, as described later, when "1" is stored in the data storage unit DS2, the data of the data storage unit DS1 is forcibly changed to "1" regardless of the read data. That is, the "1"-data is stored again into the data storage unit DS3 from the data storage unit DS1.

On the other hand, for the memory cell as the object of the "0"-programming (memory cell for the data storage unit DS3 for storing the "0"-data), when the threshold voltage sufficiently rises (the program is completed) by the write operation (step S8), the read data read by "Verify00 (1st Pass)" is "1".

Therefore, "1" is stored in the data storage unit DS1. This "1"-data is transferred to the data storage unit DS3 from the data storage unit DS1. That is, the data of the data storage unit DS3 changes to "1" from "0".

It is to be noted that all the memory cells as the objects of the "0"-programming are in the "0" state in this stage. However, since "Verify00 (2nd Pass)" is performed (divided into the "00" and "01" states) in the 2nd pass based on the logic low-order page data (stored in the data storage unit DS4) read out by the internal data load (step. S6), the logic high-order page data can be programmed without collapsing the logic low-order page data.

Moreover, for the memory cell as the object of the "0"-programming (memory cell for the data storage unit DS3 for storing the "0"-data), when the threshold voltage does not sufficiently rise (the program is not completed) by the write operation (step S8), the read data read by "Verify00 (1st Pass)" is "0".

Therefore, "0" is stored in the data storage unit DS1. This "0"-data is transferred to the data storage unit DS3 from the data storage unit DS1. That is, the data of the data storage unit DS3 maintains "0".

Thereafter, if the value PC of the program counter reaches a preset maximum write number PC max 1st, fail (program failure) is set in a status register in the state machine, and the program operation ends (steps S13, S16).

Moreover, if the value PC of the program counter is smaller than the preset maximum write number PC max 1st, the write voltage Vpgm is stepped up, for example, by about 0.2 V, and subsequently the write operation is executed again (steps S13, S14, S8).

Thereafter, program verify is performed (step S9). However, as described above, with the "1"-programming, the data of the data storage unit DS3 is always "1". Moreover, for the "0"-programming, when the "0"-programming is completed, the data of the data storage unit DS3 is changed to "1" from "0". Only when the "0"-programming is not completed, the data of the data storage unit DS3 maintains "0".

Therefore, when the programming ("1"-programming or "0"-programming) is completed with respect to all the selected memory cells as the objects of the program, all the data storage units DS3 store the "1"-data. That is, the N-channel MOS transistor Qn17 of FIG. 10 is turned off in all the columns, FLAG of FIG. 8 turns to "H" (the program verify is in the pass state), and the step shifts to the 2nd pass (step S15).

Moreover, when the programming ("0"-programming) is not completed with respect to at least one selected memory cell as the object of the program, at least one data storage units DS3 store the "0"-data. That is, the N-channel MOS transistor Qn17 of FIG. 10 is turned on in at least one column, FLAG of FIG. 8 turns to "L" (the program verify has the NG state), and the verify read and write operation are repeated again (steps S10 to S14, S16, S8).

It can be judged whether or not the program is completed based on the data stored in the data storage unit DS3.

[1]-2 2nd Pass

In the step S9 of the first program (1st Pass), when the program verify is passed, the second program (2nd Pass) is subsequently executed.

In the 2nd pass, the program data stored in the data storage unit DS2 is first copied back to the data storage unit DS3 (step S17).

This copy back has the following significance.

First the program data is stored in the data storage units DS2, DS3 (step S5). However, in the 1st pass, as described above, the data of the data storage unit DS3 changes in accordance with the result of "Verify10 (1st Pass)" or "Verify00 (1st Pass)". Finally, that is, in the step S9 of the 1st pass, when the program verify is passed, the values of all the data storage units DS3 are "1".

Then, in the 2nd pass, the program data is transferred to the data storage unit DS3 from the data storage unit DS2 in order to store the program data in the data storage unit DS3 again. This is the significance of the copy back of the step S17.

Thereafter, with the program for the logic low-order page, the write voltage Vpgm is set again to 12 V. With the program for the logic high-order page, the write voltage Vpgm is set to 13 V again. Moreover, the value PC of the program counter in the state machine is set again to zero (step S7).

"Verify10 (2nd Pass)" or "Verify01" is next executed.

With the program for the logic low-order page data, "Verify10 (2nd Pass)" is executed (steps S19 and ST20).

The "Verify10 (2nd Pass)" is an operation comprising: using the read potential Vcgv10 (see FIG. 17) to execute the read operation with respect to the selected memory cell as the object of the program; and determining the value of the data newly stored in the data storage unit DS3 based on the read data obtained by the read operation and the data (program data) of the data storage unit DS2.

In the 2nd pass, since the "11" state is maintained with respect to the memory cell as the object of the "1"-programming (memory cell for the data storage unit DS3 for storing the "1"-data), the read data read by "Verify10 (2nd Pass)" is always "0".

Therefore, "0" is stored in the data storage unit DS1. Moreover, since "1" is stored in the data storage unit DS2, the data of the data storage unit DS1 is forcibly changed to "1" regardless of the read data. Therefore, the "1"-data is transferred to the data storage unit DS3 from the data storage unit DS1.

On the other hand, for the memory cell as the object of the "0"-programming (memory cell for the data storage unit DS3 for storing the "0"-data), substantially the "10" state is supposed to be obtained by the 1st pass.

For the memory cell in which the threshold voltage sufficiently rises (the program is completed), the read data read by "Verify10 (2nd Pass)" is "1".

Therefore, "1" is stored in the data storage unit DS1. This "1"-data is transferred to the data storage unit DS3 from the data storage unit DS1. That is, the data of the data storage unit DS3 changes to "1" from For the memory cell in which the threshold voltage does not sufficiently rise (the program is not completed), the read data read by "Verify10 (1st Pass)" is "0".

Therefore, "0" is stored in the data storage unit DS1. This "0"-data is transferred to the data storage unit DS3 from the data storage unit DS1. That is, the data of the data storage unit DS3 maintains "0".

With the program for the logic high-order page, "Verify01" and "Verify00 (2nd Pass)" are continuously executed (steps S21 and ST22).

The "Verify01" is an operation comprising: using the read potential Vcgv01 (see FIG. 17) to execute the read operation with respect to the selected memory cell as the object of the program; and determining the value of the data newly stored in the data storage unit DS3 based on the read data obtained by the read operation and the data (program data) of the data storage unit DS2.

The "Verify00 (2nd Pass)" is an operation comprising: using the read potential Vcgv00 (see FIG. 17) to execute the read operation with respect to the selected memory cell as the object of the program; and determining the value of the data newly stored in the data storage unit DS3 based on the read data obtained by the read operation, the data (program data) of the data storage unit DS2, and the data (logic low-order page data) of the data storage unit DS4.

In the 2nd pass, since the "11" or "10" state is maintained with respect to the memory cell as the object of the "1"-programming (memory cell for the data storage unit DS3 for storing the "1"-data), the read data read by "Verify01" is always "0".

Therefore, "0" is stored in the data storage unit DS1. Moreover, since "1" is stored in the data storage unit DS2, the data of the data storage unit DS1 is forcibly changed to "1" regardless of the read data. Therefore, the "1"-data is transferred to the data storage unit DS3 from the data storage unit DS1.

Moreover, the read data read by "Verify00 (2nd Pass)" is always "0".

Therefore, "0" is stored in the data storage unit DS1. However, since "1" is stored in the data storage unit DS2, the data of the data storage unit DS1 is forcibly changed to "1" regardless of the read data and the logic low-order page data of the data storage unit DS4. Therefore, the "1"-data is transferred to the data storage unit DS3 from the data storage unit DS1.

On the other hand, for the memory cell as the object of the "0"-programming (memory cell for the data storage unit DS3 for storing the "0"-data), the "00" state is supposed to be obtained by the 1st pass.

Therefore, at first, the read data read by "Verify01" is "0". Therefore, "0" is stored in the data storage unit DS1. This "0"-data is transferred to the data storage unit DS3 from the data storage unit DS1. That is, the data of the data storage unit DS3 maintains "0".

Thereafter, subsequent to "Verify01", "Verify00 (2nd Pass)" is executed.

For the memory cell in which the threshold voltage sufficiently rises ("00" program is completed), the read data read by "Verify00 (2nd Pass)" is "1".

Therefore, "1" is stored in the data storage unit DS1.

However, here, the data of the data storage unit DS1 is influenced by the logic low-order page data stored in the data storage unit DS4.

That is, with the logic low-order page data of "1", "0" (="L") is stored in the data storage unit DS4 (node N4). Therefore, the data of the data storage unit DS1 is forcibly changed to "0". This means that with the logic low-order page data of "1", the memory cell is brought into the "01" state (see FIG. 19) in order to program "0" as the logic high-order page data.

This "0"-data is transferred to the data storage unit DS3 from the data storage unit DS1. That is, the data of the data storage unit DS3 remains at "0".

When the logic low-order page data is "0", the data storage unit DS4 (node N4) stores "1" (="H"). Therefore, the data of the data storage unit DS1 remains at "1".

This "1"-data is transferred to the data storage unit DS3 from the data storage unit DS1. That is, the data of the data storage unit DS3 changes to "1" from "0".

Additionally, as described above, to program "0" as the logic high-order page data, when the logic low-order page data is "0", the memory cell is brought into the "00" state. When the logic low-order page data is "1", the memory cell has to be brought into the "01" state.

Moreover, at a completion time of the 1st pass, the memory cell in which "0" is programmed as the logic high-order page data is brought into the "00" state regardless of the value of the logic low-order page data.

In the sequence of the present example, since "Verify00 (2nd Pass)" is continuously performed immediately after "Verify01", the threshold voltage only of the memory cell including the logic low-order page data of "1" is raised by the write operation and "Verify01", and can be brought into the "01" state. In other words, for the memory cell in which the logic low-order page data is "0", the write operation (injection of the electron to the floating gate electrode) can be stopped by "Verify00 (2nd Pass)" at a time when the "00" state is obtained.

Thereafter, if the value PC of the program counter reaches the preset maximum write number PC max 2nd, fail (program failure) is set in the status register in the state machine, and the program operation ends (steps S23, S28).

Moreover, if the value PC of the program counter is smaller than the preset maximum write number PC max 2nd, the write voltage Vpgm is stepped up, for example, by about 0.2 V, and subsequently the write operation is executed again (steps S23, S24, S25).

When the program data stored in the data storage unit DS3 is "0", for example, the high voltage is applied between the substrate and floating gate electrode, the electron is injected into the floating gate electrode, and the threshold voltage of the memory cell is raised ("01"-programming). When the program data stored in the data storage unit DS3 is "1", for example, the high voltage is prevented from being applied between the substrate and floating gate electrode, the electron is prevented from being injected into the floating gate electrode, and the threshold voltage of the memory cell is not changed ("i"-programming).

After the write operation is performed, "1" is added to the value PC of the program counter (step S25).

Thereafter, the program verify is executed based on the data stored in the data storage unit DS3, and it is judged whether the program verify is in the pass state (state in which the program is completed) or in the NG state (state in which the program is not completed) (step S26).

When the program data with respect to the logic high-order page data is "1" ("1"-programming), the data of the data storage unit DS3 is always "1".

Moreover, when the program data with respect to the logic high-order page is "0", the logic low-order page data is "0" ("00"-programming), and the "00"-programming is completed, the data of the data storage unit DS3 is changed to "1" from "0" by "Verify00 (2nd Pass)".

Furthermore, when the program data with respect to the logic high-order page is "0", the logic low-order page data is "1" ("01"-programming), and the "01"-programming is completed, the data of the data storage unit DS3 is changed to "1" from "0" by "Verify01".

Therefore, when the programming ("00"-programming or "01"-programming) is completed with respect to all the memory cells selected as the objects of the program, all the data storage units DS3 store the "1"-data. That is, in all the columns, the N-channel MOS transistor Qn17 of FIG. 10 is turned off, and FLAG of FIG. 8 turns to "H" (program verify is in the pass state). Subsequently, pass (program completion) is set in the status register in the state machine, and the program operation ends (steps S26, S27).

Moreover, when the programming ("01"-programming) is not completed with respect to at least one selected memory cell as the object of the program, at least one data storage unit DS3 stores the "0"-data. That is, in at least one column, the N-channel MOS transistor Qn17 of FIG. 10 is turned on, FLAG of FIG. 8 turns to "L" (program verify is in the NG state), and the verify read and write operation are repeated again (steps S19 to S25, S28).

As described above, it can be judged whether or not the program is completed based on the data stored in the data storage unit DS3.

[2] Program Operation 2

FIG. 30 shows another example of the algorithm of the program operation.

This example relates to the algorithm at a time when a write principle called quick pass write (QPW) is used. The quick pass write is an improved example of the pass write (double write), and characterized in that the 1st and 2nd passes in the pass write are processed in parallel with each other and a write time is reduced.

First, the command interface circuit receives the data input command provided from the host microcomputer, and the received data input command is set in the state machine (control circuit) (step S1).

Moreover, when the address signal is supplied into the memory chip from the host microcomputer, the address for selecting the page as the object of the program is set in the state machine in response to the signal (step S2).

Subsequently, when the program data for one page is inputted into the memory chip via the data input/output buffer, the program data for one page is stored in the data storage unit DS4 (step S3).

Thereafter, when the command interface circuit confirms the write command supplied from the host microcomputer, the received write command is set in the state machine (step S4). As a result, under the control by the state machine, the operation of steps S5 to S17 is automatically executed.

First the program data stored in the data storage unit DS4 is copied to DS2, DS3, respectively (step S5).

Thereafter, if the page as the object of the program is the logic high-order page, the internal data load is executed prior to the write operation (step S6). The logic low-order page data read by the internal data load is stored in the data storage unit DS4 via the data storage unit DS1.

When the logic low-order page data is "1", the read data by the internal data load turns to "0" (="L"), and the "0"-data is stored in the data storage unit DS4 (node N4). When the logic low-order page data is "0", the read data by the internal data load turns to "1" (="H"), and the "1"-data is stored in the data storage unit DS4 (node N4).

Thereafter, with the program for the logic low-order page, the write voltage Vpgm is set to 12 V. With the program for the logic high-order page, the write voltage Vpgm is set to 13 V. Moreover, the value PC of the program counter in the state machine is set to zero (step S7). It is to be noted that the value PC of the program counter indicates the number of write operations.

The write operation is next executed (step S8).

When the program data stored in the data storage unit DS3 is "0", for example, the high voltage is applied between the substrate and floating gate electrode, the electron is injected into the floating gate electrode, and the threshold voltage of the memory cell is raised ("0"-programming). When the program data stored in the data storage unit DS3 is "1", for example, the high voltage is prevented from being applied between the substrate and floating gate electrode, the electron is prevented from being injected into the floating gate electrode, and the threshold voltage of the memory cell is not changed ("i"-programming).

After the write operation is performed, "1" is added to the value PC of the program counter (step S8).

Thereafter, it is judged based on the data stored in the data storage unit DS3 whether the program verify is in the pass state (state in which the program is completed) or in the NG state (state in which the program is not completed) (step S9).

Immediately after the first write operation, "Verify01", "Verify00", and "Verify10" are not performed once, and therefore the data storage unit DS3 stores the program data.

When the data storage units DS3 in all columns (e.g., 4256 units) store the "1"-data, that is, when all the program data is "1" with respect to the logic low-order or high-order page, the N-channel MOS transistor Qn17 of FIG. 10 is in the off state in all the columns. For example, FLAG of FIG. 8 maintains "H".

Therefore, the program verify is judged to be in the pass state (state in which the program is completed). As a result, the pass is set in the status register, and the program operation ends (step S16).

On the other hand, when the data storage unit DS3 in at least one column stores "0"-data, that is, when at least one program data with respect to the logic low-order or high-order page is "0", the N-channel MOS transistor Qn17 (FIG. 10) connected to the data storage unit DS3 for storing the "0"-data is in the on state. For example, FLAG of FIG. 8 turns to "L".

Therefore, the program verify is judged to be in the NG state (state in which the program is not completed). As a result, the process shifts to "Verify10" or "Verify01".

With the program for the logic low-order page, "Verify10" is executed (step S11).

The "Verify10" is an operation comprising: using the read potential Vcgv10 (see FIG. 17) to execute the read operation with respect to the selected memory cell as the object of the program; and determining the value of the data newly stored in the data storage unit DS3 based on the read data obtained by the read operation and the data (program data) of the data storage unit DS2.

With the program for the logic low-order page, first all the selected memory cells as the objects of the program are in the "11" state. Therefore, for the memory cell as the object of the "1"-programming (memory cell for the data storage unit DS3 for storing the "1"-data), the threshold voltage does not fluctuate. Therefore, the read data read by "Verify10" is always "0".

Therefore, "0" is stored in the data storage unit DS1. However, when "1" is stored in the data storage unit DS2, the data of the data storage unit DS1 is forcibly changed to "1" regardless of the read data. That is, the "1"-data is stored again into the data storage unit DS3 from the data storage unit DS1.

On the other hand, for the memory cell as the object of the "0"-programming (memory cell for the data storage unit DS3 for storing the "0"-data), when the threshold voltage sufficiently rises (the program is completed) by the write operation (step S8), the read data read by "Verify10 (1st Pass)" is "1".

Therefore, "1" is stored in the data storage unit DS1. This "1"-data is transferred to the data storage unit DS3 from the data storage unit DS1. That is, the data of the data storage unit DS3 changes to "1" from "0".

Moreover, for the memory cell as the object of the "0"-programming (memory cell for the data storage unit DS3 for storing "0"-data), when the threshold voltage does not sufficiently rise (the program is not completed) by the write operation (step S8), the read data read by "Verify10" is "0".

Therefore, "0" is stored in the data storage unit DS1. This "0"-data is transferred to the data storage unit DS3 from the data storage unit DS1. That is, the data of the data storage unit DS3 maintains "0".

With the program for the logic high-order page, "Verify01" and "Verify00" are continuously executed (steps S12, S13).

The "Verify01" is an operation comprising: using the read potential Vcgv01 (see FIG. 17) to execute the read operation with respect to the selected memory cell as the object of the program; and determining the value of the data newly stored in the data storage unit DS3 based on the read data obtained by the read operation and the data (program data) of the data storage unit DS2.

The "Verify00" is an operation comprising: using the read potential Vcgv00 (see FIG. 17) to execute the read operation with respect to the selected memory cell as the object of the program; and determining the value of the data newly stored in the data storage unit DS3 based on the read data obtained by the read operation, the data (program data) of the data storage unit DS2, and the data (logic low-order page data) of the data storage unit DS4.

Since the "11" or "10" state is maintained with respect to the memory cell as the object of the programming ("1"-programming) of the logic high-order page data "1" (memory cell for the data storage unit DS3 for storing the "1"-data), the read data read by "Verify01" is always "0".

Therefore, "0" is stored in the data storage unit DS1. Moreover, since "1" is stored in the data storage unit DS2, the data of the data storage unit DS1 is forcibly changed to "1" regardless of the read data. Therefore, the "1"-data is transferred to the data storage unit DS3 from the data storage unit DS1.

Moreover, the read data read by "Verify00" is always "0".

Therefore, "0" is stored in the data storage unit DS1. However, since "1" is stored in the data storage unit DS2, the data of the data storage unit DS1 is forcibly changed to "1" regardless of the read data and the logic low-order page data of the data storage unit DS4. Therefore, the "1"-data is transferred to the data storage unit DS3 from the data storage unit DS1.

On the other hand, for the memory cell as the object of the programming ("0"-programming) of the logic high-order page data "0" (memory cell for the data storage unit DS3 for storing the "0"-data), the "11" or "10" state changes to "00" state, and further changes to the "01" state.

Therefore, at first, the read data read by "Verify01" is "0". Therefore, "0" is stored in the data storage unit DS1. This "0"-data is transferred to the data storage unit DS3 from the data storage unit DS1. That is, the data of the data storage unit DS3 maintains "0".

Thereafter, subsequent to "Verify01", "Verify00" is executed.

For the memory cell in which the threshold voltage sufficiently rises ("00"-programming is completed), the read data read by "Verify00" is "1".

Therefore, "1" is stored in the data storage unit DS1.

However, here, the data of the data storage unit DS1 is influenced by the logic low-order page data stored in the data storage unit DS4.

That is, with the logic low-order page data of "1", "0" (="L") is stored in the data storage unit DS4 (node N4). Therefore, the data of the data storage unit DS1 is forcibly changed to "0". This means that with the logic low-order page data of "1", the memory cell is brought into the "01" state (see FIG. 19) in order to program "0" as the logic high-order page data.

This "0"-data is transferred to the data storage unit DS3 from the data storage unit DS1. That is, the data of the data storage unit DS3 remains at "0".

When the logic low-order page data is "0", the data storage unit DS4 (node N4) stores "1" (="H"). Therefore, the data of the data storage unit DS1 remains at "1". This means that with the logic low-order page data of "0", the threshold voltage of the memory cell is stopped in the "00" state (see FIG. 19) in order to program "0" as the logic high-order page data.

This "1"-data is transferred to the data storage unit DS3 from the data storage unit DS1. That is, the data of the data storage unit DS3 changes to "1" from Thereafter, if the value PC of the program counter reaches the preset maximum write number PC max, fail (program failure) is set in the status register in the state machine, and the program operation ends (steps S14, S17).

Moreover, if the value PC of the program counter is smaller than the preset maximum write number PC max, the write voltage Vpgm is stepped up, for example, by about 0.2 V, and subsequently the write operation is executed (steps S14, S15, S8).

Thereafter, the program verify is executed based on the data stored in the data storage unit DS3 to judge whether the program verify is in the pass state (state in which the program is completed) or in the NG state (state in which the program is not completed) (step S9).

When the program data with respect to the logic high-order page data is "1" ("1"-programming), the data of the data storage unit DS3 is always "1".

Moreover, when the program data with respect to the logic high-order page is "0", the logic low-order page data is "0" ("00"-programming), and the "00"-programming is completed, the data of the data storage unit DS3 is changed to "1" from "0" by "Verify00".

Furthermore, when the program data with respect to the logic high-order page is "0", the logic low-order page data is "1" ("01"-programming), and the "01" -programming is completed, the data of the data storage unit DS3 is changed to "1" from "0" by "Verify01".

Therefore, when the programming ("00"-programming or "01"-programming) is completed with respect to all the memory cells selected as the objects of the program, all the data storage units DS3 store the "1"-data. That is, in all the columns, the N-channel MOS transistor Qn17 of FIG. 10 is turned off, and FLAG of FIG. 8 turns to "H" (program verify is in the pass state). Subsequently, pass (program completion) is set in the status register in the state machine, and the program operation ends (step S16).

Moreover, when the programming ("00"-programming, "01"-programming) is not completed with respect to at least one selected memory cell as the object of the program, at least one data storage unit DS3 stores the "0"-data. That is, in at least one column, the N-channel MOS transistor Qn17 of FIG. 10 is turned on, FLAG of FIG. 8 turns to "L" (program verify is in the NG state), and the verify read and write operation are repeated again (steps S8 to S17).

As described above, it can be judged whether or not the program is completed based on the data stored in the data storage unit DS3.

2). Operation Description by Operation Waveform

The operation will concretely be described hereinafter with reference to an operation timing chart.

A major part of the program operation (Pass Write) includes: a copy operation of the program data to the data storage units DS2, DS3 from the data storage unit DS4; an internal data load operation; a copy operation of the program data to the data storage unit DS3 from the data storage unit DS2; a write operation; and a verify operation (Verify 10/00/01).

Moreover, a major part of the program operation (Quick Pass Write) includes: the copy operation of the program data to the data storage units DS2, DS3 from the data storage unit DS4; the internal data load operation; the write operation (Write); and the verify operation (Verify 10/00/01).

Then, these operations will be described.

It is to be noted that as not particularly shown in the operation timing chart described hereinafter, the "L" level denotes Vss (e.g., 0 V), and the "H" level denotes Vdd (e.g., 3 V). Moreover, in the operation timing chart, one block BLOCKi is selected, and the word line WL2-$i$ and odd-numbered bit line BLek in the block BLOCKi are selected (see FIG. 3).

[1] Copy Operation to DS2, DS3 from DS4

Figure 31:
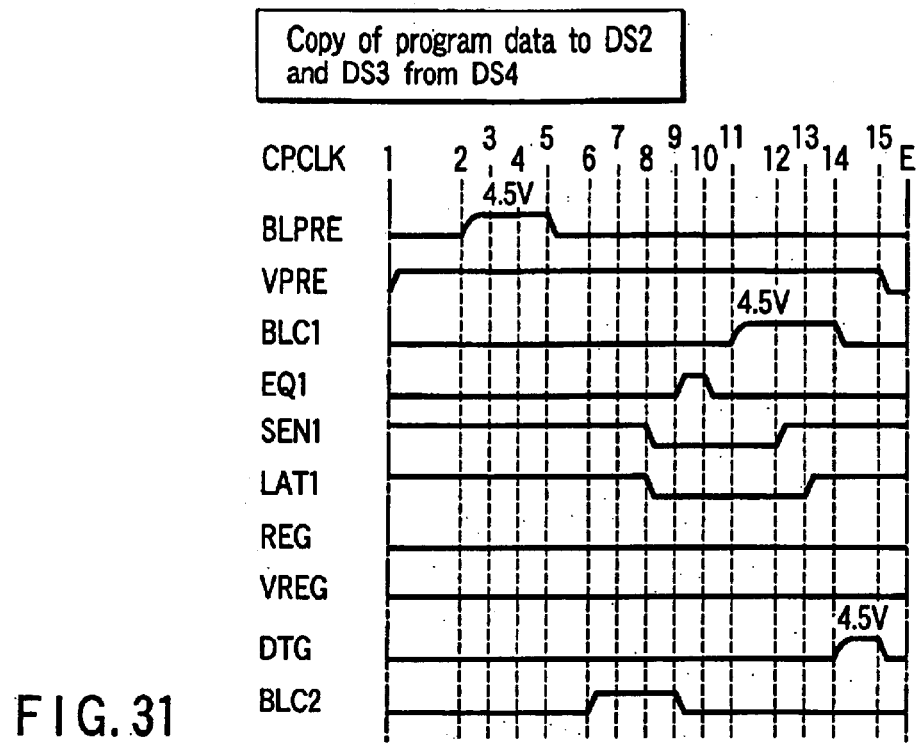
FIG. 31 is a diagram showing an operation waveform example in one step of the program operation.
Figure 32:
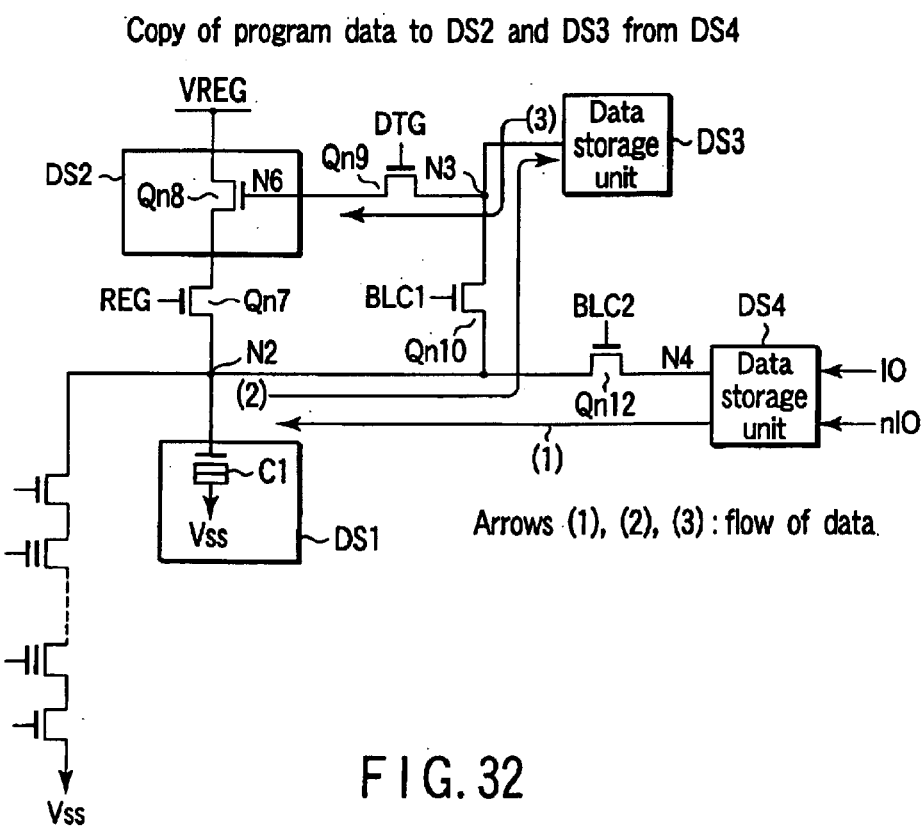
FIG. 32 is a diagram showing the flow of data at a step in FIG. 31.

FIG. 31 shows an operation waveform diagram of the copy operation of the program data to the data storage units DS2, DS3 from the data storage unit DS4. FIG. 32 shows the flow of data in the copy operation of the program data to the data storage units DS2, DS3 from the data storage unit DS4.

The copy operation corresponds to the step S5 of FIGS. 28 and 30.

First, a control signal VPRE turns to "H" in a timing CPCLK1, and a control signal BLPRE turns to 4.5 V in a timing CPCLK2. As a result, the N-channel MOS transistor Qn6 (FIG. 10) is turned on, and the data storage unit DS1 (node N2) is charged at the "H" level (Vdd).

Thereafter, when a control signal BLC2 turns to "H" in a timing CPCLK6, the N-channel MOS transistor Qn12 is turned on, and the data storage unit DS1 is electrically connected to the data storage unit DS4.

Moreover, if the data storage unit DS4 (node N4) stores "1" (="H") as the program data, one end of the data storage unit DS1, that is, capacitor C1 (node N2) maintains the "H" level (Vdd). Furthermore, if the data storage unit DS4 (node N4) stores "0" (="L") as the program data, the charge of one end of the data storage unit DS1, that is, capacitor C1 (node N2) is discharged, and the data of the data storage unit DS1 changes to "L" from "H".

On the other hand, when the control signals SEN1, LAT1 turn to "L" in a timing CPCLK8, and the control signal EQ1 turns to "H", the state of the data storage unit DS3 is reset.

When the control signal BLC1 turns to "H" in a timing CPCLK11, the N-channel MOS transistor Qn10 is turned on, and the data storage units DS1 and DS3 are electrically connected. Moreover, when the control signal SEN1 turns to "H", the data of the data storage unit DS1, that is, one end (node N2) of the capacitor C1 is sensed by the clock synchronous inverter CI1.

Thereafter, when the control signal LAT1 turns to "H" in the timing CPCLK13, the data of the data storage unit DS1 is stored in the data storage unit DS3. Finally, when the control signal DTG indicates 4.5 V in the timing CPCLK14, the N-channel MOS transistor Qn9 is turned on, and the data of the data storage unit DS3 is transferred to the data storage unit DS2. Moreover, when the control signal DTG turns to "L" in the timing CPCLK15, the data of the data storage unit DS3 is stored in the data storage unit DS2.

For example, when the data of the data storage units DS1, DS4 (nodes N2, N4 indicate "H") are "1", the data of the data storage units DS2, DS3 also turn to "1" (nodes N3, N6 turn to "H"). Moreover, when the data of the data storage units DS1, DS4 are "0" (nodes N2, N4 indicate "L"), the data of the data storage units DS2, DS3 also turn to "0" (nodes N3, N6 turn to "L").

It is to be noted that the copy operation to DS2, DS3 from DS4 is simultaneously performed in the data circuits of all the columns (e.g., 4256 columns).

[2] Internal Data Load Operation

FIGS. 33 and 34 show operation waveform diagrams of an internal data load operation, and FIG. 35 shows a flow of data in the internal data load operation.

The internal data load operation corresponds to the step S6 of FIGS. 28 and 30.

The internal data load operation comprises: reading the logic low-order page data beforehand in order to determine the threshold voltage as a target in the program of the logic high-order page data, when the program of the logic high-order page data is performed.

Concretely, the operation comprises: setting the read potential (potential of the selected word line WL2-$i$) to Vcgr10 (e.g., 0V); and checking whether the data of the memory cell is "11" (logic low-order page data is "1") or "10" (logic low-order page data is "0").

The internal data load operation is constituted of a part concerning data read (RCLK 1-E, SCLK 1-E, RRCV 1-E) and a part concerning data transfer (EXCLK routine)

[2]-1 Data Read

First, the transfer potentials Vread (e.g., 4.5 V) are supplied to the select gate line SGD on the bit line side and non-selected word lines WL0-$i$, WL1-$i$, WL3-$i$, and the read potential Vcgr10 (e.g., 0 V) is applied to the selected word line WL2-$i$ (RCLK 1-2).

The control signal BLPRE turns to "H", and the N-channel MOS transistor Qn6 (FIG. 10) is turned on. Moreover, when the control signal BLCLAMP indicates Vclamp (e.g., 2 V) and the control signal BLSe indicates Vsghh (e.g., 4.5 V), the odd-numbered bit line BLek is precharged at the predetermined potential (e.g., about 1 V). On the other hand, since the control signal BIASo indicates Vsghh (e.g., 4.5 V), the even-numbered bit line BLok is fixed to Vss (e.g., 0 V), and functions as the shield bit line (RCLK 2-4).

Thereafter, the control signal BLCLAMP indicates Vss (e.g., 0 V) and the control signal BLPRE turns to "L", and the odd-numbered bit line BLek is brought into the floating state (RCLK 5-7).

When the potential of the select gate line SGS on the source line side is set to the transfer potential Vread, the potential of the bit line BLek is influenced in accordance with the state of the selected memory cell, that is, the value of the data stored in the memory cell.

That is, when the data of the selected memory cell is "11", the selected memory cell is turned on by the read potential Vcgr10. Therefore, the charge of the bit line BLek is discharged, and the potential of the bit line BLek drops to 0.8 V or less (the non-selected memory cell in the selected block is turned on by Vread).

On the other hand, when the data of the selected memory cell is "10", the selected memory cell is not turned on by the read potential Vcgr10. Therefore, the charge of the bit line BLek is not discharged, and the bit line BLek maintains a precharge potential (about 1 V) (RCLK 6-E).

When the control signal BLPRE indicates about 4.5 V, and the control signal VPRE indicates Vdd (e.g., 3 V), one end of the capacitor C1 of the data storage unit DS1, that is, the node N2 is charged at Vdd. Thereafter, when the control signal BLCLAMP indicates Vsense (e.g., 1.8 V), the potential of one end of the capacitor C1 of the data storage unit DS1 changes as follows.

That is, when the potential of the bit line BLek remains at the precharge potential (about 1 V) (when the data of the memory cell is "10"), the N-channel MOS transistor (clamp transistor) Qn5 (FIG. 10) is turned off, and the potential of one end of the capacitor C1 of the data storage unit DS1 is maintained at Vdd ("H").

On the other hand, when the potential of the bit line BLek is 0.8 V or less (when the data of the memory cell is "11"), the N-channel MOS transistor (clamp transistor) Qn5 (FIG. 10) is turned on, the charge of one end of the capacitor C1 of the data storage unit DS1 is discharged to the bit line BLek, and the potential drops to the value ("L") lower than Vdd (SCLK 4-5).

As a result, the read data by the read potential Vcgr10 is stored in the data storage unit DS1 (one end of the capacitor C1). That is, when the data of the memory cell is "11", "L", that is, "1"-data is stored. When the data of the memory cell is "10", "H", that is, "0"-data is stored.

It is to be noted that in the internal data load operation the relation of "L"="0" and "H"="1" is reversed. That is, the relation of "L"="1" and "H"="0" is obtained.

[2]-2 Data Transfer

In the internal data load operation, after the data of the memory cell is read out into the data storage unit DS1, the data transfer is executed to transfer the read data stored in the data storage unit DS1 to the data storage unit DS4. This operation follows the EXCLK routine shown in FIG. 34.

First, when both the control signals SEN2, LAT2 turn to "L" (EXCLK 6), and the control signal EQ2 turns to "H" (EXCLK 7-8), the state of the flip-flop circuit (FIG. 10) constituting the data storage unit DS4 is reset.

Thereafter, the control signal BLC2 indicates 4.5 V (EXCLK 9), and the N-channel MOS transistor Qn12 is turned on. As a result, the data storage units DS1 and DS4 are electrically connected to each other.

When the clock signal SEN2 turns to "H" (EXCLK 10), the read data stored in the data storage unit DS1 (one end of the capacitor C1) is sensed by the clock synchronous inverter CI4 constituting the data storage unit DS4 via the MOS transistor Qn12. Moreover, when the control signal LAT2 turns to "H" (EXCLK 11), the read data is stored in the data storage unit DS4.

It is to be noted that the internal data load operation is simultaneously performed with respect to all the columns (e.g., 4256 cells).

[3] Copy (Copy-back) Operation to DS3 from DS2

Figure 36:
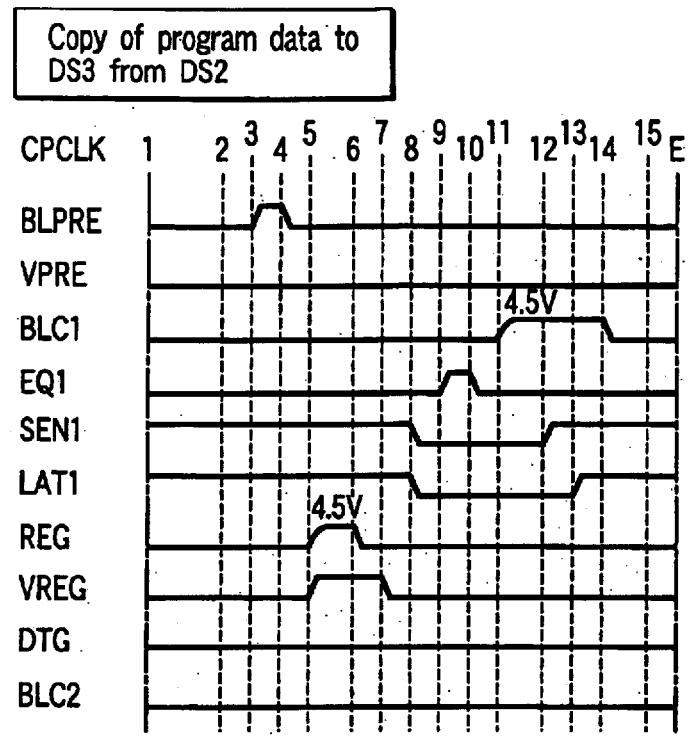
FIG. 36 is a diagram showing an operation waveform example in one step of the program operation.
Figure 37:
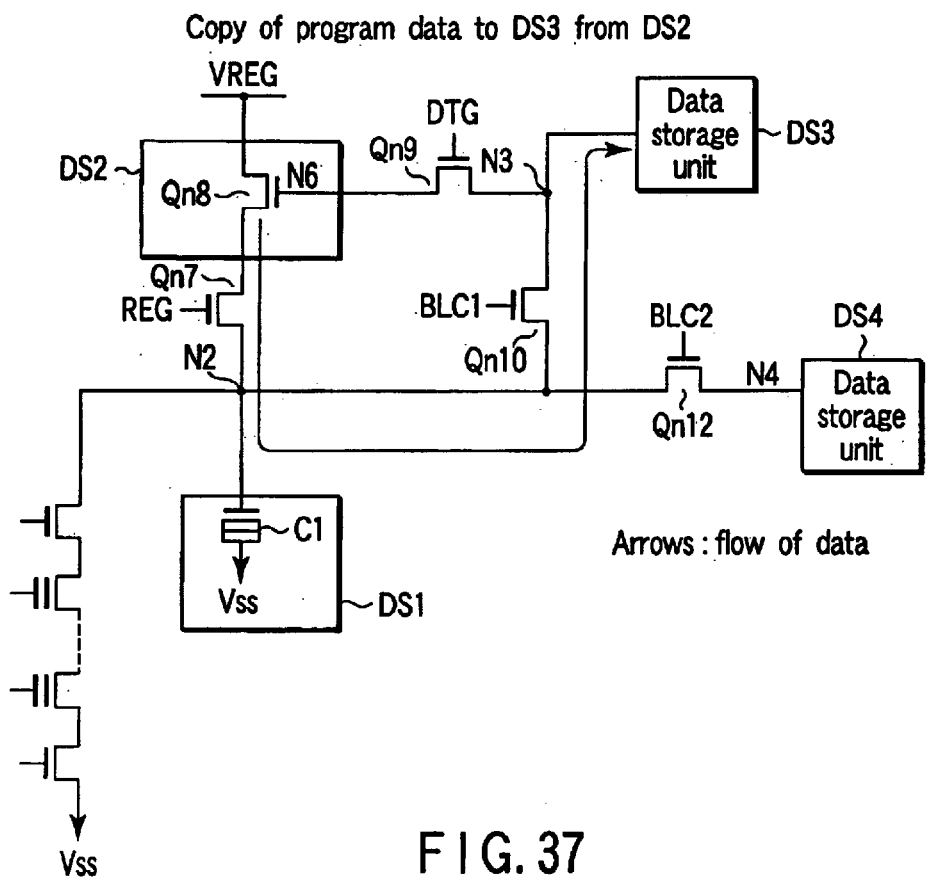
FIG. 37 is a diagram showing the flow of data at a step in FIG. 36.

FIG. 36 shows an operation waveform diagram of a copy operation of the program data to the data storage unit DS3 from the data storage unit DS2. FIG. 37 shows the flow of data in the copy operation of the program data to the data storage unit DS3 from the data storage unit DS2.

This copy operation corresponds to step S17 of FIG. 29.

First, when the control signal BLPRE turns to "H" in the timing CPCLK3, the N-channel MOS transistor Qn6 (FIG. 10) is turned on. At this time, since the control signal VPRE remains at Vss (0 V), the data storage unit DS1 (node N2) is charged at the "L" level (Vss).

Thereafter, the control signal VREG turns to "H" in the timing CPCLK5. Moreover, when the control signal REG indicates 4.5 V, the N-channel MOS transistor Qn7 is turned on, and the data storage units DS1, DS2 are electrically connected.

Moreover, if the data storage unit DS2 (node N6) stores "1" (="H") as the program data, the gate potential of the N-channel MOS transistor Qn8 rises to about 5 V from about Vdd by a boot strap phenomenon. As a result, VREG (=Vdd) is transferred to the data storage unit DS1 via the N-channel MOS transistors Qn7, Qn8. That is, the level of the data storage unit DS1, that is, one end (node N2) of the capacitor C1 changes to "H" from "L".

Furthermore, if the data storage unit DS2 (node N6) stores "0" (="L") as the program data, the gate potential of the N-channel MOS transistor Qn8 indicates Vss (=0 V). As a result, VREG (=Vdd) is not transferred to the data storage unit DS1, and the data storage unit DS1, that is, one end (node N2) of the capacitor C1 maintains the "L" level.

When the control signals SEN1, LAT1 turn to "L" in the timing CPCLK8, and the control signal EQ1 turns to "H" in the timing CPCLK9, the state of the data storage unit DS3 is reset.

When the control signal BLC1 turns to "H" in the timing CPCLK11, the N-channel MOS transistor Qn10 is turned on, and the data storage units DS1 and DS3 are electrically connected. Moreover, when the control signal SEN1 turns to "H" in the timing CPCLK12, the data of the data storage unit DS1, that is, one end (node N2) of the capacitor C1 is sensed by the clock synchronous inverter CI1.

Thereafter, when the control signal LAT1 turns to "H" in the timing CPCLK13, the data of the data storage unit DS1 is stored in the data storage unit DS3.

By the above-described operation, the copy operation of the program data to the data storage unit DS3 from the data storage unit DS2, so-called copy-back ends.

It is to be noted that the copy operation to DS3 from DS2 is simultaneously performed in the data circuits of all the columns (e.g., 4256 columns).

[4] Write Operation (Write)

Figure 38:
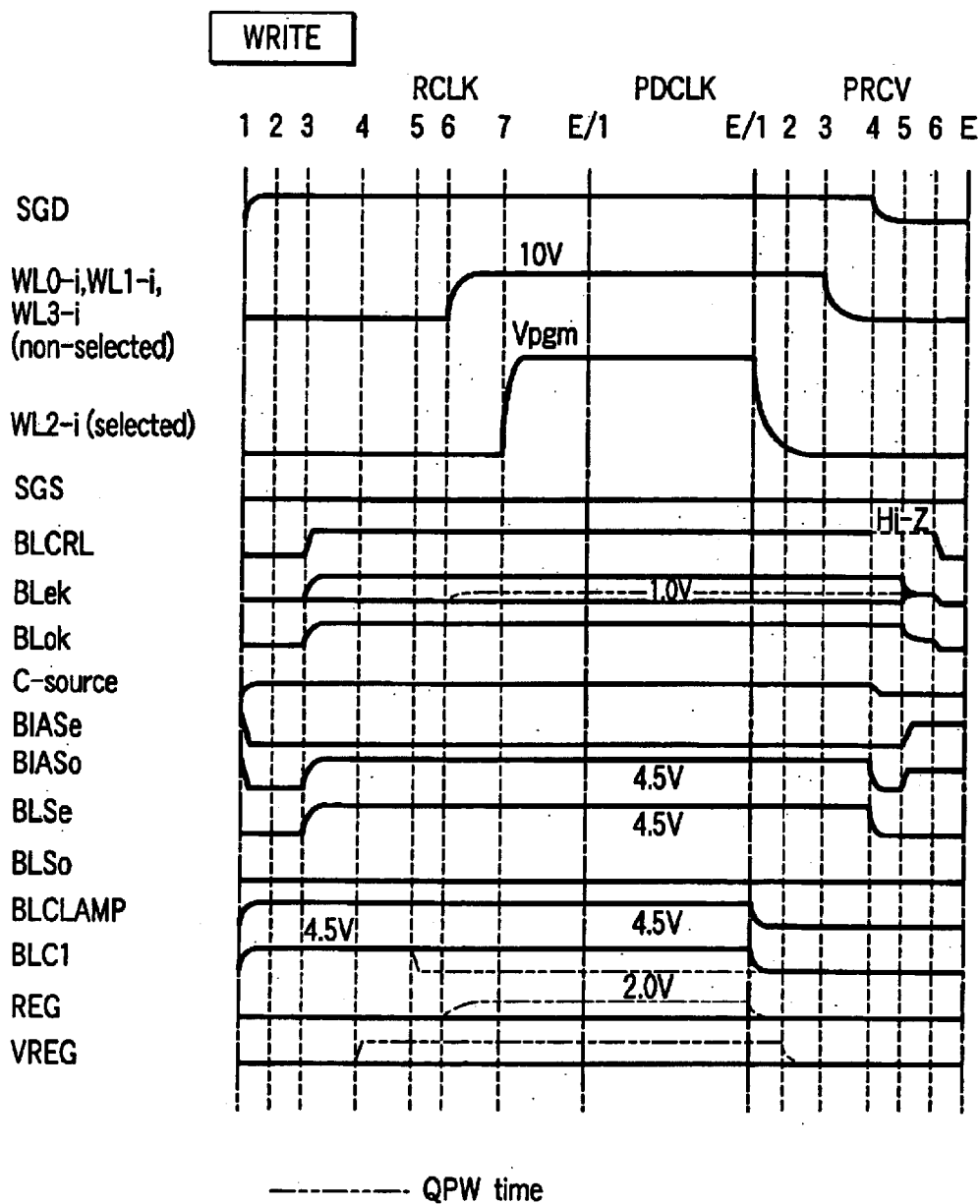
FIG. 38 is a diagram showing an operation waveform example of a write operation.
Figure 39:
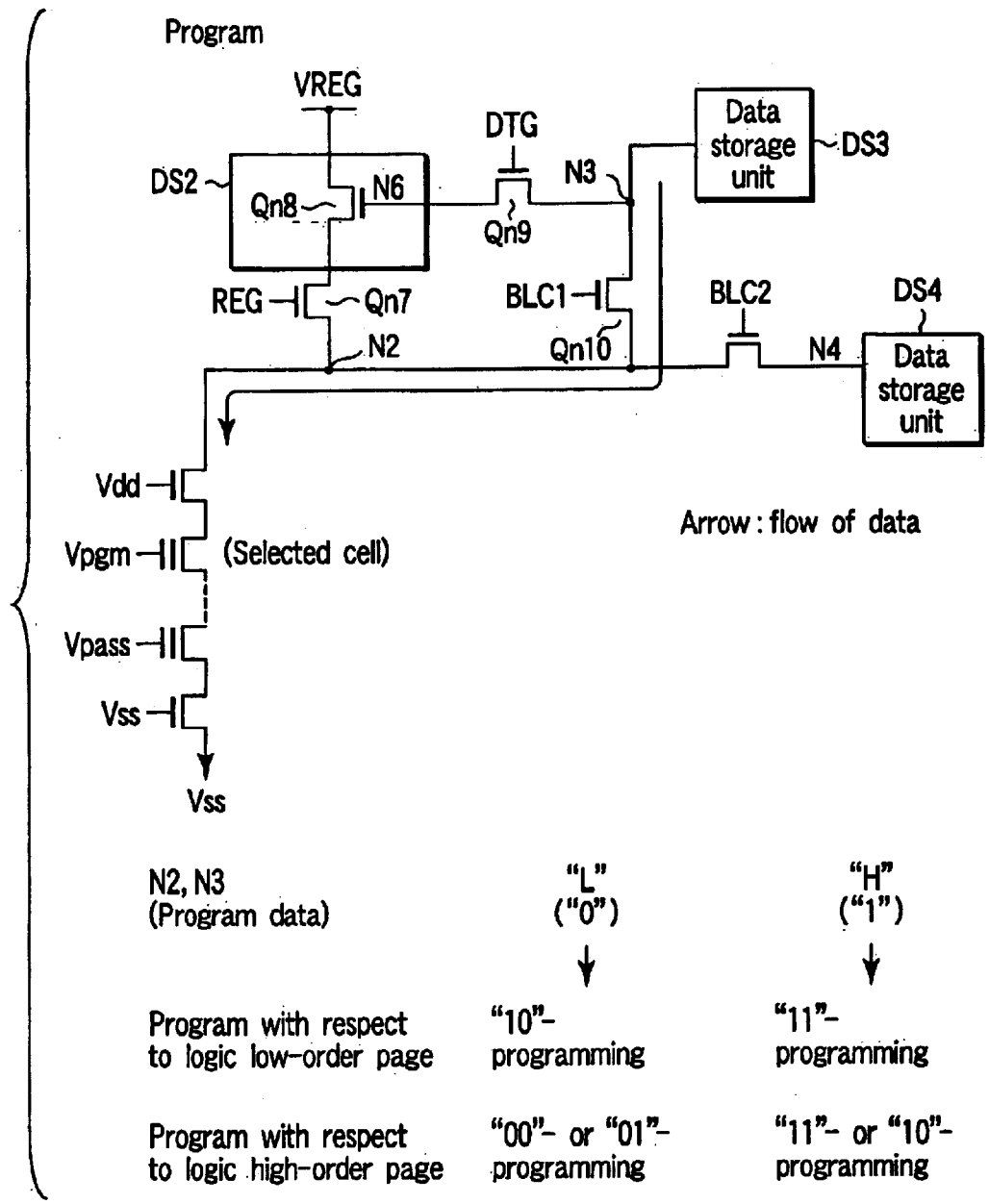
FIG. 39 is a diagram showing a flow of data at a write operation time.

FIG. 38 shows an operation waveform diagram of a write operation. FIG. 39 shows a flow of data in the write operation.

It is to be noted that the "L" level indicates 0 V, and the "H" level indicates Vdd (e.g., 3 V) as not shown. Moreover, in the selected block, the selected word line is WL2, and the selected bit line is BLe.

The write operation corresponds to step S8 of FIGS. 28 and 30, and step S25 of FIG. 29.

First in a timing PCLK1, the control signals BLCLAMP, BLC1 indicate 4.5 V. Moreover, when BLSe indicates 4.5 V in a timing PCLK3, the bit line BLek and data storage unit DS3 are electrically connected.

When the data of the data storage unit DS3 (node N3) is "1", the bit line BLek is charged at Vdd. Moreover, when the data of the data storage unit DS3 (node N3) is "0", the bit line BLek is charged at Vss (0 V).

Moreover, in the timing PCLK3, the control signal BLCRL turns to "H", and the control signal BIASo indicates 4.5 V. As a result, the bit line BLeo is charged at Vdd.

Thereafter, 10 V is applied to the non-selected word lines WL0-$i$, WL1-$i$, WL3-$i$ in a timing PCLK6, and Vpgm (first indicates 12 V or 13 V, and rises every 0.2 V in accordance with the number of writes) is applied to the selected word line WL2-$i$. As a result, the programming is executed with respect to the memory cell.

For example, when the data stored in the data storage unit DS3 is "1", the bit line BLek indicates Vdd. A potential difference between the word line (control gate electrode) WL2-$i$ and the channel of the memory cell does not indicate a value sufficient for injecting the electron in the floating gate electrode of the memory cell.

On the other hand, when the data stored in the data storage unit DS3 is "0", the bit line BLek indicates 0 V. The potential difference between the word line (control gate electrode) WL2-$i$ and the channel of the memory cell indicates the value sufficient for injecting the electron in the floating gate electrode of the memory cell.

Therefore, when the data stored in the data storage unit DS3 is "1", the threshold voltage of the memory cell does not rise. When the data stored in the data storage unit DS3 is "0", the threshold voltage of the memory cell rises.

At a quick pass write (QPW) time, the control signal VREG indicates Vdd in a timing PCLK4, the control signal BLC1 turns to "L" in a timing PCLK5, and the control signal REG is set to 2.0 V in a timing PCLK6.

Therefore, if the data (program data) of the data storage unit DS2 is "1", the gate potential of the N-channel MOS transistor Qn8 rises to about 5 V from about Vdd by the boot strap phenomenon. Therefore, VREG (=Vdd) is limited by the control signal REG (=2.0 V) and transferred to the bit line BLek.

As a result, the potential of the bit line BLek indicates, for example, about 1 V regardless of the data stored in the data storage unit DS3.

If the data (program data) of the data storage unit DS2 is "0", the gate potential of the N-channel MOS transistor Qn8 is 0 V. Therefore, the potential of the bit line BLek maintains Vdd (data of the data storage unit DS3 is "1") or 0 V (data of the data storage unit DS3 is "0").

It is to be noted that the write operation is simultaneously performed with respect to 4256 memory cells connected to the selected word line WL2-$i$.

[5] Verify Operation (Verify 10/00/01)

Figure 40:
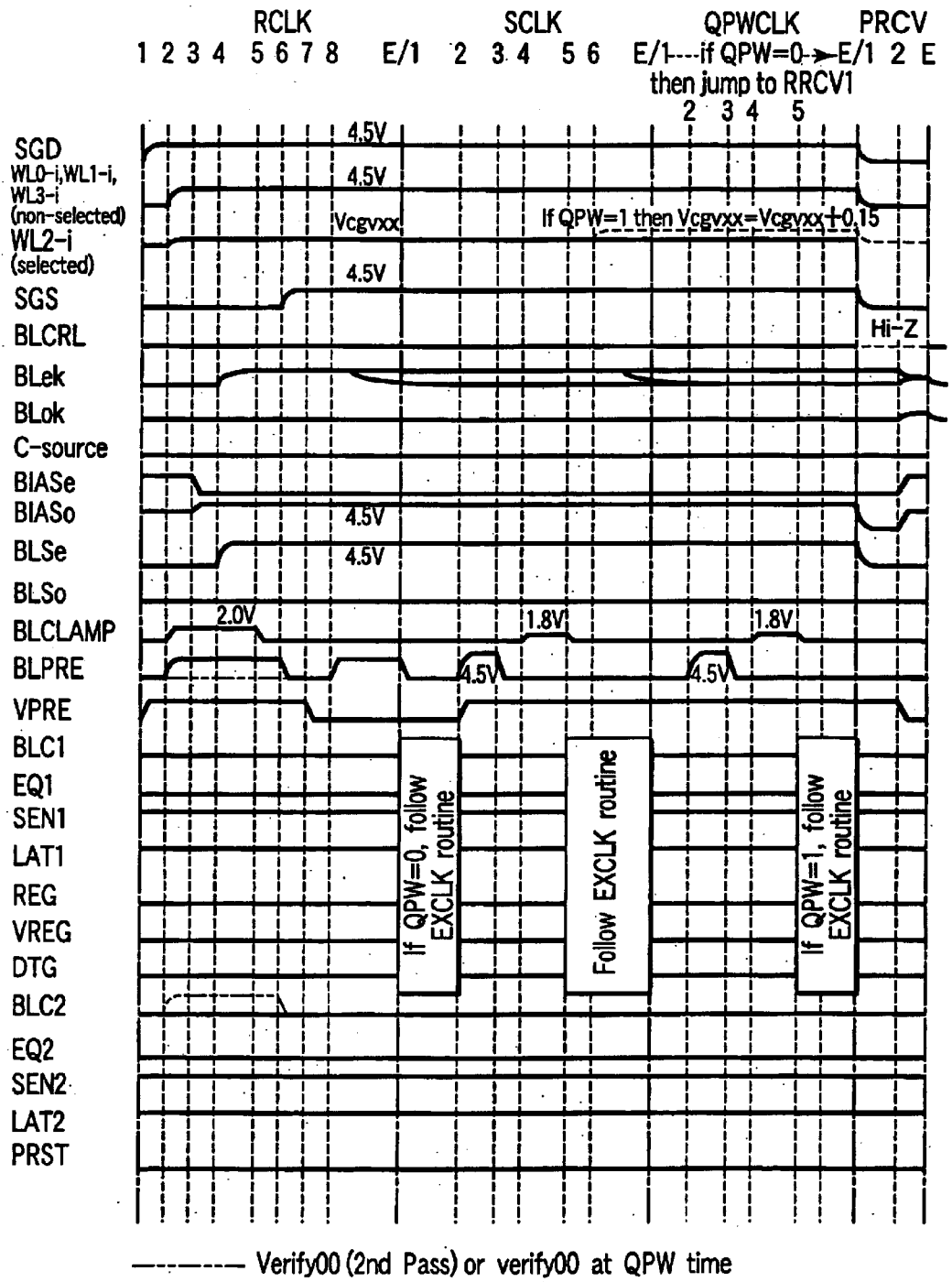
FIG. 40 is a diagram showing an operation waveform example of a verify read operation.
Figure 42:
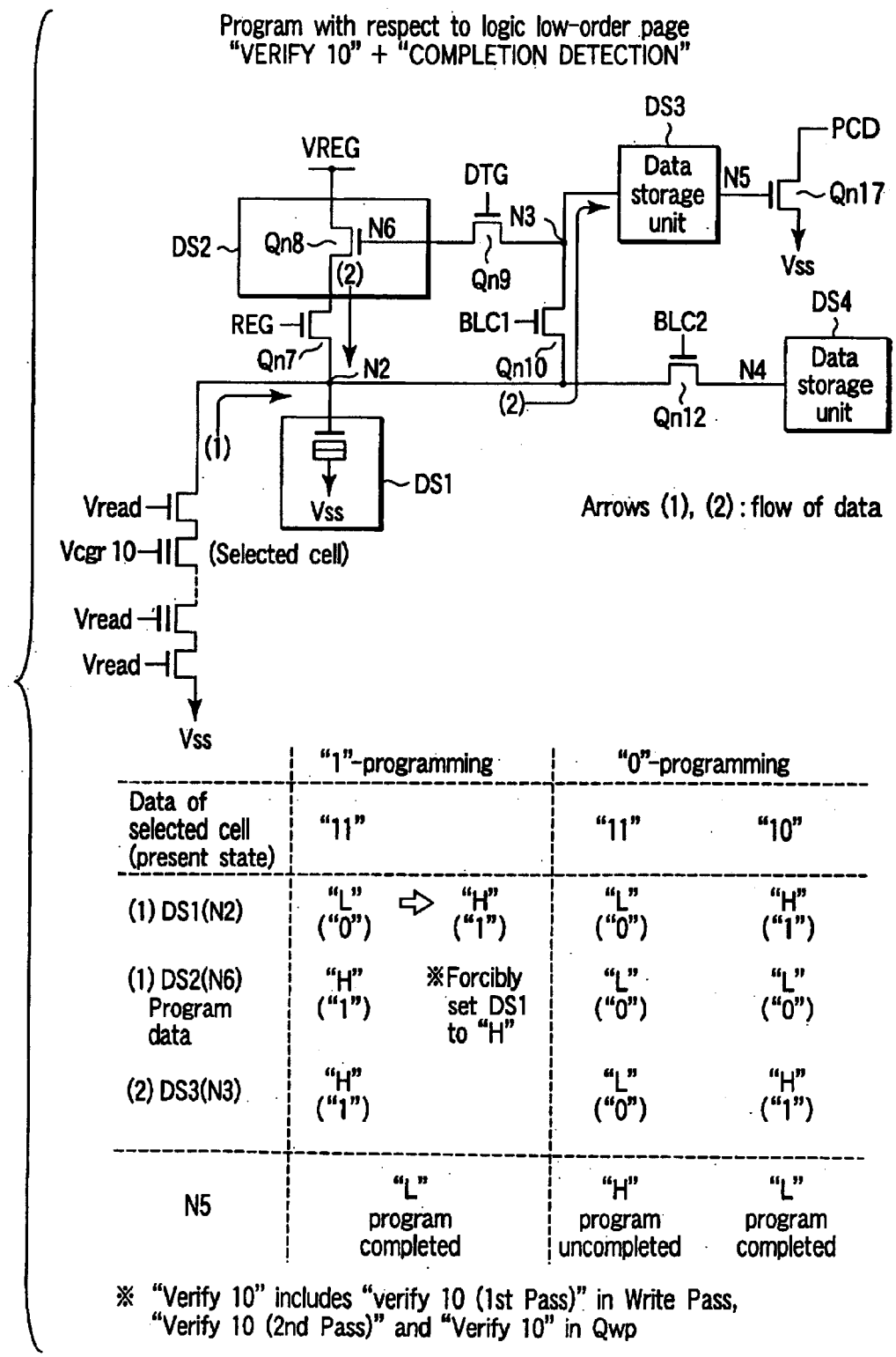
FIG. 42 is a diagram showing a flow of data at a verify read operation time.
Figure 43:
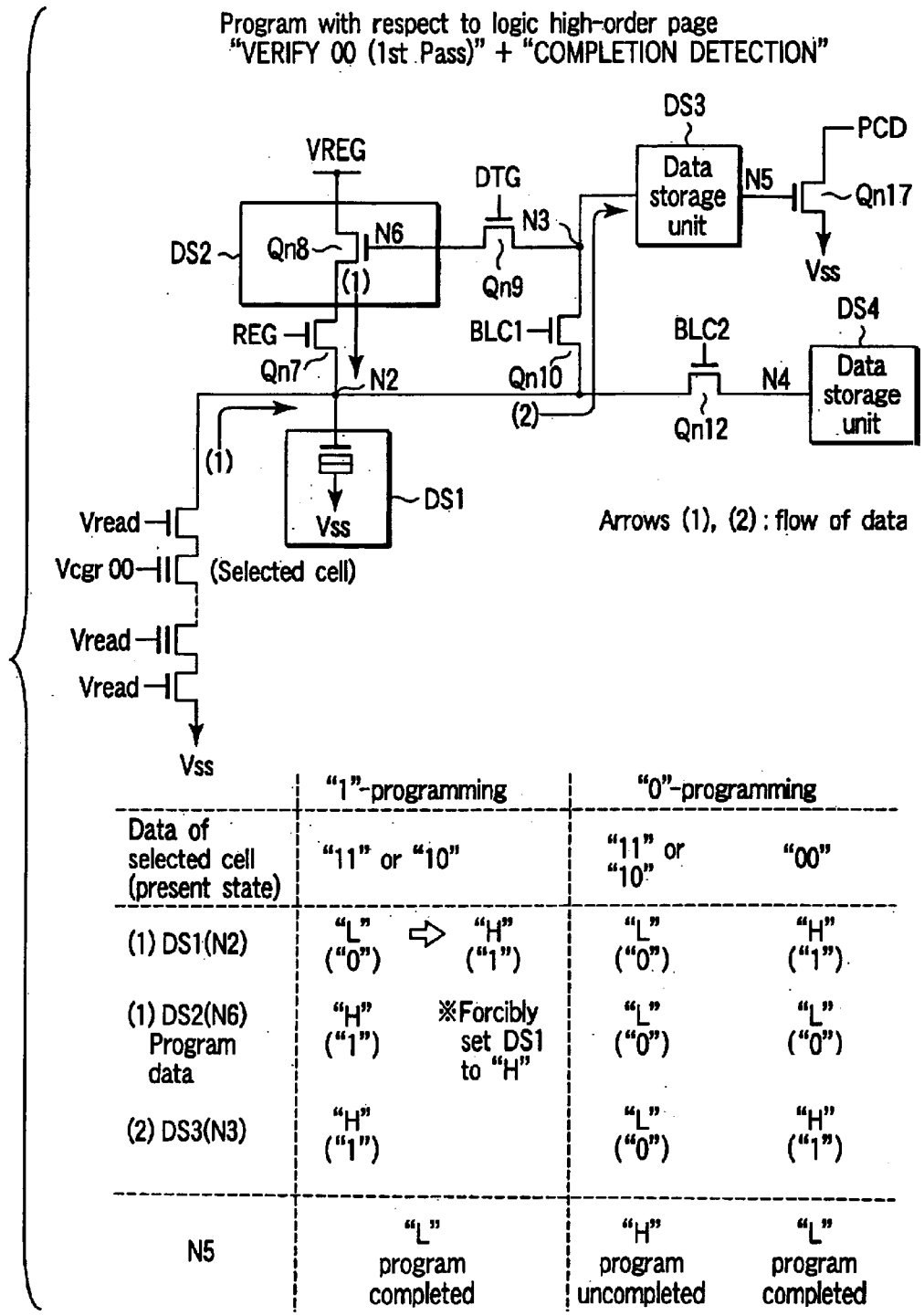
FIG. 43 is a diagram showing a flow of data at the verify read operation time.
Figure 44:
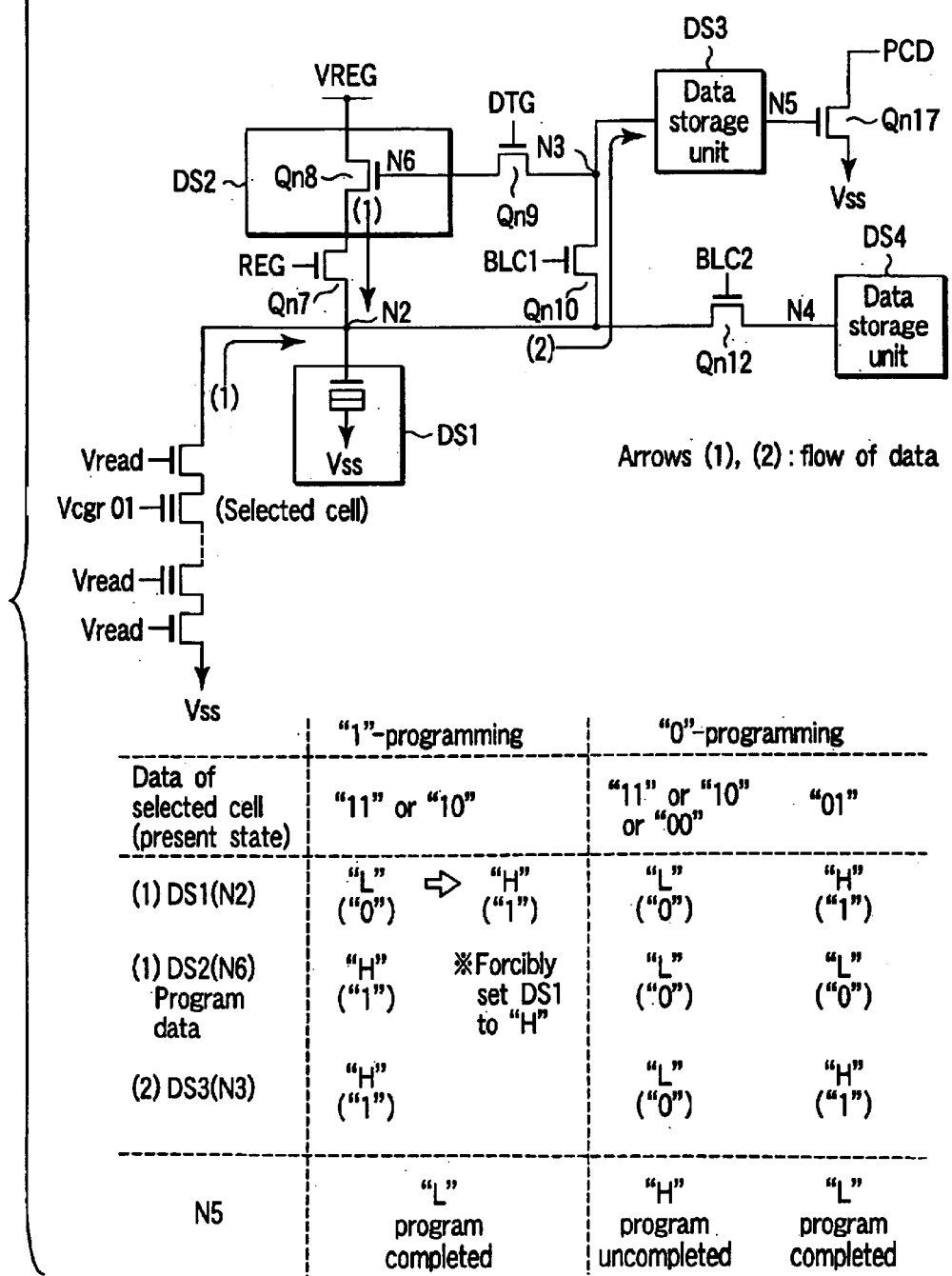
FIG. 44 is a diagram showing a flow of data at the verify read operation time.
Figure 45:
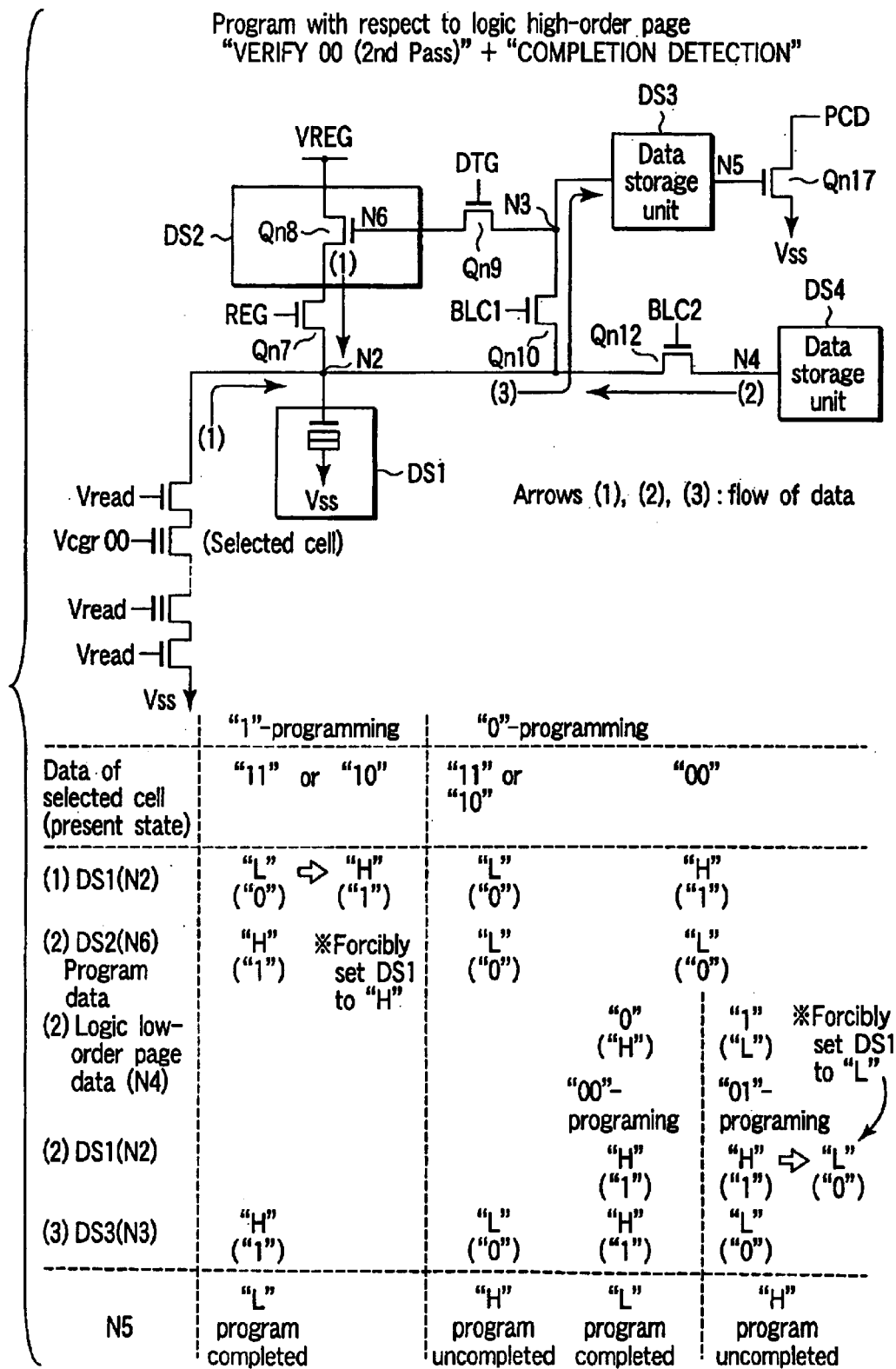
FIG. 45 is a diagram showing a flow of data at the verify read operation time.

FIGS. 40 and 41 show operation waveform diagrams of the verify read in a verify operation. FIGS. 42 to 45 show a flow of data in the verify read.

It is to be noted that the "1" level indicates 0 V, and the "H" level indicates Vdd (e.g., 3 V) as not shown. Moreover, in the selected block, the selected word line is WL2, and the selected bit line is BLe.

A verify operation includes the verify read and completion detection. The completion detection is an operation comprising: detecting whether or not the data program is completed with respect to all the selected memory cells based on the data read by the verify read. Here, the verify read will mainly be described.

The verify read correspond to the steps S11, S12 of FIG. 28, steps S20, S21, S22 of FIG. 29, and steps S11, S12, S13 of FIG. 30.

The verify read is an operation which is performed after the write operation and which comprises: reading data for judging (Completion Detection) whether or not the threshold voltage of the memory cell has reached a predetermined level from the memory cell.

In the present example, the verify read using pass write (double write) will be described. As described above, the first program is referred to as the 1st pass, and the second program is referred to as the 2nd pass. A program method of processing the 1st and 2nd passes in parallel with each other is referred to as a quick pass write (QPW). At a QPW time, for example, a QPW register in the state machine (control circuit) indicates "1". In a usual pass write, the QPW register in the state machine turns to "0".

First, the transfer potential Vread (e.g., 4.5 V) is applied to the select gate line SGD on the bit line side and non-selected word lines WL0-$i$, WL1-$i$, WL3-$i$, and a verify read potential Vcgvxx is applied to the selected word line WL2-$i$ in a timing RCLK 1-2.

The verify read potential Vcgvxx changes, for example, as follows in accordance with the type of the verify read.

[Pass Write Time]
VERIFY10 1stPass→Vcgvxx=0.25 V, VERIFY10 2stPass→Vcgvxx=0.40 V, VERIFY00 1stPass→Vcgvxx=1.25 V, VERIFY00 2ndPass→Vcgvxx=1.40 V, VERIFY01→Vcgvxx=2.40 V

[QPW Time]
VERIFY10→Vcgvxx=0.25 V, VERIFY00→Vcgvxx=1.25 V, VERIFY01→Vcgvxx=2.25 V In a timing RCLK 2-4, the control signal BLPRE turns to "H", and the N-channel MOS transistor Qn6 (FIG. 10) is turned on. Moreover, when the control signal BLCLAMP indicates Vclamp (e.g., 2 V), and the control signal BLSe indicates Vsghh (e.g., 4.5 V), the odd-numbered bit line BLek is electrically connected to VPRE (=Vdd).

As a result, the bit line BLek is precharged at the predetermined potential limited by the threshold voltage of the N-channel MOS transistor Qn5, for example, about 1 V. Moreover, since the control signal BIASo indicates Vsghh (e.g., 4.5 V), the even-numbered bit line BLok is fixed at Vss (e.g., 0 V), and functions as the shield bit line.

In principle, as described above, a precharged source with respect to the bit line BLek is VPRE. However, for "Verify00 (2ndPass)" at a 2nd pass time in the pass write operation and "Verify00" in the QPW operation, the precharge source with respect to the bit line is the data storage unit DS4.

Therefore, the control signal BLC2 turns to "H" at a timing RCLK2 in "Verify00 (2ndPass)" and "Verify00". On the other hand, the control signal BLPRE remains at "L" in a timing RCLK2-6.

As a result, the bit line BLek is electrically connected to the data storage unit DS4. Moreover, when the data of the data storage unit DS4 (node N3) is "1", the bit line BLek is precharged at the predetermined potential limited by the threshold voltage of the N-channel MOS transistor Qn5, for example, about 1 V. Moreover, when the data of the data storage unit DS4 (node N3) is "0", the bit line BLek is precharged at 0 V.

Thereafter, in a timing RCLK 5-7, the control signal BLCLAMP indicates Vss (e.g., 0 V), the control signal BLPRE turns to "L", and the bit line BLek is brought into the floating state.

When the potential of the select gate line SGS on the source line side is set to transfer potential Vread, the potential of the bit line BLek is influenced in accordance with the state of the selected memory cell, that is, the present threshold voltage of the memory cell.

That is, when the threshold voltage of the selected memory cell is lower than the potential (verify read potential) Vcgvxx of the selected word line WL2-$i$, the selected memory cell is turned on by the verify read potential Vcgvxx. Therefore, the charge of the bit line BLek is discharged, and the potential of the bit line BLek drops to 0.8 V or less (the non-selected memory cell in the selected block is turned on by Vread).

On the other hand, when the threshold voltage of the selected memory cell is higher than the verify read potential Vcgvxx, the selected memory cell is not turned on by the verify read potential Vcgvxx. Therefore, the charge of the bit line BLek is not discharged, and the bit line BLek maintains the precharge potential (about 1 V).

It is to be noted that in "Verify00 (2ndPass)" and "Verify00", the bit line BLek is precharged at 0 V, and the bit line BLek therefore always indicates 0 V regardless of the state of the selected memory cell.

When the control signal BLPRE turns to "H" in a timing RCLK 8-E, one end of the capacitor C1 of the data storage unit DS1, that is, the node N2 is charged at VPRE (=0 V). Moreover, when the operation is not the QPW operation (value of the QPW register="0"), the EXCLK routine shown in FIG. 41 is executed thereafter (SCLK1-2).

First, the control signal VREG turns to "H" in a timing EXCLK2. Moreover, when the control signal REG indicates 4.5 V, the N-channel MOS transistor Qn7 is turned on, and the potential of one end (node N2) of the capacitor C1 of the data storage unit DS1 is influenced by the data stored in the data storage unit DS2.

For example, when the data (program data) stored in the data storage unit DS2 is "1", the gate potential of the N-channel MOS transistor Qn8 rises to about 5 V from about Vdd by the boot strap phenomenon, and VREG (=Vdd) is transferred to one end (node N2) of the capacitor C1 of the data storage unit DS1.

Moreover, when the data (program data) stored in the data storage unit DS2 is "0", the gate potential of the N-channel MOS transistor Qn8 indicates 0 V, and VREG (=Vdd) is not transferred to one end (node N2) of the capacitor C1 of the data storage unit DS1. That is, the potential of one end of the capacitor C1 of the data storage unit DS1 does not change.

Furthermore, when the control signal DTG indicates 4.5 V in a timing EXCLK 4-5, the data of the data storage unit DS3 is transferred to the data storage unit DS2.

Thereafter, when both the control signals SEN2, LAT1 turn to "1" (EXCLK 6), and the control signal EQ1 turns to "H" (EXCLK 7-8), the state of the flip-flop circuit (FIG. 10) constituting the data storage unit DS3 is reset.

Thereafter, the control signal BLC1 indicates 4.5 V (EXCLK 9), and the N-channel MOS transistor Qn10 is turned on. As a result, the data storage units DS1 and DS3 are electrically connected to each other.

When the clock signal SEN1 turns to "H" (EXCLK 10), the data stored in the data storage unit DS1 (one end of the capacitor C1) is sensed by the clock synchronous inverter CI1 constituting the data storage unit DS3 via the MOS transistor Qn10. Moreover, when the control signal LAT1 turns to "H" (EXCLK 11), the data is stored in the data storage unit DS3.

When the control signal BLPRE indicates about 4.5 V, and the control signal VPRE indicates Vdd (e.g., 3 V) in a timing SCLK2, one end of the capacitor C1 of the data storage unit DS1, that is, the node N2 is charged at Vdd. Thereafter, when the control signal BLCLAMP indicates Vsense (e.g., 1.8 V), the potential of one end of the capacitor C1 of the data storage unit DS1 changes as follows.

That is, when the potential of the bit line BLek remains at the precharge potential (about 1 V) (when the threshold voltage of the memory cell is higher than Vcgvxx), the N-channel MOS transistor (clamp transistor) Qn5 (FIG. 10) is turned off, and the potential of one end of the capacitor C1 of the data storage unit DS1 is maintained at Vdd ("H").

On the other hand, when the potential of the bit line BLek is 0.8 V or less (when the threshold voltage of the memory cell is lower than Vcgvxx), the N-channel MOS transistor (clamp transistor) Qn5 (FIG. 10) is turned on, the charge of one end of the capacitor C1 of the data storage unit DS1 is discharged to the bit line BLek, and the potential drops to the value ("L") lower than Vdd (SCLK 4-5).

As a result, the read data by the verify read potential Vcgvxx is stored in the data storage unit DS1 (one end of the capacitor C1). That is, when the threshold voltage of the memory cell is lower than Vcgvxx, "L", that is, "0"-data is stored in the data storage unit DS1. When the threshold voltage of the memory cell is higher than Vcgvxx, "H", that is, "1"-data is stored in the data storage unit DS1.

Thereafter, the EXCLK routine shown in FIG. 41 is executed (SCLK5-E). Since the EXCLK routine of FIG. 41 has already been described, the description thereof is omitted here.

If the operation in a timing QPWCLK 1-E is not the QPW operation (the value of the QPW register="0"), the operation is omitted.

With the QPW operation (the value of the QPW register= "1"), a QPWCLK routine is executed by the state machine (QPWCLK1-E).

In a QPW time, the potential (verify read potential) Vcgvxx of the selected word line WL2-$i$ is raised by about 0.15 V in a timing SCLK 6. That is, Vcgvxx is 4.5 V+0.15 V.

When the control signal BLPRE indicates about 4.5 V, and the control signal VPRE indicates Vdd (e.g., 3V) in a timing QPWCLK2, one end of the capacitor C1 of the data storage unit DS1, that is, the node N2 is charged at Vdd. Thereafter, when the control signal BLCLAMP indicates Vsense (e.g., 1.8 V) in a timing QPWCLK4, the potential of one end of the capacitor C1 of the data storage unit DS1 changes as follows.

That is, when the potential of the bit line BLek remains at the precharge potential (about 1 V) (when the threshold voltage of the memory cell is higher than Vcgvxx), the N-channel MOS transistor (clamp transistor) Qn5 (FIG. 10) is turned off, and the potential of one end of the capacitor C1 of the data storage unit DS1 is maintained at Vdd ("H").

On the other hand, when the potential of the bit line BLek is 0.8 V or less (when the threshold voltage of the memory cell is lower than Vcgvxx), the N-channel MOS transistor (clamp transistor) Qn5 (FIG. 10) is turned on, the charge of one end of the capacitor C1 of the data storage unit DS1 is discharged to the bit line BLek, and the potential drops to the value ("L") lower than Vdd (QPWCLK 4-5).

As a result, the read data by the verify read potential Vcgvxx is stored in the data storage unit DS1 (one end of the capacitor C1). That is, when the threshold voltage of the memory cell is lower than Vcgvxx, "L", that is, "0"-data is stored in the data storage unit DS1. When the threshold voltage of the memory cell is higher than Vcgvxx, "H", that is, "1"-data is stored in the data storage unit DS1.

Thereafter, the EXCLK routine shown in FIG. 41 is executed (QPWCLK5-E). Since the EXCLK routine of FIG. 41 has already been described, the description thereof is omitted here.

It is to be noted that the verify operation is simultaneously performed with respect to 4256 memory cells connected to the selected word line WL2-$i$.

4. Others

In the present example, the multi-level NAND cell type flash memory has been described as the example, but the present invention can naturally be applied to another type of the multi-level memory. Examples of a memory cell array may include: NOR type; AND type (A. Nozoe: ISSCC, Digest of Technical Papers, 1995); DINOR type (S. Kobayashi: ISSCC, Digest of Technical Papers, 1995); Virtual Ground Array type (Lee, et al.: Symposium on VLSI Circuits, Digest of Technical Papers, 1994); 3-tr NAND type; and 4-tr NAND type.

Moreover, the present invention is not limited to the flash memory, and can also be applied, for example, to nonvolatile semiconductor memories such as a mask ROM and EPROM.

As described above, according to the example of the present invention, it is possible to provide the data circuit of the multi-level flash memory to which a double write method can be applied. In the method, even when the data to be stored in the memory cell is multi-leveled, a chip area does not extremely increase, and the threshold voltage of the memory cell can be controlled with high precision.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A nonvolatile semiconductor device comprising:

at least one memory cell;

a bit line connected to the memory cell; and a bit line control circuit including a capacitor, a MOS transistor, a flip-flop circuit, a first transfer gate connected between the capacitor and the bit line, a second transfer gate between the capacitor and the flip-flop circuit, and a third transfer gate connected between the flip-flop circuit and a gate electrode of the MOS transistor, wherein a source electrode of the MOS transistor is coupled to the capacitor, a drain electrode of the MOS transistor is coupled to a voltage source, and the MOS transistor selectively changes a value of a first data stored in the capacitor according to a voltage level of the gate electrode selectively boosted by a change of the voltage source.

2. The device according to claim 1, further comprising:

a fourth transfer gate connected between the source electrode of the MOS transistor and the capacitor, and the bit line during a program of the memory cell having one of three potential levels controlled by the flip-flop circuit and the voltage level of the gate electrode of the MOS transistor.

3. The device according to claim 2, wherein the fourth transfer gate is an N-type MOS transistor.

4. The device according to claim 1, wherein each of the first, second and third transfer gates and the MOS transistor is an N-type MOS transistor.

5. The device according to claim 1, wherein data stored in the flip-flop circuit is transferred to the gate electrode of the MOS transistor before the flip-flop circuit senses and stores data on the capacitor.

6. The device according to claim 1, wherein the memory cell comprises a charge accumulation layer.

7. The device according to claim 6, wherein the charge accumulation layer is controlled by a control gate of the memory cell.

8. The device according to claim 1, further comprising:

plural memory cells; and a NAND cell unit connected in series with the plural memory cells.

9. The device according to claim 1, wherein the flip-flop circuit latches a second data different from the first data during the MOS transistor selectively changes the value of the first data.

* * * * *